United States Patent
Nakagawa et al.

(10) Patent No.: US 10,907,044 B2
(45) Date of Patent: Feb. 2, 2021

(54) CURABLE RESIN COMPOSITION, CURED PRODUCT THEREOF, AND SEMICONDUCTOR DEVICE

(71) Applicant: DAICEL CORPORATION, Osaka (JP)

(72) Inventors: Yasunobu Nakagawa, Himeji (JP); Shinya Yabuno, Ohtake (JP)

(73) Assignee: DAICEL CORPORATION, Osaka (JP)

(*) Notice: Subject to any disclaimer, the term of this patent is extended or adjusted under 35 U.S.C. 154(b) by 33 days.

(21) Appl. No.: 16/331,078

(22) PCT Filed: Aug. 24, 2017

(86) PCT No.: PCT/JP2017/030369
§ 371 (c)(1),
(2) Date: Mar. 6, 2019

(87) PCT Pub. No.: WO2018/047633
PCT Pub. Date: Mar. 15, 2018

(65) Prior Publication Data
US 2019/0218346 A1    Jul. 18, 2019

(30) Foreign Application Priority Data
Sep. 7, 2016 (JP) .................. 2016-174751

(51) Int. Cl.
| | | |
|---|---|---|
| C08L 83/04 | (2006.01) | |
| H01L 23/29 | (2006.01) | |
| H01L 33/56 | (2010.01) | |
| C08G 77/04 | (2006.01) | |
| C08K 5/5419 | (2006.01) | |
| C08G 77/00 | (2006.01) | |
| C08G 77/50 | (2006.01) | |
| H01L 33/54 | (2010.01) | |
| C08G 77/20 | (2006.01) | |
| C08G 77/08 | (2006.01) | |
| C08G 77/12 | (2006.01) | |

(52) U.S. Cl.
CPC ............ *C08L 83/04* (2013.01); *C08G 77/045* (2013.01); *C08K 5/5419* (2013.01); *H01L 23/296* (2013.01); *H01L 33/56* (2013.01); *C08G 77/08* (2013.01); *C08G 77/12* (2013.01); *C08G 77/20* (2013.01); *C08G 77/50* (2013.01); *C08G 77/80* (2013.01); *C08L 2203/206* (2013.01); *H01L 33/54* (2013.01)

(58) Field of Classification Search
CPC ...... C08G 77/70; C08G 77/80; C08G 77/045; H01L 23/296; H01L 33/56
See application file for complete search history.

(56) References Cited

U.S. PATENT DOCUMENTS

| | | | |
|---|---|---|---|
| 7,282,270 B2 | 10/2007 | Morita et al. | |
| 8,937,136 B2* | 1/2015 | Choi | ............ H01L 33/56 525/477 |
| 9,646,904 B2 | 5/2017 | Nakagawa et al. | |
| 2006/0073347 A1 | 4/2006 | Morita et al. | |
| 2009/0118440 A1* | 5/2009 | Nakanishi | ............ C08L 83/00 525/478 |
| 2015/0340299 A1 | 11/2015 | Nakagawa et al. | |

FOREIGN PATENT DOCUMENTS

| | | |
|---|---|---|
| JP | 4409160 B2 | 2/2010 |
| WO | WO 4409160 A1 | 7/2014 |

OTHER PUBLICATIONS

International Search Report dated Oct. 10, 2017, in PCT/JP/2017/030369, with English translation.
Written Opinion of the International Searching Authority dated Oct. 10, 2017, in PCT/JP2017/030369, with English translation.

\* cited by examiner

*Primary Examiner* — Marc S Zimmer
(74) *Attorney, Agent, or Firm* — Birch, Stewart, Kolasch & Birch, LLP

(57) ABSTRACT

An objective of the present invention is to provide a curable resin composition for forming a cured product having excellent heat resistance, light resistance, flexibility, and toughness. The present invention provides a curable resin composition containing the following components in specific blended amounts.

(A): A polyorganosiloxane represented by average unit formula: $(SiO_{4/2})_{a1}(R^1SiO_{3/2})_{a2}(R^1{}_2SiO_{2/2})_{a3}(R^1{}_3SiO_{1/2})_{a4}$
$R^1$ is alkyl, aryl, alkenyl, or the like; a proportion of the alkyl is from 30 to 98 mol %, a proportion of the aryl is from 1 to 50 mol %, and a proportion of the alkenyl is from 1 to 20 mol % relative to a total amount of $R^1$; and $a1>0$, $a2>0$, $a3\geq 0$, $a4>0$, $0.01 \leq a1/a2 \leq 10$, and $a1+a2+a3+a4=1$.

(B): A polyorganosiloxane having not more than 10 silicon atoms and having a proportion of an alkenyl group relative to a total amount (100 mol %) of the organic groups bonded to the silicon atom from 20 to 60 mol %.

(C): An organopolysiloxane represented by average unit formula below: $(R^xSiO_{3/2})_{x1}(R^x{}_2SiO_{2/2})_{x2}(R^x{}_2SiR^4R^x{}_2SiO_{2/2})_{x3}(R^x{}_3SiO_{1/2})_{x4}$
where $R^x$ is alkyl, aryl, alkenyl, or the like; a proportion of the aryl relative to a total amount of $R^x$ is from 1 to 50 mol %, and at least two of all the $R^x$ moieties are alkenyl; $R^4$ is a divalent hydrocarbon group; and $0.05 > x1 \geq 0$, $x2+x3>0$, $x4>0$, and $x1+x2+x3+x4=1$.

(D) A polyorganosiloxane represented by average composition formula below:

$R^2{}_mH_nSiO_{[(4-m-n)/2]}$ where $R^2$ is alkyl or aryl, and at least two silicon atoms are bonded to hydrogen atoms; and $0.7 \leq m \leq 2.1$, $0.001 \leq n \leq 1$, and $0.8 \leq m+n \leq 3$.

(E): A hydrosilylation catalyst.

22 Claims, 1 Drawing Sheet

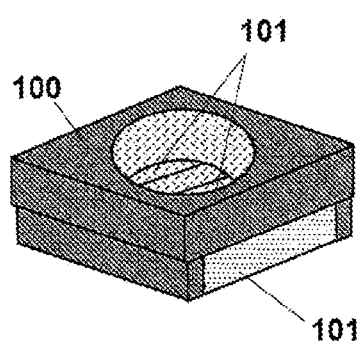
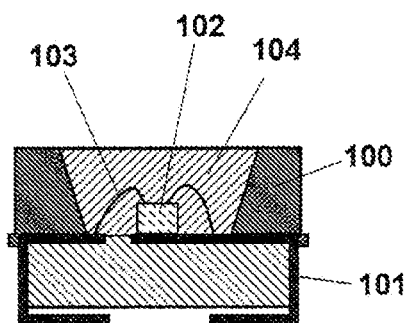
FIG. 1A　　　FIG. 1B
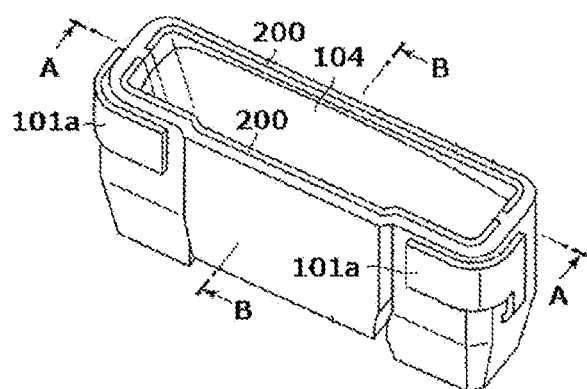
FIG. 2A
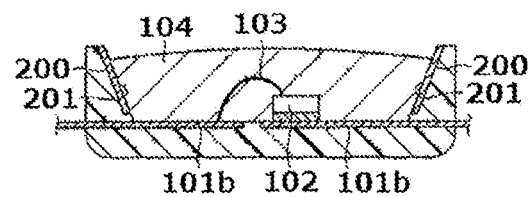
FIG. 2B
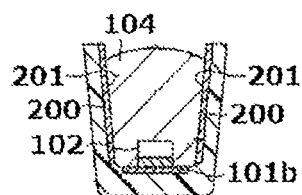
FIG. 2C

CURABLE RESIN COMPOSITION, CURED PRODUCT THEREOF, AND SEMICONDUCTOR DEVICE

TECHNICAL FIELD

The present invention relates to a curable resin composition, a cured product thereof, an encapsulating agent that includes the curable resin composition, and a semiconductor device (especially, optical semiconductor device) that is obtained by encapsulating a semiconductor element with the encapsulating agent (especially, optical semiconductor element). The present invention also relates to a semiconductor device (especially, optical semiconductor device) having a lens obtained by curing the curable resin composition. The present application claims priority to JP 2016-174751 filed to Japan on Sep. 7, 2016, and the entire contents thereof are incorporated herein by reference.

BACKGROUND ART

In recent years, higher output and higher luminance have been achieved in an optical semiconductor device. Then, an optical lens and/or encapsulant that cover an optical semiconductor element used in such an optical semiconductor device require even higher transparency, heat resistance, and light resistance. Meanwhile, reduction of luminous intensity over time due to corrosion of an electrode is another problem. Thus, high gas barrier property against corrosive gases, represented by sulfur compounds such as SOx and H2S, is also in demand at the same time.

As an encapsulant for the optical semiconductor device, especially for use in illumination with high luminance and high electric current, methyl silicone (a methyl silicone-based encapsulant) having good heat resistance and light resistance is used primarily (e.g., see Patent Document 1).

A phenyl silicone-based encapsulant having relatively good gas barrier property against corrosive gases is also widely used (e.g., see Patent Document 2).

CITATION LIST

Patent Literature

Patent Document 1: WO 2014/109349
Patent Document 2: JP 4409160 B

SUMMARY OF INVENTION

Technical Problem

Although the methyl silicone-based encapsulant described in Patent Document 1 has high transparency, heat resistance, and light resistance and exhibits higher barrier property against corrosive gases compared to known methyl silicone-based encapsulants in the related art, the characteristics thereof are not yet satisfactory, and corrosion of an electrode cannot be sufficiently prevented.

On the other hand, although the phenyl silicone-based encapsulant described in Patent Document 2 can exhibit high gas barrier property and can prevent corrosion of an electrode to a certain degree, the heat resistance and light resistance thereof are far inferior to those of methyl silicone-based encapsulants. In particular, the phenyl silicone-based encapsulant cannot withstand the use under high output and high luminance illumination.

In light of such circumstances, a methyl silicone-based encapsulant having good heat resistance and light resistance is used, particularly for the use under high output and high luminance illumination, with addition of a step of coating an electrode with a coating liquid before encapsulating to prevent corrosion, or the use of non-corrosive gold as an electrode itself. However, these processes had problems, such as complexity in the production processes, and higher cost. On the other hand, the use of the phenyl silicone-based encapsulant, which is inferior in heat resistance and light resistance, was limited to the use for low illuminance with low current and output.

Therefore, an encapsulant for optical semiconductors that can achieve both high heat resistance and light resistance, and high gas barrier property in a balanced manner is in demand.

Meanwhile, a mobile terminal product such as a mobile phone has become thinner and smaller. Accordingly, there are increasing needs for a thinner and smaller optical semiconductor device, which is installed on such a mobile terminal product. As a package of an optical semiconductor device becomes thinner and smaller, the package may be damaged easily upon application of external stress. Therefore, enhancement in strength of the encapsulant itself is in demand to prevent such a damage. Under such circumstances, for example, a cured product of the methyl silicone resin composition, which is used for an optical semiconductor device with high luminance and high electric current described in Patent Document 1, exhibits high resistance against thermal yellowing and light yellowing; however, when hardness is increased to enhance strength in the case where the cured product is used for a thin and small optical semiconductor device (e.g., a top-view type or side-view type optical semiconductor device that was formed thinner and smaller), the cured product presents a problem of being brittle due to low tensile elongation. Furthermore, the viscosity of a resin composition tends to increase as the hardness of a cured product increases, which may present a problem of handling difficulty.

Therefore, an object of the present invention is to provide a curable resin composition that can form, when being cured, a material (cured product) achieving all of good heat resistance, light resistance, and flexibility and, especially, having a high toughness while relatively high mechanical characteristics, such as tensile elongation and tensile stress, are maintained even when the hardness is increased, and that can control the viscosity to a lower value.

Furthermore, another object of the present invention is to provide an encapsulating agent that uses the curable resin composition, and a semiconductor device (especially, optical semiconductor device that is formed thinner and smaller) having good quality and durability, the semiconductor device obtained by encapsulating a semiconductor element (especially, optical semiconductor element) by using the encapsulating agent.

Furthermore, another object of the present invention is to provide a lens-forming resin composition, the resin composition using the curable resin composition described above, and a semiconductor device (especially, optical semiconductor device that is formed thinner and smaller) having a lens obtained by curing the lens-forming resin composition and having good quality and durability.

Solution to Problem

As a result of diligent research to solve the problems described above, the inventors of the present invention found that a viscosity can be controlled to a lower value by adjusting a ratio (Q units/T units) of structural units, by blending a particular amount of a low molecular weight siloxane compound to a curable resin composition containing, as an essential component, a polyorganosiloxane having an alkyl group, such as a methyl group, and an aryl group, such as a phenyl group, in a molecule, and by adjusting a proportion of SiH groups (hydrosilyl group) relative to an alkenyl group bonded to a silicon atom to a particular range; upon curing, a cured product that has all of good heat resistance, light resistance, and flexibility and, especially, that has a high toughness while mechanical characteristics, such as tensile elongation and tensile stress, are maintained relatively high even when the hardness is increased, can be formed; and, especially, suitability as a raw material for a lens and/or an encapsulant for an optical semiconductor device that is formed thinner and smaller is achieved, and thus completed the present invention.

That is, the present invention provides a curable resin composition containing: a component (A), a component (B), a component (C), a component (D), and a component (E) below;

a content of the component (B) per 100 parts by weight of the component (A) being from 5 to 50 parts by weight;

a content of the component (C) per 100 parts by weight of the component (A) being from 0 to 10 parts by weight;

the amount of an SiH group (hydrosilyl group) present in the component (D) from 0.5 to 5 mol per 1 mol of an alkenyl group present in the component (A), the component (B), and the component (C); and a total content of the component (B), the component (C), and the component (D) per 100 parts by weight of the component (A) being not greater than 80 parts by weight.

(A): A polyorganosiloxane represented by Average Unit Formula (I) below:

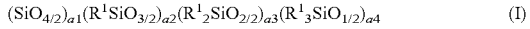

$(SiO_{4/2})_{a1}(R^1SiO_{3/2})_{a2}(R^1{}_2SiO_{2/2})_{a3}(R^1{}_3SiO_{1/2})_{a4}$ (I)

where, $R^1$ is, the same or different, an alkyl group having from 1 to 10 carbons, an aryl group having from 6 to 14 carbons, an alkenyl group having from 2 to 8 carbons, an alkoxy group having from 1 to 10 carbons, or a hydroxy group; in the case where a proportion of the alkyl group is X mol %, a proportion of the aryl group is Y mol %, and a proportion of the alkenyl group is Z mol % relative to a total amount (100 mol %) of $R^1$, X is from 30 to 98 mol %, Y is from 1 to 50 mol %, and Z is from 1 to 20 mol %; and a1, a2, a3, and a4 are each a number satisfying a1>0, a2>0, a3≥0, a4>0, 0.01≤a1/a2≤10, and a1+a2+a3+a4=1.

(B): A polyorganosiloxane having not more than 10 silicon atoms and having a proportion of an alkenyl group relative to a total amount (100 mol %) of the organic groups bonded to the silicon atom from 20 to 60 mol %.

(C): An organopolysiloxane represented by Average Unit Formula (X) below:

$(R^xSiO_{3/2})_{x1}(R^x{}_2SiO_{2/2})_{x2}(R^x{}_2SiR^4R^x{}_2SiO_{2/2})_{x3}$
$(R^x{}_3SiO_{1/2})_{x4}$ (X)

where, $R^x$ is, the same or different, an alkyl group having from 1 to 10 carbons, an aryl group having from 6 to 14 carbons, an alkenyl group having from 2 to 8 carbons, an alkoxy group having from 1 to 10 carbons, or a hydroxy group; a proportion of the aryl group relative to a total amount (100 mol %) of $R^x$ is from 1 to 50 mol %, and at least two of all the $R^x$ moieties are alkenyl groups; $R^4$ is a divalent hydrocarbon group; and x1, x2, x3, and x4 are each a number satisfying 0.05>x1≥0, x2+x3>0, x4>0, and x1+x2+x3+x4=1.

(D) A polyorganosiloxane represented by Average Composition Formula (II) below:

$R^2{}_mH_nSiO_{[(4-m-n)/2]}$ (II)

where, $R^2$ is, the same or different, an alkyl group having from 1 to 10 carbons or an aryl group having from 6 to 14 carbons, and at least two hydrogen atoms are bonded to a silicon atom; and m and n are each a number satisfying 0.7≤m≤2.1, 0.001≤n≤1, and 0.8≤m+n≤3.

(E): A hydrosilylation catalyst.

The viscosity of the curable resin composition at 23° C. is preferably not greater than 20000 mPa·s.

A cured product prepared by curing the curable resin composition by heating in at least one curing condition selected from 25 to 180° C. and from 5 to 720 minutes preferably has the type D hardness of not less than 40 measured by using a type D durometer according to JIS K 6253, and the tensile elongation of not less than 50% according to JIS K 6251.

In the curable resin composition, the component (A) may be a polyorganosiloxane having a weight-average molecular weight of 500 to 50000 based on calibration with polystyrene, having a molecular weight distribution of 1 to 4, and being a solid or liquid having a viscosity at 25° C. of not less than 10 mPa·s.

In the component (A) of the curable resin composition, the ratio of X to Y (X/Y) may be from 0.5 to 25.

The curable resin composition may further contain a component (F) described below.

(F): A silsesquioxane having at least one alkenyl group and at least one aryl group in a molecule.

In the curable resin composition, the component (D) may contain at least two structural units represented by $R^{2'}{}_2HSiO_{1/2}$ (where $R^{2'}$ is, the same or different, an alkyl group having from 1 to 10 carbons or an aryl group having from 6 to 14 carbons).

In the curable resin composition, the component (D) may contain from 1 wt. % to 99 wt. % of a component (B1), the component (B1) being represented by Formula (II-1) below:

[Chem. 1]

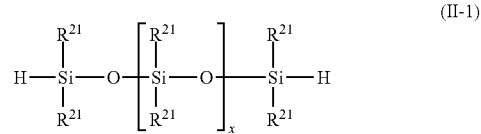

(II-1)

where, $R^{21}$ is, the same or different, an alkyl group having from 1 to 10 carbons or an aryl group having from 6 to 14 carbons, and x represents an integer from 0 to 1000; and the component (B1) being a liquid having a viscosity at 25° C. of not greater than 10000 mPa·s.

In the curable resin composition, the component (D) may contain one type of polyorganosiloxane represented by Average Composition Formula (II) or at least two different types of polyorganosiloxanes represented by Average Composition Formula (II).

In the curable resin composition, the component (D) may contain at least one type of polyorganosiloxane represented by Average Composition Formula (II), where at least one of the $R^2$ moieties is an aryl group having from 6 to 14 carbons.

The curable resin composition may further contain a silane coupling agent (G).

The present invention also provides a cured product of the curable resin composition.

In the cured product, the refractive index at 589 nm may be not less than 1.46 and not greater than 1.54.

Furthermore, the curable resin composition may be an encapsulating agent.

Furthermore, the curable resin composition may be a lens-forming resin composition.

The present invention also provides a semiconductor device including: a semiconductor element and an encapsulant that encapsulates the semiconductor element, the encapsulant being a cured product of the curable resin composition (encapsulating agent).

The present invention also provides a semiconductor device including: a semiconductor element and a lens, the lens being a cured product of the curable resin composition (lens-forming resin composition).

Furthermore, the present invention also provides a semiconductor device including: a semiconductor element, an encapsulant that encapsulates the semiconductor element, and a lens; the encapsulant being a cured product of the curable resin composition (encapsulating agent); and the lens being a cured product of the curable resin composition (lens-forming resin composition).

In the semiconductor device, the refractive index of the cured product at 589 nm may be not less than 1.46 and not greater than 1.54.

The semiconductor device may be an optical semiconductor device.

Advantageous Effects of Invention

Because the curable resin composition according to an embodiment of the present invention has the composition described above, the viscosity can be controlled to a low value and, upon curing, the curable resin composition can form a cured product achieving all of good heat resistance, light resistance, and flexibility and, especially, having a high toughness while relatively high mechanical characteristics, such as tensile elongation and tensile stress, are maintained even when the hardness is made high. Therefore, in the case where the cured product is used as an encapsulant or a lens for a semiconductor element in an optical semiconductor device for illumination with high luminance and high electric current, a high transparency can be maintained even when the cured product is exposed to light with high luminance at a high temperature for a long period of time, and thus a high luminous intensity can be maintained for a long period of time. Furthermore, in a case where the cured product is employed in an optical semiconductor device that is formed thinner and smaller and that is used in a mobile terminal product such as a mobile phone (e.g., a top-view type or side-view type optical semiconductor device that was formed thinner and smaller), the cured product has good toughness against stress, and thus durability against damage, such as occurrence of crack, is significantly enhanced. Therefore, the curable resin composition of an embodiment of the present invention can be suitably used as a raw material for forming an encapsulant and/or an optical lens (encapsulating agent and lens-forming resin composition) of an optical semiconductor element (LED element) in a thin and small optical semiconductor device with high output and high luminance (e.g., a top-view type or side-view type optical semiconductor device that was formed thinner and smaller). An optical semiconductor device (e.g., a top-view type or side-view type optical semiconductor device that was formed thinner and smaller) obtained by using the curable resin composition of an embodiment of the present invention as an encapsulating agent and/or a lens-forming resin composition has good quality and durability.

BRIEF DESCRIPTION OF DRAWINGS

FIGS. 1A and 1B are schematic diagrams illustrating an embodiment of a top-view type optical semiconductor device, in which an optical semiconductor element is encapsulated by a cured product of the curable resin composition of an embodiment of the present invention. FIG. 1A on the left side is a perspective diagram, and FIG. 1B on the right side is a cross-sectional diagram.

FIGS. 2A to 2C are schematic diagrams illustrating an embodiment of a side-view type optical semiconductor device, in which an optical semiconductor element is encapsulated by a cured product of the curable resin composition of an embodiment of the present invention. FIG. 2A is a perspective diagram, FIG. 2B is a cross-sectional diagram along the line A-A, and FIG. 2C is a cross-sectional diagram along the line B-B.

DESCRIPTION OF EMBODIMENTS

Curable Resin Composition

The curable resin composition of an embodiment of the present invention contains: a component (A), a component (B), a component (D), and a component (E) below as essential components and a component (C) as an optional component below; and a content of the component (B) per 100 parts by weight of the component (A) is from 5 to 50 parts by weight;

a content of the component (C) per 100 parts by weight of the component (A) is from 0 to 10 parts by weight;

the amount of an SiH group (hydrosilyl group) present in the component (D) is from 0.5 to 5 mol per 1 mol of an alkenyl group present in the component (A), the component (B), and the component (C); and a total content of the component (B), the component (C), and the component (D) per 100 parts by weight of the component (A) is not less than 80 parts by weight.

(A): A polyorganosiloxane represented by Average Unit Formula (I) below:

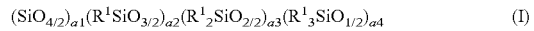

$$(SiO_{4/2})_{a1}(R^1SiO_{3/2})_{a2}(R^1{}_2SiO_{2/2})_{a3}(R^1{}_3SiO_{1/2})_{a4} \quad (I)$$

where, $R^1$ is, the same or different, an alkyl group having from 1 to 10 carbons, an aryl group having from 6 to 14 carbons, an alkenyl group having from 2 to 8 carbons, an alkoxy group having from 1 to 10 carbons, or a hydroxy group; in a case where a proportion of the alkyl group is X mol %, a proportion of the aryl group is Y mol %, and a proportion of the alkenyl group is Z mol % relative to a total amount (100 mol %) of $R^1$, X is from 30 to 98 mol %, Y is from 1 to 50 mol %, and Z is from 1 to 20 mol %; and a1, a2, a3, and a4 are each a number satisfying a1>0, a2>0, a3≥0, a4>0, 0.01≤a1/a2≤10, and a1+a2+a3+a4=1.

(B): A polyorganosiloxane having not more than 10 silicon atoms and having a proportion of an alkenyl group relative to a total amount (100 mol %) of the organic groups bonded to the silicon atom from 20 to 60 mol %.

(C): An organopolysiloxane represented by Average Unit Formula (X) below:

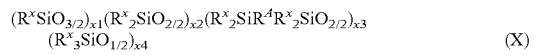

$$(R^xSiO_{3/2})_{x1}(R^x{}_2SiO_{2/2})_{x2}(R^x{}_2SiR^4R^x{}_2SiO_{2/2})_{x3}(R^x{}_3SiO_{1/2})_{x4} \quad (X)$$

where, $R^x$ is, the same or different, an alkyl group having from 1 to 10 carbons, an aryl group having from 6 to 14 carbons, an alkenyl group having from 2 to 8 carbons, an alkoxy group having from 1 to 10 carbons, or a hydroxy group; a proportion of the aryl group relative to a total amount (100 mol %) of $R^x$ is from 1 to 50 mol %, and at least two of all the $R^x$ moieties are alkenyl groups; $R^A$ is a divalent hydrocarbon group; and x1, x2, x3, and x4 are each a number satisfying 0.05>x1≥0, x2+x3>0, x4>0, and x1+x2+x3+x4=1.

(D) A polyorganosiloxane represented by Average Composition Formula (II) below:

where, $R^2$ is, the same or different, an alkyl group having from 1 to 10 carbons or an aryl group having from 6 to 14 carbons, and at least two hydrogen atoms are bonded to a silicon atom; and m and n are each a number satisfying 0.7≤m≤2.1, 0.001≤n≤1, and 0.8≤m+n≤3.

(E): A hydrosilylation catalyst.

In addition to the essential components described above, the curable resin composition of an embodiment of the present invention may further contain, for example, a component (F), a silane coupling agent (G), a component (H), and other components described below.

Component (A)

As described above, the component (A), which is the essential component of the curable resin composition of an embodiment of the present invention, is a polyorganosiloxane represented by Average Unit Formula (I) below:

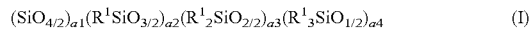

where, $R^1$ is, the same or different, an alkyl group having from 1 to 10 carbons, an aryl group having from 6 to 14 carbons, an alkenyl group having from 2 to 8 carbons, an alkoxy group having from 1 to 10 carbons, or a hydroxy group; in a case where a proportion of the alkyl group is X mol %, a proportion of the aryl group is Y mol %, and a proportion of the alkenyl group is Z mol % relative to a total amount (100 mol %) of $R^1$, X is from 30 to 98 mol %, Y is from 1 to 50 mol %, and Z is from 1 to 20 mol %. a1, a2, a3, and a4 are each a number satisfying a1>0, a2>0, a3≥0, a4>0, 0.01≤a1/a2≤10, and a1+a2+a3+a4=1.

That is, the component (A) is a polysiloxane having an alkenyl group and is a component that undergoes a hydrosilylation reaction with a component having a hydrosilyl group (e.g., component (D) described below and the like).

In Average Unit Formula (I) above, examples of the alkyl group having from 1 to 10 carbons represented by $R^1$ include linear or branched alkyl groups, such as a methyl group, an ethyl group, a propyl group, an isopropyl group, a butyl group, a hexyl group, an octyl group, an isooctyl group, and a decyl group. Among these, a methyl group is preferable. Furthermore, the component (A) may be a component having only one type of the alkyl group or may be a component having two or more types of the alkyl groups.

In Average Unit Formula (I) above, examples of the aryl group having from 6 to 14 carbons represented by $R^1$ include a phenyl group, and a naphthyl group. Among these, a phenyl group is preferable. Furthermore, the component (A) may be a component having only one type of the aryl group or may be a component having two or more types of the aryl groups.

In Average Unit Formula (I) above, examples of the alkenyl group having from 2 to 8 carbons represented by $R^1$ include substituted or unsubstituted, linear or branched alkenyl groups, such as a vinyl group, an allyl group, a butenyl group, a pentenyl group, and a hexenyl group. Examples of the substituent include a halogen atom, a hydroxy group, and a carboxy group. Among these, a vinyl group is preferable. Furthermore, the component (A) may be a component having only one type of the alkenyl group or may be a component having two or more types of the alkenyl groups.

In Average Unit Formula (I) above, examples of the alkoxy group having from 1 to 10 carbons represented by $R^1$ include linear or branched alkoxy groups, such as a methoxy group, an ethoxy group, a propoxy group, an isopropoxy group, a butoxy group, a hexyloxy group, an octyloxy group, an isooctyloxy group, a decyloxy group, and the like. Among these, a methoxy group and an ethoxy group are preferable. Furthermore, the component (A) may be a component having only one type of the alkoxy group or may be a component having two or more types of the alkoxy groups.

In the component (A), in a case where the proportion of the alkyl group relative to the total amount (100 mol %) of $R^1$ is X mol %, X is from 30 to 98 mol %, preferably from 55 to 95 mol %, and more preferably from 60 to 90 mol %. In a case where X is not less than 30 mol %, upon curing the curable resin composition of an embodiment of the present invention, the cured product having good heat resistance and light resistance may be obtained readily. On the other hand, in a case where X is not greater than 98 mol %, the cured product may exhibit improved gas barrier property, and tends to exhibit a reduced tackiness.

In the component (A), when the proportion of the aryl group relative to the total amount (100 mol %) of $R^1$ is Y mol %, Y is from 1 to 50 mol %, preferably from 3 to 40 mol %, and more preferably from 5 to 30 mol %. In a case where Y is not less than 1 mol %, upon curing the curable resin composition of an embodiment of the present invention, the cured product having good gas barrier property may be obtained readily. On the other hand, in a case where Y is not greater than 50 mol %, the cured product may exhibit improved heat resistance and light resistance.

In the component (A), when the proportion of the alkenyl group relative to the total amount (100 mol %) of $R^1$ is Z mol %, Z is from 1 to 20 mol %, preferably from 2 to 15 mol %, and more preferably from 3 to 10 mol %. In a case where Z is within the range described above, the cured product of the curable resin composition tends to exhibit the improved toughness. That is, when Z is greater than 20 mol %, tensile elongation of the cured product of the curable resin composition decreases, and the cured product tends to be brittle.

In the component (A), the ratio (X/Y) of the proportion of the alkyl group (X) to the proportion of the aryl group (Y) is not particularly limited but is preferably from 0.5 to 25, more preferably from 1 to 20, and even more preferably from 2 to 15. In a case where X/Y is within the range described above, upon curing the curable resin composition of an embodiment of the present invention, the cured product having high gas barrier property, good heat resistance and good light resistance, and low tackiness may be obtained readily. That is, when X/Y is not less than 0.5, upon curing the curable resin composition of an embodiment of the present invention, the cured product that maintains heat resistance and light resistance may be obtained readily. On the other hand, in a case where X/Y is not greater than 25, the cured product that maintains high gas barrier property and that suppresses tackiness may be obtained readily.

Note that the proportion of the alkyl group (mol %), the proportion of the aryl group (mol %), and the proportion of the alkenyl group (mol %) relative to the total amount (100 mol %) of $R^1$ described above are each determined by, for example, $^1$H-NMR spectrum analysis or the like.

In Average Unit Formula (I) above, a1, a2, a3, and a4 are each a number satisfying a1>0, a2>0, a3≥0, a4>0, 0.01≤a1/a2≤10, and a1+a2+a3+a4=1.

a1 is a positive number (a1>0), corresponds to the proportion of abundance (in terms of mole) of the Q units in the component (A), and is preferably from 0.01 to 0.8, more preferably from 0.02 to 0.7, and even more preferably from 0.03 to 0.6.

a2 is a positive number (a2>0), corresponds to the proportion of abundance (in terms of mole) of the T units in the component (A), and is preferably from 0.01 to 0.9, more preferably from 0.03 to 0.85, and even more preferably from 0.05 to 0.8.

a3 is 0 or a positive number (a3≥0), corresponds to the proportion of abundance (in terms of mole) of the D units in the component (A), and is preferably from 0 to 0.9, more preferably from 0 to 0.6, and even more preferably from 0 to 0.3.

a4 is a positive number (a4>0), corresponds to the proportion of abundance (in terms of mole) of the M units in the component (A), and is preferably from 0.01 to 0.9, more preferably from 0.03 to 0.8, and even more preferably from 0.05 to 0.7.

In a case where a1 to a4 are within the ranges described above, upon curing the curable resin composition of an embodiment of the present invention, the cured product having good heat resistance and good light resistance and low tackiness may be obtained readily.

In Average Unit Formula (I) above, a1/a2 corresponds to the ratio of the Q units to the T units in the component (A) (Q/T, in terms of mole) and is from 0.01 to 10, preferably from 0.02 to 8, and more preferably from 0.03 to 6. In a case where a1/a2 is not less than 0.01, upon curing the curable resin composition of an embodiment of the present invention, the cured product having good heat resistance and light resistance may be obtained readily. On the other hand, in a case where a1/a2 is not greater than 10, the cured product having good flexibility may be obtained readily.

In the component (A) of an embodiment of the present invention, X, Y, Z, X/Y, a1 to a4, a1/a2, and the like can be suitably adjusted by the type and the composition of the group to be substituted for a silicon atom of the raw material (hydrolyzable silane compound described below) for forming these structural units in the method of producing the component (A) described below.

Examples of the component (A) include components having partially branched linear, branched, or mesh-like molecular structures. Note that one type of the component (A) can be used alone, or two or more types of the components (A) can be used in combination. Specifically, two or more types of components (A) having different molecular structures can be used together and, for example, a partially branched linear component (A) and a branched component (A) can be used together.

The weight-average molecular weight (Mw) of the component (A) is not particularly limited but is preferably not less than 500 and not greater than 50000, more preferably not less than 600 and not greater than 40000, even more preferably not less than 700 and not greater than 20000, and particularly preferably not less than 1000 and not greater than 10000. In a case where the weight-average molecular weight is not less than 500, toughness of the cured product is further improved, and tackiness tends to be reduced. On the other hand, in a case where the weight-average molecular weight is not greater than 50000, compatibility with another component tends to be improved. Note that the weight-average molecular weight is calculated by the molecular weight determined by gel permeation chromatography (GPC), measured based on calibration with polystyrene standard.

The molecular weight distribution (Mw/Mn) of the component (A) is not particularly limited but is preferably not less than 1 and not greater than 4, more preferably from 1 to 3.5, even more preferably from 1 to 3, and particularly preferably from 1 to 2.5. In a case where the molecular weight distribution is not greater than 4, compatibility of the cured product tends to be further enhanced. Note that the molecular weight distribution can be calculated by the weight-average molecular weight (Mw) and the number-average molecular weight (Mn) calculated by the molecular weight determined by gel permeation chromatography (GPC), measured based on calibration with polystyrene standard.

The component (A) may be a liquid or solid at 25° C. and is preferably a liquid. More specifically, the viscosity of the component (A) at 25° C. is not particularly limited but is preferably not less than 10 mPa·s, more preferably not less than 100 mPa·s, and even more preferably not less than 500 mPa·s. In a case where the viscosity is not less than 10 mPa·s, preparation and handling of the curable resin composition tends to be easier. On the other hand, the upper limit of the viscosity is not particularly limited but is preferably 1000000 mPa·s, and more preferably 100000 mPa·s. In a case where the viscosity is not greater than 1000000 mPa·s, preparation and handling of the curable resin composition tends to be easier. Note that the viscosity at 25° C. is measured by using a rheometer (product name: "Physica MCR-302", available from Anton Paar) and a parallel plate (cone diameter: 25 mm; taper angle: 0°) under the condition where the temperature is 25° C. and a rate of rotation is 20 rpm.

In the component (A) of an embodiment of the present invention, the weight-average molecular weight (Mw), the molecular weight distribution (Mw/Mn), and the viscosity at 25° C. (mPa·s) can be suitably adjusted by the type and the composition of the group to be bonded to a silicon atom of the raw material (hydrolyzable silane compound described below) for forming these structural units, and/or production conditions (reaction temperature, reaction time, and the like) in the method of producing the component (A) described below.

The component (A) can be produced by a publicly known or common method of producing a polysiloxane and is not particularly limited, and for example, can be produced by a method that hydrolyzes and condenses one type or two or more types of hydrolyzable silane compounds. Note that as the hydrolyzable silane compound, a hydrolyzable tetrafunctional silane compound (compound represented by Formula (a) below), a hydrolyzable trifunctional silane compound (compound represented by Formula (b) below), and a hydrolyzable monofunctional silane compound (compound represented by Formula (d) below) for forming the structural unit represented by Average Unit Formula (I) above need to be used as essential hydrolyzable silane compounds, and as necessary, a hydrolyzable difunctional silane compound (compound represented by Formula (c) below) may be used.

More specifically, for example, a component (A) can be produced by a method that hydrolyzes and condenses a compound represented by Formula (a) below, which is a hydrolyzable silane compound for forming the Q units, a compound represented by Formula (b) below, which is a hydrolyzable silane compound for forming the T units, and a compound represented by Formula (d) below, which is a hydrolyzable silane compound for forming the M units, and as necessary, a compound represented by Formula (c) below, which is a hydrolyzable silane compound for forming the D units.

[Chem. 2]

$$Si(X^1)_4 \quad (a)$$

$$R^{12}Si(X^2)_3 \quad (b)$$

$$R^{13}{}_2Si(X^3)_2 \quad (c)$$

$$R^{14}{}_3Si(X^4) \quad (d)$$

The compound represented by Formula (a) above is a compound forming the Q units in the component (A) of an embodiment of the present invention. $X^1$ in Formula (a) above represents an alkoxy group or a halogen atom. Examples of the alkoxy group of $X^1$ include alkoxy groups having from 1 to 10 carbons, such as a methoxy group, an ethoxy group, a propoxy group, an isopropoxy group, a butoxy group, and an isobutoxy group. Furthermore, examples of the halogen atom of $X^1$ include a fluorine atom, a chlorine atom, a bromine atom, an iodine atom, and the like. Among these, as $X^1$, an alkoxy group is preferable, and a methoxy group and an ethoxy group are more preferable. Note that the four $X^1$ moieties may be the same or different.

The compound represented by Formula (b) above is a compound forming the T units in the component (A) of an embodiment of the present invention. In Formula (b), $R^{12}$ is an alkyl group having from 1 to 10 carbons, an aryl group having from 6 to 14 carbons, or an alkenyl group having from 2 to 8 carbons. Examples and preferable aspects of the alkyl group having from 1 to 10 carbons, the aryl group having from 6 to 14 carbons, and the alkenyl group having from 2 to 8 carbons represented by $R^{12}$ are respectively the same as those of $R^1$ in Average Unit Formula (I) above.

$X^2$ in Formula (b) above represents an alkoxy group or a halogen atom. Examples of the alkoxy group of $X^2$ include alkoxy groups having from 1 to 10 carbons, such as a methoxy group, an ethoxy group, a propoxy group, an isopropoxy group, a butoxy group, and an isobutoxy group. Furthermore, examples of the halogen atom of $X^2$ include a fluorine atom, a chlorine atom, a bromine atom, and an iodine atom. Among these, as $X^2$, an alkoxy group is preferable, and a methoxy group and an ethoxy group are more preferable. Note that the three $X^2$ moieties may be the same or different.

The compound represented by Formula (c) above is a compound forming the D units in the component (A) of an embodiment of the present invention. In Formula (c), $R^{13}$ is an alkyl group having from 1 to 10 carbons, an aryl group having from 6 to 14 carbons, or an alkenyl group having from 2 to 8 carbons. Examples and preferable aspects of the alkyl group having from 1 to 10 carbons, the aryl group having from 6 to 14 carbons, and the alkenyl group having from 2 to 8 carbons represented by $R^{13}$ are respectively the same as those of $R^1$ in Average Unit Formula (I) above. Note that the two $R^{13}$ moieties may be the same or different.

$X^3$ in Formula (c) above represents an alkoxy group or a halogen atom. Examples of the alkoxy group of $X^3$ include alkoxy groups having from 1 to 10 carbons, such as a methoxy group, an ethoxy group, a propoxy group, an isopropoxy group, a butoxy group, and an isobutoxy group. Furthermore, examples of the halogen atom of $X^3$ include a fluorine atom, a chlorine atom, a bromine atom, and an iodine atom. Among these, as $X^3$, an alkoxy group is preferable, and a methoxy group and an ethoxy group are more preferable. Note that the two $X^3$ moieties may be the same or different.

The compound represented by Formula (d) above is a compound forming the M units in the component (A) of an embodiment of the present invention.

In Formula (d), $R^{14}$ is an alkyl group having from 1 to 10 carbons, an aryl group having from 6 to 14 carbons, or an alkenyl group having from 2 to 8 carbons. Examples and preferable aspects of the alkyl group having from 1 to 10 carbons, the aryl group having from 6 to 14 carbons, and the alkenyl group having from 2 to 8 carbons represented by $R^{14}$ are respectively the same as those of $R^1$ in Average Unit Formula (I) above. Note that the three $R^{14}$ moieties may be the same or different.

$X^4$ in Formula (d) above represents an alkoxy group, a halogen atom, or a group represented by $-\text{OSiR}^{14}{}_3$. Examples of the alkoxy group of $X^4$ include alkoxy groups having from 1 to 10 carbons, such as a methoxy group, an ethoxy group, a propoxy group, an isopropoxy group, a butoxy group, and an isobutoxy group. Furthermore, examples of the halogen atom of $X^4$ include a fluorine atom, a chlorine atom, a bromine atom, and an iodine atom. Among these, as $X^4$, an alkoxy group or a group represented by $-\text{OSiR}^{14}{}_3$ is preferable, and a methoxy group, an ethoxy group, and a group represented by $-\text{OSiR}^{14}{}_3$ are more preferable. Furthermore, in a case where $X^4$ is a group represented by $-\text{OSiR}^{14}{}_3$, the three $R^{14}$ moieties may be the same or different.

The used amount or the composition of the hydrolyzable silane compound can be suitably adjusted based on the structure of the component (A) of an embodiment of the present invention that is desired. For example, the used amount of the compound represented by Formula (a) above is not particularly limited, but is preferably from 1 to 80 mol %, more preferably from 2 to 70 mol %, and even more preferably from 3 to 60 mol %, relative to the total amount (100 mol %) of the hydrolyzable silane compounds to be used.

Furthermore, the used amount of the compound represented by Formula (b) above is not particularly limited, but is preferably from 1 to 90 mol %, more preferably from 3 to 85 mol %, and even more preferably from 5 to 80 mol %, relative to the total amount (100 mol %) of the hydrolyzable silane compounds to be used.

Furthermore, the used amount of the compound represented by Formula (d) above is not particularly limited, but is preferably from 1 to 90 mol %, more preferably from 3 to 80 mol %, and even more preferably from 5 to 70 mol %, relative to the total amount (100 mol %) of the hydrolyzable silane compounds to be used.

Furthermore, in a case where the compound represented by Formula (c) above is used, the used amount is not particularly limited, but is preferably from 0 to 90 mol %, more preferably from 0 to 60 mol %, and even more preferably from 0 to 30 mol %, relative to the total amount (100 mol %) of the hydrolyzable silane compounds to be used.

Furthermore, in a case where two or more types is used in combination as the hydrolyzable silane compound, hydrolysis and condensation reactions of these hydrolyzable silane compounds can be performed simultaneously or sequentially. In a case where the reactions are performed sequentially, the order of the reactions are not particularly limited.

An example is an aspect in which the compounds represented by Formulas (a), (b), and (d) above are subjected to hydrolysis and condensation reactions and then the compound represented by Formula (d) is added.

The hydrolysis and condensation reactions of the hydrolyzable silane compound can be carried out in the presence of a solvent or in the absence of such a solvent. Among these, the hydrolysis and condensation reactions are preferably performed in the presence of a solvent. Examples of the solvent include aromatic hydrocarbons, such as benzene, toluene, xylene, and ethylbenzene; ethers, such as diethyl ether, dimethoxyethane, tetrahydrofuran, and dioxane; ketones, such as acetone, methyl ethyl ketone, and methyl isobutyl ketone; esters, such as methyl acetate, ethyl acetate, isopropyl acetate, and butyl acetate; amides, such as N,N-dimethylformamide and N,N-dimethylacetamide; nitriles, such as acetonitrile, propionitrile, and benzonitrile; alcohols, such as methanol, ethanol, isopropyl alcohol, and butanol. As the solvent, among these, ketones and ethers are preferable. Note that one type of the solvent can be used alone, or two or more types of the solvents can be used in combination.

The used amount of the solvent is not particularly limited and can be suitably adjusted in the range of 0 to 2000 parts by weight per 100 parts by weight of the total amount of the hydrolyzable silane compounds, depending on the desired reaction time or the like.

The hydrolysis and condensation reactions of the hydrolyzable silane compound is preferably carried out in the presence of a catalyst and water. The catalyst may be an acid catalyst or an alkali catalyst. Examples of the acid catalyst include mineral acids, such as hydrochloric acid, sulfuric acid, nitric acid, phosphoric acid, and boric acid; phosphates; carboxylic acids, such as acetic acid, formic acid, trifluoroacetic acid; sulfonic acids, such as methanesulfonic acid, trifluoromethanesulfonic acid, and p-toluenesulfonic acid; solid acids, such as activated clay; and Lewis acids, such as iron chloride. Examples of the alkali catalyst include alkali metal hydroxides, such as lithium hydroxide, sodium hydroxide, potassium hydroxide, and cesium hydroxide; alkaline earth metal hydroxides, such as magnesium hydroxide, calcium hydroxide, and barium hydroxide; alkali metal carbonates, such as lithium carbonate, sodium carbonate, potassium carbonate, and cesium carbonate; alkaline earth metal carbonates, such as magnesium carbonate; alkali metal hydrogencarbonates, such as lithium hydrogencarbonate, sodium hydrogencarbonate, potassium hydrogencarbonate, and cesium hydrogencarbonate; alkali metal organic acid salts (e.g., acetates), such as lithium acetate, sodium acetate, potassium acetate, and cesium acetate; alkaline earth metal organic acid salts (e.g., acetates), such as magnesium acetate; alkali metal alkoxides, such as lithium methoxide, sodium methoxide, sodium ethoxide, sodium isopropoxide, potassium ethoxide, and potassium t-butoxide; alkali metal phenoxides, such as sodium phenoxide; amines (tertiary amines and the like), such as triethylamine, N-methylpiperidine, 1,8-diazabicyclo[5.4.0]undec-7-ene, and 1,5-diazabicyclo[4.3.0]non-5-ene; and nitrogen-containing heteroaromatic compounds, such as pyridine, 2,2'-bipyridyl, and 1,10-phenanthroline. Note that one type of the catalyst can be used alone, or two or more types of the catalysts can be used in combination. Furthermore, the catalyst can be used as it is dissolved or dispersed in water, a solvent, or the like.

The used amount of the catalyst is not particularly limited and can be suitably adjusted in the range of 0.002 to 0.200 mol per 1 mol total of the hydrolyzable silane compounds.

The used amount of water during the hydrolysis and condensation reactions is not particularly limited and can be suitably adjusted in the range of 0.5 to 20 mol per 1 mol total of the hydrolyzable silane compounds.

The method of adding water is not particularly limited, and the total amount (total amount to be used) of the water to be used may be added at one time or may be added sequentially. In a case where sequential addition is performed, the addition may be performed continuously or intermittently.

The reaction condition for performing the hydrolysis and condensation reactions of the hydrolyzable silane compound may be preferably selected such that, in particular, a reaction condition by which the weight-average molecular weight (Mw), the molecular weight distribution (Mw/Mn), the viscosity at 25° C., and the like of the component (A) of an embodiment of the present invention are in predetermined ranges. The reaction temperatures of the hydrolysis and condensation reactions are not particularly limited but are preferably from −10 to 100° C., and more preferably from 0 to 80° C. Controlling of the reaction temperature within the range described above tends to facilitate the control of the weight-average molecular weight (Mw), the molecular weight distribution (Mw/Mn), the viscosity at 25° C., and the like of the component (A) to the predetermined ranges. Furthermore, the reaction times of the hydrolysis and condensation reactions are not particularly limited but are preferably from 0.1 to 24 hours, and more preferably from 1.5 to 18 hours. Furthermore, the hydrolysis and condensation reactions can be performed under normal pressure or can be performed under increased pressure or reduced pressure. Note that atmospheres during the hydrolysis and condensation reactions described above are not particularly limited and, for example, may be any of an inert gas atmosphere, such as a nitrogen atmosphere and an argon atmosphere, or in the presence of oxygen, such as in the air. However, the hydrolysis and condensation reactions are preferably performed under an inert gas atmosphere.

The component (A) of an embodiment of the present invention can be obtained by the hydrolysis and condensation reactions of the hydrolyzable silane compound. The component (A) of an embodiment of the present invention may be separated and refined by a separation method, such as water washing, acid washing, alkali washing, filtration, concentration, distillation, extraction, crystallization, recrystallization, and column chromatography, a separation method that combines these methods, or the like.

The component (A) of an embodiment of the present invention has the composition described above, and a cured product having both good heat resistance and light resistance and further having low tackiness can be formed by curing the curable resin composition containing the component (A) as an essential component.

Note that, in the curable resin composition of an embodiment of the present invention, one type of the component (A) can be used alone, or two or more types of the components (A) can be used in combination.

In a case where two or more types of the components (A) are used in combination, X, Y, Z, X/Y, a1 to a4, a1/a2, and the like described above may be average values corresponding to the blended proportion of each of the components (A).

The content (blended amount) of the component (A) in the curable resin composition of an embodiment of the present invention is not particularly limited but is preferably from 20 to 99 wt. %, more preferably from 40 to 97 wt. %, and even more preferably from 50 to 95 wt. %, relative to the total amount (100 wt. %) of the curable resin composition.

In a case where the content is not less than 20 wt. %, good heat resistance and light resistance tend to be further enhanced.

Component (B)

The component (B), which is the essential component of the curable resin composition of an embodiment of the present invention, is a polyorganosiloxane having not more than 10 silicon atoms and having the proportion of the alkenyl group relative to the total amount (100 mol %) of the organic groups bonded to the silicon atom from 20 to 60 mol %, as described above.

That is, the component (B) is a polysiloxane having an alkenyl group and is a component that causes a hydrosilylation reaction with a component having a hydrosilyl group (e.g., component (D) described below and the like).

The component (B) is a polyorganosiloxane containing at least one alkenyl group in a molecule and containing a siloxane bond (—Si—O—Si—) as the main chain, and is a polyorganosiloxane having the proportion of the alkenyl group relative to the total amount (100 mol %) of the organic groups bonded to the silicon atom from 20 to 60 mol % and having not more than 10 silicon atoms. In a case where the curable resin composition of an embodiment of the present invention contains such a component (B), the viscosity of the curable resin composition is adjusted to a lower value, and handling tends to be easier.

Examples of the component (B) include components having linear, partially branched linear, branched, mesh-like, or cyclic molecular structures. Note that one type of the component (B) can be used alone, or two or more types of the components (B) can be used in combination. Specifically, two or more types of components (B) having different molecular structures can be used together and, for example, a linear component (B) and a branched component (B) can be used together.

Examples of the alkenyl group included in the molecule of the component (B) include $C_{2-20}$ alkenyl groups (preferably $C_{2-10}$ alkenyl groups, and more preferably $C_{2-8}$ alkenyl groups), such as a vinyl group, an allyl group, a methallyl group, a 1-propenyl group, an isopropenyl group, a 1-butenyl group, a 2-butenyl group, a 3-butenyl group, a 1-pentenyl group, a 2-pentenyl group, a 3-pentenyl group, a 4-pentenyl group, and a 5-hexenyl group. Among these, $C_{2-8}$ alkenyl groups are preferable, and a vinyl group is more preferable.

The alkenyl group may have a substituent. Examples of the substituent include those similar to the substituents that may be included in a monovalent hydrocarbon group described below.

Furthermore, the component (B) may be a component having only one type of the alkenyl group or may be a component having two or more types of the alkenyl groups. Note that the alkenyl group included in the component (B) is bonded to a silicon atom.

In the component (B), as described above, the proportion of the alkenyl group relative to the total amount (100 mol %) of the organic groups bonded to the silicon atom is from 20 to 60 mol %, preferably from 20 to 55 mol %, and more preferably from 25 to 50 mol %. The proportion of the alkenyl group within the range described above tends to further enhance toughness of the resulting cured product. That is, when the proportion of the alkenyl group is less than 20 mol %, hardness of the resulting cured product tends to be low, and on the other hand, when the proportion of the alkenyl group is greater than 60 mol %, the cured product tends to be brittle.

The number of the silicon atom constituting the component (B) is not more than 10, preferably not more than 8, and more preferably not more than 6, as described above. In a case where the number of silicon atom constituting the component (B) is greater than 10, viscosity of the curable resin composition of an embodiment of the present invention increases, and handleability tends to be deteriorated.

The lower limit of the number of the silicon atom constituting the component (B) is not particularly limited but is preferably not less than 2, and more preferably not less than 3. The number of the silicon atom constituting the component (B) of not less than 2 preferably has a tendency to suppress the amount of the siloxane that volatilizes during the curing.

Examples of the organic group bonded to the silicon atom included in the component (B) include monovalent hydrocarbon groups, monovalent heterocyclic groups, and the like. Note that, in the present specification, "group bonded to the silicon atom" refers typically to a group that does not include a silicon atom.

Examples of the monovalent hydrocarbon group include monovalent aliphatic hydrocarbon groups; monovalent alicyclic hydrocarbon groups; monovalent aromatic hydrocarbon groups; monovalent groups to which two or more of aliphatic hydrocarbon groups, alicyclic hydrocarbon groups, and/or aromatic hydrocarbon groups are bonded. Examples of the monovalent heterocyclic group include a pyridyl group, a furyl group, and a thienyl group.

Examples of the monovalent aliphatic hydrocarbon group include alkyl groups, alkenyl groups described above, and alkynyl groups. Examples of the alkyl group include linear or branched $C_{1-20}$ alkyl groups, such as a methyl group, an ethyl group, a propyl group, an isopropyl group, a butyl group, a hexyl group, an octyl group, an isooctyl group, a decyl group, and a dodecyl group (preferably $C_{1-10}$ alkyl groups, and more preferably $C_{1-4}$ alkyl groups). Examples of the alkynyl group include $C_{2-20}$ alkynyl groups, such as an ethynyl group and a propynyl group (preferably $C_{2-10}$ alkynyl groups, and more preferably $C_{2-4}$ alkynyl groups).

Examples of the monovalent alicyclic hydrocarbon group include $C_{3-12}$ cycloalkyl groups, such as a cyclopropyl group, a cyclobutyl group, a cyclopentyl group, a cyclohexyl group, and a cyclododecyl group; $C_{3-12}$ cycloalkenyl groups, such as a cyclohexenyl group; $C_{4-15}$ crosslinked cyclic hydrocarbon groups, such as a bicycloheptanyl group and a bicycloheptenyl group.

Examples of the monovalent aromatic hydrocarbon group include $C_{6-14}$ aryl groups, such as a phenyl group, a naphthyl group, and an anthryl group (especially, $C_{6-10}$ aryl groups).

Furthermore, examples of the group in which an aliphatic hydrocarbon group and an alicyclic hydrocarbon group are bonded include a cyclohexylmethyl group, and a methylcyclohexyl group. Examples of the group in which an aliphatic hydrocarbon group and an aromatic hydrocarbon group are bonded include $C_{7-18}$ aralkyl groups, such as a benzyl group and a phenethyl group (especially, $C_{7-10}$ aralkyl groups); $C_{6-10}$ aryl-$C_{2-6}$ alkenyl groups, such as a cinnamyl group; $C_{1-4}$ alkyl-substituted aryl groups, such as a tolyl group; and $C_{2-4}$ alkenyl-substituted aryl groups, such as a styryl group.

The monovalent hydrocarbon group may have a substituent. That is, the monovalent hydrocarbon group may be a monovalent hydrocarbon group in which at least one hydrogen atom of the monovalent hydrocarbon group exemplified above is substituted by a substituent. The number of carbons of the substituent is preferably from 0 to 20, and more preferably from 0 to 10. Specific examples of the substituent include a halogen atom; a hydroxyl group; alkoxy groups;

alkenyloxy groups; aryloxy groups; aralkyloxy groups; acyloxy groups; a mercapto group; alkylthio groups; alkenylthio groups; arylthio groups; aralkylthio groups; a carboxy group; alkoxycarbonyl groups; aryloxycarbonyl groups; aralkyloxycarbonyl groups; amino groups; mono- or di-alkylamino groups; mono- or di-phenylamino groups; acylamino groups; epoxy group-containing groups; oxetanyl group-containing groups; acyl groups; an oxo group; an isocyanate group; and groups to which two or more of these are bonded through a $C_{1-6}$ alkylene group as necessary.

Examples of the alkoxy group described above include $C_{1-6}$ alkoxy groups, such as a methoxy group, an ethoxy group, a propoxy group, an isopropyloxy group, a butoxy group, and an isobutyloxy group (preferably $C_{1-4}$ alkoxy groups). Examples of the alkenyloxy group described above include $C_{2-6}$ alkenyloxy groups, such as an allyloxy group (preferably $C_{2-4}$ alkenyloxy groups). Examples of the aryloxy group described above include $C_{6-14}$ aryloxy groups that may have a substituent, such as a $C_{1-4}$ alkyl group, a $C_{2-4}$ alkenyl group, a halogen atom, or a $C_{1-4}$ alkoxy group, in an aromatic ring, such as a phenoxy group, a tolyloxy group, or a naphthyloxy group. Examples of the aralkyloxy group described above include $C_{7-18}$ aralkyloxy groups, such as a benzyloxy group and a phenethyloxy group. Examples of the acyloxy group described above include $C_{1-12}$ acyloxy groups, such as an acetyloxy group, a propionyloxy group, a (meth)acryloyloxy group, and a benzoyloxy group.

Examples of the alkylthio group described above include $C_{1-6}$ alkylthio groups, such as a methylthio group and an ethylthio group (preferably $C_{1-4}$ alkylthio groups). Examples of the alkenylthio group described above include $C_{2-6}$ alkenylthio groups, such as an allylthio group (preferably $C_{2-4}$ alkenylthio groups). Examples of the arylthio group described above include $C_{6-14}$ arylthio groups that may have a substituent, such as a $C_{1-4}$ alkyl group, a $C_{2-4}$ alkenyl group, a halogen atom, or a $C_{1-4}$ alkoxy group, in an aromatic ring, such as a phenylthio group, a tolylthio group, or a naphthylthio group. Examples of the aralkylthio group described above include $C_{7-18}$ aralkylthio groups, such as a benzylthio group and a phenethylthio group. Examples of the alkoxycarbonyl group described above include $C_{1-6}$ alkoxy-carbonyl groups, such as a methoxycarbonyl group, an ethoxycarbonyl group, a propoxycarbonyl group, and a butoxycarbonyl group. Examples of the aryloxycarbonyl group described above include $C_{6-14}$ aryloxy-carbonyl groups, such as a phenoxycarbonyl group, a tolyloxycarbonyl group, and a naphthyloxycarbonyl group. Examples of the aralkyloxycarbonyl group described above include $C_{7-18}$ aralkyloxy-carbonyl groups, such as a benzyloxycarbonyl group. Examples of the mono- or di-alkylamino groups described above include mono- or di-$C_{1-6}$ alkylamino group, such as a methylamino group, an ethylamino group, a dimethylamino group, and a diethylamino group. Examples of the acylamino group described above include $C_{1-11}$ acylamino groups, such as an acetylamino group, a propionylamino group, and a benzoylamino group. Examples of the epoxy group-containing group described above include a glycidyl group, a glycidyloxy group, and a 3,4-epoxycyclohexyl group. Examples of the oxetanyl group-containing group described above include an ethyloxetanyloxy group. Examples of the acyl group described above include an acetyl group, a propionyl group, and a benzoyl group. Examples of the halogen atom described above include a chlorine atom, a bromine atom, and an iodine atom.

The monovalent heterocyclic group described above may have a substituent. Examples of the substituent include those similar to the substituents that may be included in the monovalent hydrocarbon group described above.

Specific examples of the monovalent hydrocarbon group and the monovalent heterocyclic group include alkyl groups, such as a methyl group, an ethyl group, a propyl group, an isopropyl group, a butyl group, a hexyl group, an octyl group, and a decyl group; aryl groups, such as a phenyl group, a naphthyl group, and an anthryl group; aralkyl groups, such as a benzyl group and a phenethyl group; heterocyclic groups, such as a pyridyl group, a furyl group, and a thienyl group; alkenyl groups, such as a vinyl group; hydrocarbon groups having a substituent (e.g., 2-(3,4-epoxycyclohexyl)ethyl group, 3-glycidylpropyl group, 3-methacryloxypropyl group, 3-acryloxypropyl group, N-2-(aminoethyl)-3-aminopropyl group, 3-aminopropyl group, N-phenyl-3-aminopropyl group, 3-mercaptopropyl group, and 3-isocyanatepropyl group). As the organic group bonded to the silicon atom other than the alkenyl group included in the component (B), an alkyl group (preferably a methyl group) or an aryl group (preferably a phenyl group) is preferable.

Furthermore, the component (B) may contain a hydroxy group and/or an alkoxy group as the group bonded to the silicon atom.

The properties of the component (B) is preferably a liquid at 25° C.

As the component (B), a polyorganosiloxane represented by unit formula below is preferable.

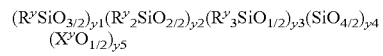

In the unit formula, $R^y$ is, the same or different, a monovalent organic group. Examples of the monovalent organic group include the specific examples of the monovalent hydrocarbon group or the monovalent heterocyclic group described above. Some of the $R^y$ moieties are alkenyl groups (especially, vinyl groups), and the proportion thereof is, as described above, from 20 to 60 mol % (preferably from 20 to 55 mol %, and more preferably from 25 to 50 mol %) relative to the total amount (100 mol %) of the organic groups bonded to the silicon atom in the component (B). The proportion of the alkenyl group is controlled within the range described above, and curability of the curable resin composition tends to be further enhanced. Furthermore, as the $R^y$ moieties other than the alkenyl groups, alkyl groups (especially, methyl groups) and aryl groups (especially, phenyl groups) are preferable.

In the unit formula above, $X^y$ is a hydrogen atom or an alkyl group. Examples of the alkyl group include a methyl group, an ethyl group, a propyl group, a butyl group, a pentyl group, a hexyl group, and the like. A methyl group is particularly preferable.

In the unit formula above, y1 is 0 or a positive integer, y2 is 0 or a positive integer, y3 is 0 or a positive integer, y4 is 0 or a positive integer, and y5 is 0 or a positive integer. (y1+y2+y3) is a positive number, and y1, y2, y3, and y4 are positive numbers that satisfy 2≤y1+y2+y3+y4≤10. (y1+y2+y3+y4) is preferably from 2 to 8, and more preferably from 2 to 6.

An example of the component (B) is a linear polyorganosiloxane having the proportion of the alkenyl group relative to the total amount (100 mol %) of the organic groups bonded to the silicon atom from 20 to 60 mol % (preferably 20 to 55 mol %, and more preferably 25 to 50 mol %) and the number of the silicon atom of not more than 10 (preferably not more than 8, and more preferably not more than 6). Examples of the alkenyl group included in this linear polyorganosiloxane include the specific examples described above. Among these, a vinyl group is preferable. Note that the linear polyorganosiloxane may be a linear polyorganosiloxane having only one type of the alkenyl group or may be a linear polyorganosiloxane having two or more types of the alkenyl groups. Furthermore, examples of the group bonded to the silicon atom other than the alkenyl group in the linear polyorganosiloxane above include a substituted or unsubstituted monovalent hydrocarbon group described above. Among these, alkyl groups (especially, methyl group) and aryl groups (especially, phenyl group) are preferable.

In the linear polyorganosiloxane, as described above, the proportion of the alkenyl group relative to the total amount (100 mol %) of the organic groups bonded to the silicon atom is from 20 to 60 mol % (preferably from 20 to 55 mol %, and more preferably from 25 to 50 mol %). Furthermore, the proportion of the alkyl group (especially, methyl group) relative to the total amount (100 mol %) of the organic groups bonded to the silicon atom is not particularly limited but is preferably from 0 to 80 mol %. Furthermore, the proportion of the aryl group (especially, phenyl group) relative to the total amount (100 mol %) of the organic groups bonded to the silicon atom is not particularly limited but is preferably from 0 to 80 mol %. In particular, use of a linear polyorganosiloxane having the proportion of the aryl group (especially, phenyl group) relative to the total amount (100 mol %) of the groups bonded to the silicon atom of not less than 5 mol % (e.g., from 7 to 60 mol %) as the linear polyorganosiloxane described above tends to further enhance hardness of the cured product. Furthermore, use of a linear polyorganosiloxane having the proportion of the alkyl group (especially, methyl group) relative to the total amount (100 mol %) of the organic groups bonded to the silicon atom of not less than 40 mol % (e.g., from 50 to 80 mol %) tends to further enhance thermal impact resistance of the cured product.

The linear component (B) described above is, for example, represented by Formula (Y-1) below.

[Chem. 3]

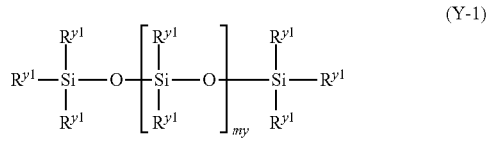

(Y-1)

where, $R^{y1}$ is, the same or different, a substituted or unsubstituted monovalent hydrocarbon group. However, from 20 to 60 mol % (preferably from 20 to 55 mol %, and more preferably from 25 to 50 mol %) of all the $R^{y1}$ moieties is alkenyl groups. my is an integer of 0 to 8.

Examples of the alkenyl group represented by $R^{y1}$ include the specific examples described above. Among these, a vinyl group is preferable. Furthermore, examples of $R^{y1}$ other than the alkenyl group include a substituted or unsubstituted monovalent hydrocarbon group described above. Among these, alkyl groups (especially, methyl group) and aryl groups (especially, phenyl group) are preferable. my is an integer of 0 to 8, preferably an integer of 0 to 6, and more preferably an integer of 0 to 4.

Specific examples of the linear component (B) include 1,3-divinyltetramethyldisiloxane, 1,3-divinyltetraethyldisiloxane, 1,1-divinyltetramethyldisiloxane, 1,1,3-trivinyltrimethyldisiloxane, 1,1,1-trivinyltrimethyldisiloxane, 1,3-divinyltetraphenyldisiloxane, 1,1-divinyltetraphenyldisiloxane, 1,1,3-trivinyltriphenyldisiloxane, 1,1,1-trivinyltriphenyldisiloxane, 1,5-divinylhexamethyltrisiloxane, 1,3-divinylhexamethyltrisiloxane, 1,1-divinylhexamethyltrisiloxane, 3,3-divinylhexamethyltrisiloxane, 1,5-divinyl-3-phenyl-pentamethyltrisiloxane, 1,5-divinyl-3,3-diphenyl-tetramethyltrisiloxane, 1,5-divinylhexaphenyltrisiloxane, 1,3-divinylhexaphenyltrisiloxane, 1,1-divinylhexaphenyltrisiloxane, 3,3-divinylhexaphenyltrisiloxane, 1,1,1-trivinylpentamethyltrisiloxane, 1,3,5-trivinylpentamethyltrisiloxane, 1,1,1-trivinylpentaphenyltrisiloxane, 1,3,5-trivinylpentaphenyltrisiloxane, 1,1,3,3-tetravinyltetramethyltrisiloxane, 1,1,5,5-tetravinyltetramethyltrisiloxane, 1,1,3,3-tetravinyltetraphenyltrisiloxane, 1,1,5,5-tetravinyltetraphenyltrisiloxane, 1,7-divinyloctamethyltetrasiloxane, 1,3,5,7-tetravinylhexamethyltetrasiloxane, and 1,1,7,7-tetravinylhexamethyltetrasiloxane.

Another example of the component (B) is a branched polyorganosiloxane having the proportion of the alkenyl group relative to the total amount (100 mol %) of the organic groups bonded to the silicon atom of 20 to 60 mol % (preferably 20 to 55 mol %, and more preferably 25 to 50 mol %) and the number of the silicon atom of not more than 10 (preferably not more than 8, and more preferably not more than 6), and having a siloxane unit represented by $RSiO_{3/2}$ (T unit). Note that R is a substituted or unsubstituted monovalent hydrocarbon group. Examples of the alkenyl group included in this branched polyorganosiloxane include the specific examples described above. Among these, a vinyl group is preferable. Note that the branched polyorganosiloxane may be a branched polyorganosiloxane having only one type of the alkenyl group or may be a branched polyorganosiloxane having two or more types of the alkenyl groups. Furthermore, examples of the group bonded to the silicon atom other than the alkenyl group in the branched polyorganosiloxane above include a substituted or unsubstituted monovalent hydrocarbon group described above. Among these, alkyl groups (especially, methyl group) and aryl groups (especially, phenyl group) are preferable. Furthermore, as R in the T unit, alkyl groups (especially, methyl group) and aryl groups (especially, phenyl group) are preferable among these.

In the branched polyorganosiloxane, as described above, the proportion of the alkenyl group relative to the total amount (100 mol %) of the organic groups bonded to the silicon atom is from 20 to 60 mol % (preferably from 20 to 55 mol %, and more preferably from 25 to 50 mol %), from the perspective of curability of the curable resin composition. Furthermore, the proportion of the alkyl group (especially, methyl group) relative to the total amount (100 mol %) of the organic groups bonded to the silicon atom is not particularly limited but is preferably from 0 to 80 mol %. Furthermore, the proportion of the aryl group (especially, phenyl group) relative to the total amount (100 mol %) of the organic groups bonded to the silicon atom is not particularly limited but is preferably from 0 to 80 mol %. In particular, use of a branched polyorganosiloxane having the proportion of the aryl group (especially, phenyl group) relative to the total amount (100 mol %) of the organic groups bonded to the silicon atom of not less than 5 mol % (e.g., from 7 to 60 mol %) as the branched polyorganosiloxane described above tends to further enhance the hardness of the cured product. Furthermore, use of a branched polyorganosiloxane having the proportion of the alkyl group (especially, methyl group) relative to the total amount (100 mol %) of the organic groups bonded to the silicon atom of not less than 40 mol % (e.g., from 50 to 80 mol %) tends to further enhance thermal impact resistance of the cured product.

The branched polyorganosiloxane can be represented by the unit formula above in which y1 and/or y4 is positive integer(s). In this case, although there are no particular limitations, y2/y1 is preferably a number of 0 to 10, y3/y1 is preferably a number of 0 to 3, y4/(y1+y2+y3+y4) is preferably a number of 0 to 0.3, and y5/(y1+y2+y3+y4) is preferably a number of 0 to 0.4.

Specific examples of the branched component (B) include tris(vinyldimethylsiloxy)methylsilane, tris(vinyldimethylsiloxy)methoxysilane, tris(vinyldimethylsiloxy)phenylsilane, and tetrakis(vinyldimethylsiloxy)silane.

Another example of the component (B) is a cyclic polyorganosiloxane having the proportion of the alkenyl group relative to the total amount (100 mol %) of the organic groups bonded to the silicon atom of 20 to 60 mol % (preferably 20 to 55 mol %, and more preferably 25 to 50 mol %) and the number of the silicon atom of not more than 10 (preferably not more than 8, and more preferably not more than 6). Examples of the alkenyl group included in this cyclic polyorganosiloxane include the specific examples described above. Among these, a vinyl group is preferable. Note that the cyclic polyorganosiloxane may be a cyclic polyorganosiloxane having only one type of the alkenyl group or may be a cyclic polyorganosiloxane having two or more types of the alkenyl groups. Furthermore, examples of the group bonded to the silicon atom other than the alkenyl group in the cyclic polyorganosiloxane above include a substituted or unsubstituted monovalent hydrocarbon group described above. Among these, alkyl groups (especially, methyl group) and aryl groups (especially, phenyl group) are preferable.

In the cyclic polyorganosiloxane, as described above, the proportion of the alkenyl group relative to the total amount (100 mol %) of the organic groups bonded to the silicon atom is from 20 to 60 mol % (preferably from 20 to 55 mol %, and more preferably from 25 to 50 mol %). Furthermore, the proportion of the alkyl group (especially, methyl group) relative to the total amount (100 mol %) of the organic groups bonded to the silicon atom is not particularly limited but is preferably from 0 to 80 mol %. Furthermore, the proportion of the aryl group (especially, phenyl group) relative to the total amount (100 mol %) of the organic groups bonded to the silicon atom is not particularly limited but is preferably from 0 to 80 mol %. In particular, use of a cyclic polyorganosiloxane having the proportion of the aryl group (especially, phenyl group) relative to the total amount (100 mol %) of the groups bonded to the silicon atom of not less than 5 mol % (e.g., from 7 to 60 mol %) as the cyclic polyorganosiloxane described above tends to further enhance the hardness of the cured product. Furthermore, use of a cyclic polyorganosiloxane having the proportion of the alkyl group (especially, methyl group) relative to the total amount (100 mol %) of the organic groups bonded to the silicon atom of not less than 40 mol % (e.g., from 50 to 80 mol %) tends to further enhance thermal impact resistance of the cured product.

Specific examples of the cyclic component (B) include 1,3-divinyltetramethylcyclotrisiloxane, 1,3,5-trivinyltrimethylcyclotrisiloxane, 1,3,5-trivinyltriphenylcyclotrisiloxane, 1,3-divinyltetraphenylcyclotrisiloxane, 1,3,5-trivinyltriphenylcyclotrisiloxane, 1,3-divinylhexamethylcyclotetrasiloxane, 1,3,5-trivinylpentamethylcyclotetrasiloxane and 1,3,5,7-tetravinyltetramethylcyclotetrasiloxane, and 1,3,5,7-tetravinyltetraphenylcyclotetrasiloxane.

The molecular weight of the component (B) is not particularly limited but is preferably not less than 200 and not greater than 2000, more preferably not less than 250 and not greater than 1500, and even more preferably not less than 300 and not greater than 1000. In a case where the molecular weight is not less than 200, the amount of volatilization of the component (B) during curing tends to be smaller. On the other hand, in a case where the molecular weight is not greater than 2000, compatibility with another component is enhanced, and the curable resin composition is easily controlled to have a low viscosity.

The viscosity of the component (B) at 25° C. is not particularly limited but is preferably not greater than 1000 mPa·s, and more preferably not greater than 500 mPa·s. In a case where the viscosity is not greater than 1000 mPa·s, the curable resin composition is easily controlled to have a low viscosity, and preparation and handling of the curable resin composition tends to be easier. On the other hand, the lower limit of the viscosity is not particularly limited but is preferably 0.1 mPa·s, and more preferably 1 mPa·s. In a case where the viscosity is not less than 0.1 mPa·s, the amount of volatilization of the component (B) during curing tends to be smaller. Note that the viscosity at 25° C. is measured under the same conditions as the viscosity of the component (A) described above.

The component (B) can be produced by a publicly known or common method and, also, a commercially available product can be used. As products containing the component (B), for example, tris(vinyldimethylsiloxy)phenylsilane (available from Gelest Inc.), trade name "LS-8670" (available from Shin-Etsu Chemical Co., Ltd.), is available.

Note that, in the curable resin composition of an embodiment of the present invention, one type of the component (B) can be used alone, or two or more types of the components (B) can be used in combination.

In a case where two or more types of the components (B) are used in combination, y1 to y5 and the like described above may be average values corresponding to the blended proportion of each of the components (B).

Note that the component (B) needs to contain the alkenyl group in a proportion from 20 to 60 mol % relative to the total amount (100 mol %) of the organic groups bonded to the silicon atom and may further contain a hydrosilyl group.

The content (blended amount) of the component (B) in the curable resin composition of an embodiment of the present invention is not particularly limited but is preferably from 3 to 30 wt. %, more preferably from 3 to 25 wt. %, and even more preferably from 3 to 20 wt. %, relative to the total amount (100 wt. %) of the curable resin composition. In a case where the content is not less than 3 wt. %, the curable resin composition is easily controlled to have a low viscosity, and preparation and handling of the curable resin composition tends to be easier.

The content (blended amount) of the component (B) relative to the content of the component (A) in the curable resin composition of an embodiment of the present invention is from 5 to 50 parts by weight, preferably from 5 to 40 parts by weight, and more preferably from 5 to 30 parts by weight, per 100 parts by weight of the component (A), as described above. In a case where the content of the component (B) is not less than 5 parts by weight, the curable resin composition is easily controlled to have a low viscosity, and preparation and handling of the curable resin composition tends to be easier. On the other hand, in a case where the content of the component (B) is not greater than 50 parts by weight, the toughness of the cured product tends to be enhanced.

Component (C)

The curable resin composition of an embodiment of the present invention may contain the component (C), which is a polyorganosiloxane represented by Average Unit Formula (X) below, as an optional component.

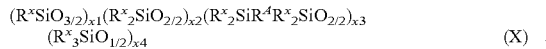

where, $R^x$ is, the same or different, an alkyl group having from 1 to 10 carbons, an aryl group having from 6 to 14 carbons, an alkenyl group having from 2 to 8 carbons, an alkoxy group having from 1 to 10 carbons, or a hydroxy group; the proportion of the aryl group relative to the total amount (100 mol %) of $R^x$ is from 1 to 50 mol %, and at least two of all the $R^x$ moieties are alkenyl groups. $R^4$ is a divalent hydrocarbon group. x1, x2, x3, and x4 are each a number satisfying $0.05 > x1 \geq 0$, $x2+x3>0$, $x4>0$, and $x1+x2+x3+x4=1$.

In more detail, for example, the component (C) can be represented as a polyorganosiloxane having the structure represented by Formula (X-1) below.

[Chem. 4]

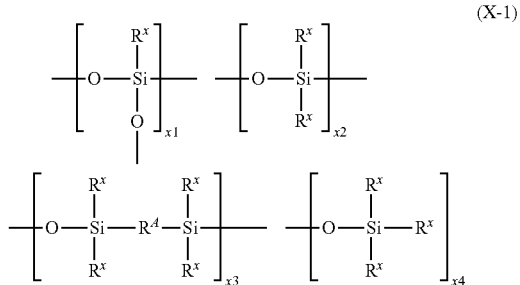

That is, the component (C) is a polysiloxane having an alkenyl group and is a component that undergoes a hydrosilylation reaction with a component having a hydrosilyl group (e.g., component (D) described below and the like).

In Average Unit Formula (X) above, examples of the alkyl group having from 1 to 10 carbons represented by $R^x$ include linear or branched alkyl groups, such as a methyl group, an ethyl group, a propyl group, an isopropyl group, a butyl group, a hexyl group, an octyl group, an isooctyl group, and a decyl group. Among these, a methyl group is preferable. Furthermore, the component (C) may be a component having only one type of the alkyl group or may be a component having two or more types of the alkyl groups.

In Average Unit Formula (X) above, examples of the aryl group having from 6 to 14 carbons represented by $R^x$ include a phenyl group, and a naphthyl group. Among these, a phenyl group is preferable. Furthermore, the component (C) may be a component having only one type of the aryl group or may be a component having two or more types of the aryl groups.

In Average Unit Formula (X) above, examples of the alkenyl group having from 2 to 8 carbons represented by $R^x$ include substituted or unsubstituted, linear or branched alkenyl groups, such as a vinyl group, an allyl group, a butenyl group, a pentenyl group, and a hexenyl group. Examples of the substituent include a halogen atom, a hydroxy group, and a carboxy group. Among these, a vinyl group is preferable. Furthermore, the component (C) may be a component having only one type of the alkenyl group or may be a component having two or more types of the alkenyl groups.

In Average Unit Formula (X) above, examples of the alkoxy group having from 1 to 10 carbons represented by $R^x$ include linear or branched alkoxy groups, such as a methoxy group, an ethoxy group, a propoxy group, an isopropoxy group, a butoxy group, a hexyloxy group, an octyloxy group, an isooctyloxy group, and a decyloxy group. Among these, a methoxy group and an ethoxy group are preferable. Furthermore, the component (C) may be a component having only one type of the alkoxy group or may be a component having two or more types of the alkoxy groups.

In the component (C), when the proportion of the alkyl group relative to the total amount (100 mol %) of $R^x$ is X" mol %, X" is preferably from 30 to 98 mol %, more preferably from 55 to 95 mol %, and even more preferably from 60 to 90 mol %. In a case where X" is not less than 30 mol %, upon curing the curable resin composition of an embodiment of the present invention, a cured product achieving good heat resistance and light resistance may be obtained easily. On the other hand, in a case where X" is not greater than 98 mol %, the gas barrier property of the cured product is enhanced, and tackiness tends to be reduced.

In the component (C), when the proportion of the aryl group relative to the total amount (100 mol %) of $R^x$ is Y" mol %, Y" is from 1 to 50 mol %, preferably from 3 to 40 mol %, and more preferably from 5 to 30 mol %. In a case where Y" is not less than 1 mol %, upon curing the curable resin composition of an embodiment of the present invention, the cured product achieving a good gas barrier property of the cured product may be obtained easily. On the other hand, in a case where Y" is not greater than 50 mol %, the heat resistance and light resistance of the cured product tend to be enhanced.

In the component (C), at least two moieties of all the $R^x$ moieties are alkenyl groups, and when the proportion of the alkenyl group relative to the total amount (100 mol %) of $R^x$ is Z" mol %, Z" is preferably from 1 to 20 mol %, more preferably from 2 to 15 mol %, and even more preferably from 3 to 10 mol %. When Z" is controlled to the range described above, the toughness of the cured product of the curable resin composition tends to be further enhanced. That is, when Z" is greater than 20 mol %, the tensile elongation of the cured product of the curable resin composition decreases, and the cured product tends to be brittle.

In the component (C), the ratio (X"/Y") of the proportion of the alkyl group (X") to the proportion of the aryl group (Y") is not particularly limited but is preferably from 0.5 to 25, more preferably from 1 to 20, and even more preferably from 2 to 15. When X"/Y" is controlled within the range described above, upon curing the curable resin composition of an embodiment of the present invention, the cured product having high gas barrier property, good heat resistance and good light resistance, and low tackiness may be obtained readily. That is, in a case where X"/Y" is not less than 0.5, upon curing the curable resin composition of an embodiment of the present invention, the cured product that maintains the heat resistance and light resistance may be obtained readily. On the other hand, in a case where X"/Y" is not greater than 25, the cured product that maintains a high gas barrier property and that suppresses tackiness may be obtained readily.

Note that the proportion of the alkyl group (mol %), the proportion of the aryl group (mol %), and the proportion of the alkenyl group (mol %) relative to the total amount (100 mol %) of $R^x$ described above are each determined by, for example, $^1$H-NMR spectrum analysis or the like.

In Average Unit Formula (X) above, examples of the divalent hydrocarbon group represented by $R^A$ include linear or branched alkylene groups (e.g., groups represented by —[CH$_2$]$_t$—, and the like; t represents an integer of not less than 1), divalent alicyclic hydrocarbon groups, and the like. Examples of the linear or branched alkylene group include linear or branched alkylene groups having from 1 to 18 carbons, such as a methylene group, a methyl methylene group, a dimethyl methylene group, an ethylene group, a propylene group, and a trimethylene group. Examples of the divalent alicyclic hydrocarbon group include divalent cycloalkylene groups (including cycloalkylidene groups), such as a 1,2-cyclopentylene group, a 1,3-cyclopentylene group, a cyclopentylidene group, a 1,2-cyclohexylene group, a 1,3-cyclohexylene group, a 1,4-cyclohexylene group, and a cyclohexylidene group. Among these, as $R^A$, a linear or branched alkylene group is preferable, and an ethylene group is particularly preferable.

In a case where the component (C) contains a bond represented by —Si—$R^A$—Si— (hereinafter, referred to as "silalkylene bond") in addition to the siloxane bond (—Si—O—Si—) as the main chain, low molecular weight rings are less likely to be formed in the production process and silanol groups (—SiOH) are less likely to be formed due to decomposition caused by heating or the like. Therefore, when the component (C) containing a silalkylene bond is used, the surface adhesiveness of the cured product of the curable resin composition is reduced, and yellowing is less likely to occur.

In Average Unit Formula (X), x1, x2, x3, and x4 are each a number satisfying 0.05>x1≥0, x2+x3>0, x4>0, and x1+x2+x3+x4=1.

That is, the component (C) is a linear polyorganosiloxane or polyorganosiloxy silalkylene that may have a partial branching, which contains at least one type of structural unit selected from the group consisting of D units represented by ($R^x$2SiO$_{2/2}$) and structural units represented by $R^x_2$Si$R^A$SiO$_{2/2}$ (in the present specification, referred to as "silalkylene units") and M units represented by $R^x_3$SiO$_{1/2}$ as essential structural units, and may further contain less than 5 mol %, relative to the total amount of the structural units, of T units represented by ($R^x$SiO$_{3/2}$) as an optional structural unit.

The curable resin composition of an embodiment of the present invention containing the component (C), which is a polyorgano(silalkyl)siloxane having such a structure, is preferable because the toughness of the cured product tends to be high.

x1 corresponds to the proportion of abundance (in terms of mole) of the units in the component (C) and, as described above, is not less than 0 but less than 0.05, preferably not less than 0.01 and not greater than 0.04, and more preferably not less than 0.02 and not greater than 0.03.

x2 is 0 or a positive number (x2≥0), corresponds to the proportion of abundance (in terms of mole) of the D units in the component (C), and is preferably from 0.30 to 0.99, more preferably from 0.40 to 0.98, and even more preferably from 0.50 to 0.97.

x3 is 0 or a positive number (x3≥0), corresponds to the proportion of abundance (in terms of mole) of the silalkylene units in the component (C), and is preferably from 0.20 to 0.90, more preferably from 0.30 to 0.80, and even more preferably from 0.40 to 0.70.

Note that x2 and x3 are each a number satisfying x2+x3>0. That is, the component (C) contains at least one unit selected from the group consisting of the D units and the silalkylene units. Thus, the flexibility of the cured product may be enhanced readily. x2+x3 is preferably from 0.30 to 0.99, more preferably from 0.40 to 0.98, and even more preferably from 0.50 to 0.97.

x4 is a positive number (a4>0), corresponds to the proportion of abundance (in terms of mole) of the M units in the component (C), and is preferably from 0.01 to 0.50, more preferably from 0.02 to 0.40, and even more preferably from 0.03 to 0.35.

In a case where x1 to x4 are within the ranges described above, upon curing the curable resin composition of an embodiment of the present invention, the cured product that has good toughness may be obtained readily.

In the component (C) of an embodiment of the present invention, X", Y", Z", X"/Y", x1 to x4, and the like can be suitably adjusted by the type of the group and the composition to be substituted with a silicon atom of the raw material (hydrolyzable silane compound described below) for forming these structural units in the method of producing the component (C) described below.

Examples of the component (C) include components having partially branched linear, branched, or mesh-like molecular structures. Note that one type of the component (C) can be used alone, or two or more types of the components (C) can be used in combination. Specifically, two or more types of components (C) having different molecular structures can be used together and, for example, a partially branched linear component (C) and a branched component (C) can be used together.

A preferable example of the component (C) is a polyorganosiloxysilalkylene containing a branched structure partially, and further containing silalkylene units, i.e., x1, x2, x3, and x4 are each a number satisfying 0.05>x1>0, x2+x3>0, x3>0, x4>0, and x1+x2+x3+x4=1 in Average Unit Formula (X) above.

The weight-average molecular weight (Mw) of the component (C) is not particularly limited but is preferably not less than 500 and not greater than 50000, more preferably not less than 600 and not greater than 40000, even more preferably not less than 700 and not greater than 20000, and particularly preferably not less than 1000 and not greater than 10000. In a case where the weight-average molecular weight is not less than 500, the toughness of the cured product is further enhanced, and tackiness tends to be reduced. On the other hand, in a case where the weight-average molecular weight is not greater than 50000, compatibility with another component tends to be enhanced. Note that the weight-average molecular weight is calculated by the molecular weight determined by gel permeation chromatography (GPC), measured based on calibration with polystyrene standard.

The molecular weight distribution (Mw/Mn) of the component (C) is not particularly limited but is preferably not less than 1 and not greater than 4, more preferably from 1 to 3.5, even more preferably from 1 to 3, and particularly preferably from 1 to 2.5. In a case where the molecular weight distribution is not greater than 4, compatibility of the cured product may be further enhanced readily. Note that the molecular weight distribution can be calculated by the weight-average molecular weight (Mw) and the number-average molecular weight (Mn) calculated by the molecular weight determined by gel permeation chromatography (GPC), measured based on calibration with polystyrene standard.

The component (C) may be a liquid or solid at 25° C. and is preferably a liquid. More specifically, the viscosity of the component (C) at 25° C. is not particularly limited but is preferably not less than 10 mPa·s, more preferably not less than 100 mPa·s, and even more preferably not less than 500 mPa·s. In a case where the viscosity is not less than 10 mPa·s, preparation and handling of the curable resin composition tends to be easier. On the other hand, the upper limit of the viscosity is not particularly limited but is preferably 1000000 mPa·s, and more preferably 100000 mPa·s. In a case where the viscosity is not greater than 1000000 mPa·s, preparation and handling of the curable resin composition tends to be easier. Note that the viscosity of the component (C) at 25° C. is measured in the same conditions as the viscosity of the component (A) described above.

In the component (C) of an embodiment of the present invention, the weight-average molecular weight (Mw), the molecular weight distribution (Mw/Mn), and the viscosity at 25° C. (mPa·s) can be suitably adjusted by the type and the composition of the group to be bonded on a silicon atom of the raw material (hydrolyzable silane compound described below) for forming these structural units, and/or production conditions (reaction temperature, reaction time, and the like) in the method of producing the component (C) described below.

The component (C) can be produced by a publicly known or common method of producing a polysiloxane and is not particularly limited. Specifically, the component (C) can be produced by a method, in which hydrolysis and condensation are carried out wherein: in a case of the component (C) containing no silalkylene unit, hydrolyzable silane compounds represented by Formulas (c) and (d) in the method of producing the component (A) described above are used; and, in a case of the component (C) partially containing a branched structure, one type or two or more types of hydrolyzable silane compounds are used as in the method of producing the component (A) described above, except that the hydrolyzable silane compound represented by Formula (b) is used together.

Furthermore, in a case where the component (C) contains a silalkylene unit, for example, the component (C) can be produced by hydrosilylation reaction of a polyorganosiloxane containing a group having an aliphatic carbon-carbon unsaturated bond and a polyorganosiloxane having an SiH group, according to the method described in JP 2012-140617 A or the like. In the production of the polyorganosiloxane containing a group containing an aliphatic carbon-carbon unsaturated bond, the component (C) containing no silalkylene unit described above can be used. The polyorganosiloxane having an SiH group can be produced by a method, in which hydrolysis and condensation are carried out, wherein one type or two or more types of hydrolyzable silane compounds are used as in as in the production method of the component (A) described above, except that hydrolyzable silane compounds, in which the alkenyl groups having from 2 to 8 carbons of $R^{12}$, $R^{13}$, and $R^{14}$ are substituted with hydrogen atoms in the hydrolyzable silane compounds represented by Formulas (b), (c), and (d) used in the method of producing the component (C) containing no silalkylene unit described above, are used as raw materials. Furthermore, a commercially available product can be also used.

In a case where the curable resin composition of an embodiment of the present invention contains the component (C), the content (blended amount) thereof is not particularly limited but is preferably not greater than 20 wt. % (i.e. from 0 to 20 wt. %), more preferably from 0 to 15 wt. %, and even more preferably from 1 to 10 wt. %, relative to the total amount (100 wt. %) of the curable resin composition. In a case where the content is not greater than 20 wt. %, the viscosity of the blended liquid is reduced, and thus handling tends to be further enhanced.

In a case where the curable resin composition of an embodiment of the present invention contains the component (C), the content (blended amount) thereof is not greater than 10 parts by weight (i.e. from 0 to 10 parts by weight), preferably from 0 to 8 parts by weight, and more preferably from 1 to 6 parts by weight, per 100 parts by weight of the component (A). In a case where the content is not greater than 10 parts by weight, the viscosity of the blended liquid is reduced, and thus handling tends to be further enhanced.

Component (D)

As described above, the component (D), which is the essential component of the curable resin composition of an embodiment of the present invention, is a polyorganosiloxane represented by Average Composition Formula (II) below:

$$R^2{}_m H_n SiO_{[(4-m-n)/2]} \quad (II)$$

where, $R^2$ is, the same or different, an alkyl group having from 1 to 10 carbons or an aryl group having from 6 to 14 carbons, and at least two hydrogen atoms are bonded to the silicon atom; and m and n are each a number satisfying $0.7 \le m \le 2.1$, $0.001 \le n \le 1$, and $0.8 \le m+n \le 3$.

That is, the component (D) is a polyorganosiloxane having a hydrosilyl group and is a component that causes a hydrosilylation reaction with a component having an alkenyl group (e.g., the component (A), the component (B), and the component (C), as well as a component (F) and a component (H) described below and the like).

In Average Composition Formula (II) above, examples of the alkyl group having from 1 to 10 carbons represented by $R^2$ include linear or branched alkyl groups, such as a methyl group, an ethyl group, a propyl group, an isopropyl group, a butyl group, a hexyl group, an octyl group, an isooctyl group, and a decyl group. Among these, a methyl group is preferable. Furthermore, the component (D) may be a component having only one type of the alkyl group or may be a component having two or more types of the alkyl groups.

In Average Composition Formula (II) above, examples of the aryl group having from 6 to 14 carbons represented by $R^2$ include a phenyl group, and a naphthyl group. Among these, a phenyl group is preferable. Furthermore, the component (D) may be a component having only one type of the aryl group or may be a component having two or more types of the aryl groups.

In the component (D), when the proportion of the alkyl group relative to the total amount (100 mol %) of $R^2$ is X' mol %, X' is not particularly limited but is preferably from 20 to 95 mol %, more preferably from 30 to 93 mol %, and even more preferably from 40 to 90 mol %. In a case where X' is not less than 20 mol %, upon curing the curable resin composition of an embodiment of the present invention, the cured product achieving good heat resistance and light resistance may be obtained readily. On the other hand, in a case where X' is not greater than 95 mol %, the gas barrier property of the cured product is enhanced, and tackiness tends to be reduced.

In the component (D), when the proportion of the aryl group relative to the total amount (100 mol %) of $R^2$ is Y' mol %, Y' is not particularly limited but is preferably from 1 to 80 mol %, more preferably from 3 to 60 mol %, and even more preferably from 5 to 40 mol %. In a case where Y' is not less than 1 mol %, the gas barrier property of the cured product is enhanced, and tackiness tends to be reduced. On the other hand, in a case where Y' is not greater than 80 mol %, the heat resistance and light resistance of the cured product may be enhanced readily.

In the component (D), when the proportion of the SiH group (hydrosilyl group) relative to the total amount (100 mol %) of $R^2$ is $Z'$ mol %, $Z'$ is not particularly limited but is preferably from 2 to 70 mol %, more preferably from 5 to 60 mol %, and even more preferably from 10 to 55 mol %. In a case where $Z'$ is controlled within the range described above, curability of the curable resin composition tends to be further enhanced.

In the component (D), the ratio ($X'/Y'$) of the content of the alkyl group ($X'$) to the content of the aryl group ($Y'$) is not particularly limited but is preferably from 1/100 to 100/1, more preferably from 10/100 to 100/10, and even more preferably from 20/100 to 100/20. In a case where $X'/Y'$ is controlled within the range described above, upon curing the curable resin composition of an embodiment of the present invention, the cured product having high gas barrier property, good heat resistance and good light resistance, and low tackiness tends to be obtained. That is, in a case where $X'/Y'$ is not less than 1/100, upon curing the curable resin composition of an embodiment of the present invention, the cured product that maintains heat resistance and light resistance may be obtained readily. On the other hand, in a case where $X'/Y'$ is not greater than 100/1, the cured product that maintains high gas barrier property and that suppresses tackiness may be obtained readily.

Note that the proportion of the alkyl group (mol %), the proportion of the content of the aryl group (mol %), and the proportion of the SiH group (mol %) relative to the total amount (100 mol %) of $R^2$ described above are determined by, for example, $^1$H-NMR spectrum analysis or the like.

In Average Composition Formula (II), m and n are each a number satisfying $0.7 \leq m \leq 2.1$, $0.001 \leq n \leq 1$, and $0.8 \leq m+n \leq 3$.

m represents an average number of $R^2$ per 1 silicon atom in the component (D), and is selected from a range of 0.7 to 2.1, preferably from 0.8 to 2.1, and more preferably from 1 to 2.

n represents the number of the hydrogen atoms bonded to the silicon atom per 1 silicon atom in the component (D), and is selected from a range of 0.001 to 1, preferably from 0.01 to 1, and more preferably from 0.2 to 1.

m+n represents an average number of sum of the number of $R^2$ and the number of the hydrogen atom bonded to the silicon atom per 1 silicon atom in the component (D), and is selected from a range of 0.8 to 3, preferably from 1 to 2.9, and more preferably from 1.5 to 2.8.

In a case where m and n satisfy the conditions described above, upon curing the curable resin composition of an embodiment of the present invention, the cured product having good heat resistance and good light resistance and low tackiness may be obtained readily.

In the component (D) of an embodiment of the present invention, $X'$, $Y'$, $Z'$, $X'/Y'$, m, n, m+n, and the like can be suitably adjusted by the type and the composition of the group to be bonded to a silicon atom of the raw material (hydrolyzable silane compound) for forming these structural units in the production of the component (D) described below.

The component (D) preferably contains at least two structural units (M units) represented by $R^{2'}_2HSiO_{1/2}$ in a molecule. That is, the component (D) preferably has a structure in which at least two terminals are capped with an M unit represented by $R^{2'}_2HSiO_{1/2}$. The $R^{2'}$ moieties in the M unit are, the same or different, an alkyl group having from 1 to 10 carbons or an aryl group having from 6 to 14 carbons. Examples of the alkyl group having from 1 to 10 carbons and the aryl group having from 6 to 14 carbons represented by $R^{2'}$ include those similar to $R^2$ in Average Composition Formula (II) above. The alkyl group having from 1 to 10 carbons and the aryl group having from 6 to 14 carbons represented by $R^{2'}$ are preferably alkyl groups having from 1 to 10 carbons, and more preferably a methyl group.

In a case where the component (D) has such a structure having SiH groups (hydrosilyl groups) at at least two terminals, a cured product achieving good flexibility, heat resistance, and light resistance may be obtained readily upon curing the curable resin composition.

In a case where the component (D) contains the M unit represented by $R^{2'}_2HSiO_{1/2}$, the number thereof is not particularly limited as long as the number is not less than 2, but is preferably from 2 to 4, and more preferably 2. Two or more of the M unit represented by $R^{2'}_2HSiO_{1/2}$ may be the same or different.

Furthermore, the component (D) may have an SiH group in a side chain besides the M unit represented by $R^{2'}_2HSiO_{1/2}$.

Examples of the component (D) include components having linear, partially branched linear, branched, or mesh-like molecular structures. Note that one type of the component (D) can be used alone, or two or more types of the components (D) can be used in combination. Specifically, two or more types of components (D) having different molecular structures can be used together and, for example, a linear component (D) and a branched component (D) can be used together.

The properties of the component (D) may be a liquid or solid. Among these, a liquid is preferable, and a liquid having a viscosity of 0.1 to 100000 mPa·s at 25° C. is more preferable. The viscosity of the component (D) at 25° C. can be measured by the method that is the same as the method for the component (A) described above.

An example of the component (D) is a polyorganosiloxane represented by the average unit formula below:

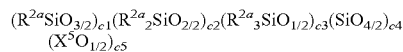

and, having at least two structural units (M units) represented by $R^{2a}_2HSiO_{1/2}$. In the average unit formula and the M unit, the $R^{2a}$ moieties are, the same or different, a hydrogen atom, an alkyl group having from 1 to 10 carbons, or an aryl group having from 6 to 14 carbons. Examples and preferable aspects of the alkyl group having from 1 to 10 carbons and the aryl group having from 6 to 14 carbons represented by $R^{2a}$ are respectively the same as those of $R^2$ in Average Composition Formula (II) above.

Some of the $R^{2a}$ moieties may be hydrogen atoms (hydrogen atoms constituting hydrosilyl groups). The proportion of the hydrogen atom relative to the total amount (100 mol %) of $R^{2a}$ is not particularly limited but is preferably from 2 to 70 mol %. In a case where the proportion of the hydrogen atom is controlled within the range described above, curability of the curable resin composition tends to be further enhanced.

In the average unit formula above, $X^5$ is a hydrogen atom or an alkyl group. Examples of the alkyl group include a methyl group, an ethyl group, a propyl group, a butyl group, a pentyl group, and a hexyl group. A methyl group is particularly preferable.

In the average unit formula above, c1 is 0 or a positive number, c2 is 0 or a positive number, c3 is 0 or a positive number, c4 is 0 or a positive number, c5 is 0 or a positive number, and (c1+c2+c3) is a positive number.

A preferable example of the component (D) is a linear polyorganosiloxane having at least two hydrosilyl groups at both terminals of the molecule.

In the linear polyorganosiloxane, the proportion of the hydrogen atom (hydrogen atom bonded to the silicon atom) relative to the total amount (100 mol %) of the groups bonded to the silicon atom is preferably from 2 to 70 mol %. Furthermore, the proportion of the alkyl group (especially, methyl group) relative to the total amount (100 mol %) of the groups bonded to the silicon atom is preferably from 20 to 95 mol %. Furthermore, the proportion of the aryl group (especially, phenyl group) relative to the total amount (100 mol %) of the groups bonded to the silicon atom is preferably from 1 to 80 mol %. In particular, use of a linear polyorganosiloxane having the proportion of the alkyl group (especially, methyl group) relative to the total amount (100 mol %) of the groups bonded to the silicon atom of not less than 20 mol % (e.g., from 40 to 95 mol %) as the linear polyorganosiloxane described above tends to further enhance the heat resistance of the cured product.

Note that the proportions (mol %) of the alkyl group, the aryl group, and the hydrogen atom relative to the total amount (100 mol %) of the groups bonded to the silicon atom are determined by, for example, $^1$H-NMR spectrum analysis or the like.

The linear polyorganosiloxane is, for example, preferably a polyorganosiloxane represented by Formula (II-1) below (hereinafter, also referred to as "component (D1)").

[Chem. 5]

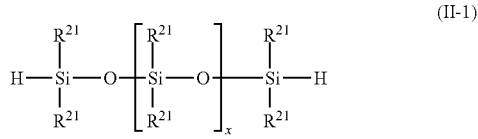

(II-1)

where, $R^{21}$ is, the same or different, an alkyl group having from 1 to 10 carbons or an aryl group having from 6 to 14 carbons. x represents an integer of 0 to 1000.

Examples and preferable aspects of the alkyl group having from 1 to 10 carbons and the aryl group having from 6 to 14 carbons represented by $R^{21}$ are respectively the same as those of $R^2$ in Average Composition Formula (II) above.

x represents an integer of 0 to 1000, and preferably an integer of 1 to 100.

An aspect in which the component (D) contains not less than 1 wt. % and not greater than 99 wt. % of the component (D1) is preferable, and an aspect in which the component (D) contains not less than 10 wt. % and not greater than 50 wt. % is more preferable.

The component (D1) may be a liquid or solid at 25° C. and is preferably a liquid. The viscosity of the component (D1) at 25° C. is not particularly limited but is preferably not greater than 10000 mPa·s, and more preferably not greater than 5000 mPa·s. In a case where the viscosity is not greater than 10000 mPa·s, the compatibility of the cured product tends to be further enhanced. On the other hand, the lower limit of the viscosity is not particularly limited but is preferably 1 mPa·s, and more preferably 5 mPa·s. In a case where the viscosity is not less than 1 mPa·s, preparation and handling of the curable resin composition tends to be easier. Note that the viscosity at 25° C. is measured under the same conditions as the viscosity of the component (A) described above.

Another example of the component (D) is a branched polyorganosiloxane having at least two M units represented by $R_2HSiO_{1/2}$ and a siloxane unit (T unit) represented by $RSiO_{3/2}$ in a molecule. Similar to $R^2$ of Average Composition Formula (II) above, R is an alkyl group having from 1 to 10 carbons or an aryl group having from 6 to 14 carbons.

In the branched polyorganosiloxane, the proportion of the alkyl group (especially, methyl group) relative to the total amount (100 mol %) of the groups bonded to the silicon atom is preferably from 20 to 95 mol %. Furthermore, the proportion of the aryl group (especially, phenyl group) relative to the total amount (100 mol %) of the groups bonded to the silicon atom is preferably from 1 to 80 mol %. Furthermore, use of a branched polyorganosiloxane having the proportion of the alkyl group (especially, methyl group) relative to the total amount (100 mol %) of the groups bonded to the silicon atom of not less than 20 mol % (e.g., from 50 to 90 mol %) tends to further enhance heat resistance of the cured product.

The branched polyorganosiloxane can be represented by, for example, the average unit formula above in which c1 is a positive number. In this case, preferably, c2/c1 is a number from 0 to 10, c3/c1 is a number from 0 to 0.5, c4/(c1+c2+c3+c4) is a number from 0 to 0.3, and c5/(c1+c2+c3+c4) is a number from 0 to 0.4. Furthermore, as the molecular weight of the branched polyorganosiloxane, the weight-average molecular weight, measured by GPC based on calibration with polystyrene standard, is preferably from 100 to 50000, and more preferably from 150 to 40000.

The weight-average molecular weight (Mw) of the component (D) is not particularly limited but is preferably not less than 100 and not greater than 50000, more preferably not less than 150 and not greater than 40000, even more preferably not less than 175 and not greater than 20000, and particularly preferably not less than 200 and not greater than 10000. In a case where the weight-average molecular weight is not less than 100, the toughness of the cured product is further enhanced, and tackiness tends to be reduced. On the other hand, in a case where the weight-average molecular weight is not greater than 50000, compatibility with another component tends to be enhanced. Note that the weight-average molecular weight is calculated by the molecular weight determined by gel permeation chromatography (GPC), measured based on calibration with polystyrene standard.

The molecular weight distribution (Mw/Mn) of the component (D) is not particularly limited but is preferably not less than 1 and not greater than 4, more preferably from 1 to 3.5, even more preferably from 1 to 3, and particularly preferably from 1 to 2.5. In a case where the molecular weight distribution is not greater than 4, compatibility of the cured product tends to be further enhanced. Note that the molecular weight distribution can be calculated by the weight-average molecular weight (Mw) and the number-average molecular weight (Mn) calculated by the molecular weight determined by gel permeation chromatography (GPC), measured based on calibration with polystyrene standard.

The component (D) may be a liquid or solid at 25° C. and is preferably a liquid. The viscosity of the component (D) at 25° C. is not particularly limited but is preferably not less than 1 mPa·s, and more preferably not less than 5 mPa·s. In a case where the viscosity is not less than 1 mPa·s, preparation and handling of the curable resin composition easier tends to be further enhanced. On the other hand, the upper limit of the viscosity is not particularly limited but is preferably 10000 mPa·s, and more preferably 5000 mPa·s. In a case where the viscosity is not greater than 10000 mPa·s, compatibility tends to be better. Note that the viscosity at 25° C. is measured under the same conditions as the viscosity of the component (A) described above.

The component (D) can be produced by a publicly known or common method of producing a polysiloxane and is not particularly limited. Specifically, the component (D) can be produced by a method, in which hydrolysis and condensation are carried out, wherein one type or two or more types of hydrolyzable silane compounds are used as in the production method of the component (A) described above, except that hydrolyzable silane compounds in which the alkenyl groups having from 2 to 8 carbons of $R^{12}$, $R^{13}$ and $R^{14}$ are substituted with hydrogen atoms in the hydrolyzable silane compounds represented by Formulas (b), (c), and (d) used in the method of producing the component (A) described above, are used as raw materials.

Furthermore, in a case where the component (D) contains an M unit having an SiH at a terminal, the component (D) can be produced by a method, in which hydrolysis and condensation are carried out, wherein one type or two or more types of hydrolyzable silane compounds are used as in the production method of the component (A) described above, except that a compound represented by Formula (e) below, which is the hydrolyzable silane compound for forming the M unit, is additionally used as a raw material.

[Chem. 6]

$$R^{22}{}_2HSi(X^6) \qquad (e)$$

The compound represented by Formula (e) above is a compound forming the M units having a terminal SiH group in the component (D) of an embodiment of the present invention. $R^{22}$ in Formula (e) is an alkyl group having from 1 to 10 carbons or an aryl group having from 6 to 14 carbons. Examples and preferable aspects of the alkyl group having from 1 to 10 carbons and the aryl group having from 6 to 14 carbons represented by $R^{22}$ are respectively the same as those of $R^2$ in Average Composition Formula (II) above. Note that the two $R^{22}$ moieties may be the same or different.

$X^6$ in Formula (e) above represents an alkoxy group, a halogen atom, or a group represented by —OSiHR$^{22}{}_2$. Examples of the alkoxy group of $X^6$ include alkoxy groups having from 1 to 10 carbons, such as a methoxy group, an ethoxy group, a propoxy group, an isopropoxy group, a butoxy group, and an isobutoxy group. Furthermore, examples of the halogen atom of $X^6$ include a fluorine atom, a chlorine atom, a bromine atom, and an iodine atom. Among these, as $X^6$, an alkoxy group or a group represented by —OSiHR$^{22}$2 is preferable, and a methoxy group, an ethoxy group, and a group represented by —OSiHR$^{22}$2 are more preferable. Furthermore, in a case where $X^6$ is a group represented by —OSiHR$^{22}$2, the two $R^{22}$ moieties may be the same or different.

Preferable specific examples of the component (D) of an embodiment of the present invention include 1,1,5,5-tetramethyl-3,3-diphenyltrisiloxane, 3-phenyl-1,1,3,5,5-pentamethyltrisiloxane, 1,1,3,3,5,5-hexamethyltrisiloxane, 1,1,3,3,5,5,7,7-octamethyltetrasiloxane, and 1,1,3,3,5,5,7,7,9,9-decamethylpentasiloxane. As products containing the component (D), for example trade names "HMS-031", "HPM-502", "HMS-991", "DMS-H03", "DMS-H11", DMS-H21", 3-phenyl-1,1,3,5,5-pentamethyltrisiloxane (all of these available from Gelest Inc.), 1,1,5,5-tetramethyl-3,3-diphenyltrisiloxane (available from NANJING SiSiB Silicones Co., Ltd.), and the like are available.

The component (D) of an embodiment of the present invention has the composition described above, and thus the cured product having both good heat resistance and light resistance and further having low tackiness can be formed by curing the curable resin composition containing the component (D) as an essential component.

Note that the component (D) in the curable resin composition of an embodiment of the present invention may contain one type of polyorganosiloxane represented by Average Composition Formula (II) alone or may contain two or more types of different polyorganosiloxanes represented by Average Composition Formula (II). The component (D) preferably contains at least one type of polyorganosiloxane, in which at least one type of the $R^2$ moieties is an aryl group having from 6 to 14 carbons, represented by Average Composition Formula (II).

One type of the component (D) can be used alone, or two or more types of the components (D) can be used in combination.

In a case where two or more types of the components (D) are used in combination, X', Y', Z', X'/Y', m, n, m+n, c1 to c5, x, and the like described above may be average values corresponding to the blended proportion of each of the components (D).

The content (blended amount) of the component (D) in the curable resin composition of an embodiment of the present invention is an amount that makes the amount of the SiH group (hydrosilyl group) present in the component (D) to be from 0.5 to 5 mol, preferably from 0.7 to 2 mol, and more preferably from 0.8 to 1.2 mol, per 1 mol of the alkenyl group present in the component (A), the component (B), and the component (C), as described above. In a case where the blended amount of the component (D) is adjusted so that the ratio of the SiH group to the alkenyl group is in the range described above, even when hardness of the cured product of the curable resin composition of an embodiment of the present invention is increased, relatively high mechanical characteristics, such as tensile elongation and tensile stress, are maintained, and a cured product having a high toughness tends to be formed.

The content (blended amount) of the component (D) in the curable resin composition of an embodiment of the present invention is not particularly limited as long as the ratio of the SiH group present in the component (D) to 1 mol of the alkenyl group present in the component (A), the component (B), and the component (C) is within the range described above. However, the content of the component (D) is preferably from 5 to 50 wt. %, more preferably from 7 to 30 wt. %, and even more preferably from 10 to 25 wt. %, relative to the total amount (100 wt. %) of the curable resin composition. In a case where the content of the component (D) is within the range described above, the ratio of the SiH group to the alkenyl group is easily adjusted to the range described above, and even when hardness of the cured product of the curable resin composition of an embodiment of the present invention is increased, relatively high mechanical characteristics, such as tensile elongation and tensile stress, are maintained, and a cured product having a high toughness tends to be formed. In a case where the content of the component (D) is not less than 5 wt. %, the heat resistance and light resistance of the cured product tend to be further enhanced.

The content (blended amount) of the component (D) relative to the component (A) in the curable resin composition of an embodiment of the present invention is not particularly limited but is preferably from 1 to 200 parts by weight, more preferably from 5 to 100 parts by weight, and even more preferably from 10 to 50 parts by weight, per 100 parts by weight of the component (A). In a case where the content of the component (D) is within the range described above, the ratio of the SiH group to the alkenyl group is easily adjusted to the range described above, and even when the hardness of the cured product of the curable resin composition of an embodiment of the present invention is increased, relatively high mechanical characteristics, such as tensile elongation and tensile stress, are maintained, and a cured product having a high toughness tends to be formed. In a case where the content of the component (D) is not less than 1 part by weight, the heat resistance and light resistance of the cured product tend to be further enhanced.

The content (blended amount) of the component (D) relative to the total amount of the component (A), the component (B), and the component (C) in the curable resin composition of an embodiment of the present invention is not particularly limited as long as the ratio of the SiH group present in the component (D) to 1 mol of the alkenyl group present in the component (A), the component (B), and the component (C) is within the range described above. However, the content of the component (D) is preferably from 1 to 200 parts by weight, more preferably from 5 to 100 parts by weight, and even more preferably from 10 to 50 parts by weight, per 100 parts by weight total of the component (A), the component (B), and the component (C). In a case where the content of the component (D) is within the range described above, the ratio of the SiH group to the alkenyl group is easily adjusted to the range described above, and even when hardness of the cured product of the curable resin composition of an embodiment of the present invention is increased, relatively high mechanical characteristics, such as tensile elongation and tensile stress, are maintained, and a cured product having a high toughness tends to be formed. In a case where the content of the component (D) is not less than 1 part by weight, heat resistance and light resistance of the cured product tend to be further enhanced.

As the total content (total blended amount) of the component (B), the component (C), and the component (D) relative to the component (A) in the curable resin composition of an embodiment of the present invention, as described above, the total content of the component (B), the component (C), and the component (D) is not greater than 80 parts by weight, preferably from 10 to 75 parts by weight, and more preferably from 20 to 70 parts by weight, per 100 parts by weight of the component (A). In a case where the total content of the component (B), the component (C), and the component (D) relative to the component (A) is not greater than 80 parts by weight, the proportion of the component (A) becomes relatively high, and a cured product having a high hardness tends to be obtained.

Component (E)

The component (E), which is an essential component of the curable resin composition of an embodiment of the present invention, is a hydrosilylation catalyst, as described above. In a case where the curable resin composition of an embodiment of the present invention contains the hydrosilylation catalyst, heating the curable resin composition facilitates the efficient hydrosilylation reaction between the aliphatic carbon-carbon double bond (especially, alkenyl group) and the hydrosilyl group in the curable resin composition.

Examples of the hydrosilylation catalyst include known hydrosilylation catalysts, such as platinum-based catalysts, rhodium-based catalysts, and palladium-based catalysts. Specific examples of the hydrosilylation catalyst include platinum-based catalysts, such as platinum fine powder, platinum black, platinum-carrying silica fine powder, platinum-carrying activated carbon, chloroplatinic acid, and complexes of chloroplatinic acid with an alcohol, an aldehyde, a ketone, or the like, platinum-olefin complexes, platinum-carbonyl complexes (e.g., platinum-carbonylvinylmethyl complex), platinum-vinylmethylsiloxane complexes (e.g., platinum-divinyltetramethyldisiloxane complex and platinum-cyclovinylmethylsiloxane complex), platinum-phosphine complexes, and platinum-phosphite complexes; as well as a palladium-based catalyst or rhodium-based catalyst which contains a palladium atom or a rhodium atom in place of the platinum atom in the platinum-based catalysts described above. Among these, as the hydrosilylation catalyst, platinum-vinylmethylsiloxane complexes, platinum-carbonylvinylmethyl complexes, and complexes of chloroplatinic acid with an alcohol or an aldehyde are preferable due to its good reaction rate.

Note that, in the curable resin composition of an embodiment of the present invention, one type of the hydrosilylation catalyst can be used alone, or two or more types of the hydrosilylation catalysts can be used in combination.

The content (blended amount) of the hydrosilylation catalyst in the curable resin composition of an embodiment of the present invention is preferably from $1 \times 10^{-8}$ to $1 \times 10^{-2}$ mol, and more preferably from $1 \times 10^{-6}$ to $1 \times 10^{-3}$ mol, per 1 mol total of the aliphatic carbon-carbon double bonds (especially, alkenyl group) included in the curable resin composition. In a case where the content is not less than $1 \times 10^{-8}$ mol, a cured product tends to be formed more efficiently. On the other hand, in a case where the content is not greater than $1 \times 10^{-2}$ mol, a cured product with better hue (with less coloring) tends to be obtained.

Furthermore, the content (blended amount) of the hydrosilylation catalyst in the curable resin composition of an embodiment of the present invention is preferably chosen to make the amount of platinum, palladium, or rhodium in the hydrosilylation catalyst, in terms of weight, to be in a range of 0.01 to 1000 ppm, and more preferably in a range of 0.1 to 500 ppm. When the content of the hydrosilylation catalyst is in the range described above, a cured product can be formed more efficiently, and a cured product having superior may be obtained readily.

Furthermore, the content (blended amount) of the hydrosilylation catalyst in the curable resin composition of an embodiment of the present invention is preferably chosen to make the amount of platinum, palladium, or rhodium in the hydrosilylation catalyst, in terms of weight, to be in a range of 0.01 to 1000 ppm, and more preferably in a range of 0.1 to 500 ppm. When the content of the hydrosilylation catalyst is in the range described above, a cured product can be formed more efficiently, and a cured product having superior may be obtained readily.

Component (F)

The curable resin composition of an embodiment of the present invention may contain silsesquioxane having at least one alkenyl group and at least one aryl group in a molecule (hereinafter, also referred to as "component (F)"). In a case where the curable resin composition of an embodiment of the present invention to contain the component (F), flexibility and thermal impact resistance tend to be significantly enhanced. As the component (F), silsesquioxane having at least one (preferably two or more of) alkenyl groups and at least one (preferably from 2 to 50 of) aryl groups in a molecule and having an —Si—O—Si— structure of a ladder structure can be used, and the component (F) is not particularly limited.

Examples the alkenyl group and the aryl group included in a molecule of the component (F) include the groups similar to those exemplified above as the alkenyl group and the aryl group included in a molecule of the component (A). The alkenyl group and the aryl group included in the component (F) are not particularly limited but are preferably groups bonded to the silicon atom.

The groups bonded to the silicon atom other than the alkenyl group and the aryl group included in a molecule of the component (F) is not particularly limited, and examples thereof include a hydrogen atom, and organic groups. Examples of the organic groups include substituted or unsubstituted monovalent hydrocarbon groups described above. Note that, in the present specification, "group bonded to the silicon atom" refers typically to a group that does not include a silicon atom. Among these, alkyl groups (especially, methyl group) are preferable.

Furthermore, the component (F) may contain a hydroxy group and/or an alkoxy group as the group bonded to the silicon atom.

The proportion of the alkenyl groups relative to the total amount (100 wt. %) of the component (F) is not particularly limited as long as the amount is controlled such that at least one alkenyl group is present in a molecule but, for example, is from 1.0 to 20.0 wt. %, and preferably from 1.5 to 15.0 wt. %. The proportion of the aryl group is not particularly limited as long as the amount is controlled such that at least one aryl group is present in a molecule but, for example, is from 1.0 to 50.0 wt. %, and preferably from 5.0 to 25.0 wt. %. When the aryl group is included in the range described above, a cured product having good various physical properties, such as heat resistance, good crack resistance, and good gas barrier property tends to be obtained. The proportion of the alkyl group is not particularly limited but is, for example, from 10.0 to 50.0 wt. %, and preferably from 20.0 to 40.0 wt. %. Note that the proportions of the alkenyl group, the aryl group, and the alkyl group in the component (F) can be determined by, for example, NMR spectrum (e.g., $^1$H-NMR spectrum) analysis or the like.

The silsesquioxane is a polysiloxane having a T unit (unit formed from a trivalent group in which a silicon atom is bonded to three oxygen atoms) as a basic structural unit and the empirical formula (basic structural formula) thereof is represented by $RSiO_{1.5}$. Examples of the structures of the Si—O—Si skeleton of the silsesquioxane include a random structure, a cage structure, and a ladder structure.

The weight-average molecular weight (Mw) of the component (F) is not particularly limited but is preferably from 100 to 800000, more preferably from 200 to 100000, even more preferably from 300 to 10000, particularly preferably from 500 to 8000, and most preferably from 1700 to 7000. When the Mw is less than 100, the heat resistance of the cured product may be reduced. On the other hand, when the Mw is greater than 800000, compatibility with another component may decrease. Note that the Mw can be calculated by the molecular weight determined by gel permeation chromatography, measured based on calibration with polystyrene standard.

The number-average molecular weight (Mn) of the component (F) is not particularly limited but is preferably from 80 to 800000, more preferably from 150 to 100000, even more preferably from 250 to 10000, particularly preferably from 400 to 8000, and most preferably from 1500 to 7000. When the Mn is less than 80, heat resistance of the cured product may be reduced. On the other hand, when the Mn is greater than 800000, compatibility with another component may be reduced. Note that the Mn can be calculated by the molecular weight determined by gel permeation chromatography, measured based on calibration with polystyrene standard.

The molecular weight dispersity (Mw/Mn) determined by gel permeation chromatography, measured based on calibration with polystyrene standard, of the component (F) is not particularly limited but is preferably from 1.00 to 1.40, more preferably not greater than 1.35 (e.g., from 1.05 to 1.35), and even more preferably not greater than 1.30 (e.g., 1.10 to 1.30). When the molecular weight dispersity is greater than 1.40, for example, low molecular weight siloxane tends to be increased and bonding characteristics or the like of the cured product tends to be deteriorated. On the other hand, for example, in a case where the molecular weight dispersity is not less than 1.05, the component (F) tends to be liquid at room temperature, and handleability tends to be enhanced.

Note that the number-average molecular weight and the molecular weight dispersity of the component (F) can be measured by the following instruments and conditions.

Alliance HPLC system 2695 (available from Waters)
Refractive Index Detector 2414 (available from Waters)
Column: Tskgel GMHHR-M×2 (available from Tosoh Corporation)
Guard column: Tskgel guard column HHRL (available from Tosoh Corporation)
Column oven: Column Heater U-620 (available from Sugai)
Solvent: THF
Measurement temperature: 40° C.
Molecular weight: calibrated with a polystyrene standard The component (F) is preferably a liquid at ambient temperature (approximately 25° C.). More specifically, the viscosity at 23° C. is preferably from 100 to 100000 mPa·s, more preferably from 500 to 10000 mPa·s, and even more preferably from 1000 to 8000 mPa·s. When the viscosity is less than 100 mPa·s, the heat resistance of the cured product may be reduced. On the other hand, when the viscosity is greater than 100000 mPa·s, preparation and handling of the curable resin composition may be difficult. Note that the viscosity at 23° C. can be measured by using a rheometer (product name: "Physica UDS-200", available from Anton Paar) and a cone-plate (cone diameter: 16 mm; taper angle: 0°) in a condition at a temperature of 23° C. and a rotation rate of 8 rpm.

Note that, in the curable resin composition of an embodiment of the present invention, one type of the component (F) can be used alone, or two or more types of the components (F) can be used in combination.

The curable resin composition of an embodiment of the present invention preferably contains the component (F) from the perspectives of strength of the cured product (resin strength), flexibility, and thermal impact resistance.

When the curable resin composition of an embodiment of the present invention contains the component (F), the content (blended amount) of the component (F) in the curable resin composition of an embodiment of the present invention is not particularly limited but is preferably from 0.05 to 50 parts by weight, more preferably from 0.1 to 45 parts by weight, and even more preferably from 0.2 to 40 parts by weight, per 100 parts by weight total of the component (A) to the component (D). Furthermore, the content (blended amount) of the component (F) is not particularly limited but is preferably from 0.01 to 20 wt. %, more preferably from 0.05 to 15 wt. %, and even more preferably from 0.1 to 10 wt. %, relative to the amount (100 wt. %) of the curable resin composition. In a case where the content of the component (F) is controlled within the range described above, flexibility and thermal impact resistance of the cured product tends to be significantly enhanced.

Silane Coupling Agent (G)

The curable resin composition of an embodiment of the present invention may further contain a silane coupling agent (G). When the silane coupling agent (G) is included, in particular, bonding characteristics of the cured product to an adherend tend to be further enhanced.

As the silane coupling agent (G), publicly known or common silane coupling agents can be used, and examples thereof include epoxy group-containing silane coupling agents, such as 3-glycidoxypropyltrimethoxysilane, 2-(3,4-epoxycyclohexyl)ethyltrimethoxysilane, 3-glycidoxypropylmethyldiethoxysilane, and 3-glycidoxypropyltriethoxysilane; amino group-containing silane coupling agents, such as N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxy silyl-N-(1,3-dimethyl-butylidene)propylamine, N-phenyl-3-aminopropyltrimethoxysilane, N-(vinylbenzyl)-2-aminoethyl-3-aminopropyltrimethoxysilane hydrochloride, and N-(β-aminoethyl)-γ-aminopropylmethyldiethoxysilane; and tetramethoxysilane, tetraethoxysilane, methyltriethoxysilane, dimethyldiethoxysilane, methyltriethoxy silane, vinyltriethoxysilane, vinyltrimethoxysilane, vinyltris(methoxyethoxysilane), phenyltrimethoxysilane, diphenyldimethoxysilane, vinyltriacetoxysilane, γ-(meth)acryloyloxypropyltriethoxysilane, γ-(meth)acryloyloxypropyltrimethoxysilane, γ-(meth)acryloyloxypropylmethyldimethoxysilane, γ-(meth)acryloyloxypropylmethyldiethoxysilane, mercaptopropylenetrimethoxysilane, mercaptopropylenetriethoxysilane, alkoxy oligomers (e.g., trade names "X-41-1053", "X-41-1059A", "KR-516", "X-41-1085", "X-41-1818", "X-41-1810", "X-40-2651", "X-40-2665A", "KR-513", "KC-89S", "KR-500", "X-40-9225", "X-40-9246", "X-40-9250", all of these are available from Shin-Etsu Chemical Co., Ltd.), and the like. Among these, an epoxy group-containing silane coupling agent (especially, 3-glycidoxypropyltrimethoxysilane) can be preferably used.

In the curable resin composition of an embodiment of the present invention, one type of the silane coupling agent (G) can be used alone, or two or more types of the silane coupling agents (G) can be used in combination. Furthermore, a commercially available product can be used as the silane coupling agent (G).

When the curable resin composition of an embodiment of the present invention contains the silane coupling agent (G), the content (blended amount) of the silane coupling agent (G) in the curable resin composition of an embodiment of the present invention is preferably from 0.01 to 15 wt. %, more preferably from 0.1 to 10 wt. %, and even more preferably from 0.5 to 5 wt. %, relative to the amount (100 wt. %) of the curable resin composition. In a case where the content of the silane coupling agent (G) is not less than 0.01 wt. %, the bonding characteristics of the cured product to an adherend tend to be further enhanced. On the other hand, in a case where the content of the silane coupling agent (G) is not greater than 15 wt. %, curing reaction proceeds sufficiently, and toughness and heat resistance of the cured product tend to be further enhanced.

Component (H)

The curable resin composition of an embodiment of the present invention may contain a polyorganosiloxysilalkylene having a group containing at least one aliphatic carbon-carbon unsaturated bond in a molecule (however, exclude the component (C) having a silalkylene unit; hereinafter, also simply referred to as "component (H)"). That is, the component (H) is a polysiloxane having a group containing an aliphatic carbon-carbon unsaturated bond, such as an alkenyl group, and is a component that undergoes a hydrosilylation reaction with a component having a hydrosilyl group (e.g., component (D) described above and the like).

The component (H) is a polyorganosiloxane having a group containing at least one aliphatic carbon-carbon unsaturated bond in a molecule, and contains a bond represented by —Si—$R^4$—Si— ($R^4$ represents a divalent hydrocarbon group; hereinafter, referred to as "silalkylene bond") in addition to the siloxane bond (—Si—O—Si—) as the main chain. That is, the component (H) does not contain a polyorganosiloxane having no silalkylene bond, like the component (A) described above. When the curable resin composition of an embodiment of the present invention contains the component (H) described above, surface adhesiveness of the cured product is reduced, and a cured product that is less likely to be yellowed can be formed.

Examples of the divalent hydrocarbon group ($R^4$) in the silalkylene bond included in a molecule of the component (H) include substances that are similar to those exemplified above as the divalent hydrocarbon group represented by $R^4$ in the component (C). Among these, as $R^4$, a linear or branched alkylene group is preferable, and an ethylene group is particularly preferable.

The component (H) is less likely to generate a low molecular weight ring in the production process, and less likely to generate a silanol group (—SiOH) due to decomposition caused by heating or the like, compared to the case of the component (A). Therefore, when the component (H) is used, surface adhesiveness of the cured product of the curable resin composition is reduced, and yellowing is less likely to occur.

Examples of the component (H) include components having linear, partially branched linear, branched, or mesh-like molecular structures. Note that one type of the component (H) can be used alone, or two or more types of the components (H) can be used in combination. Specifically, two or more types of components (H) having different molecular structures can be used together and, for example, a linear component (H) and a branched component (H) can be used together.

Examples of the group containing an aliphatic carbon-carbon unsaturated bond included in a molecule of the component (H) include $C_{2-20}$ alkenyl groups (preferably $C_{2-10}$ alkenyl groups, and more preferably $C_{2-8}$ alkenyl groups), such as a vinyl group, an allyl group, a methallyl group, a 1-propenyl group, an isopropenyl group, a 1-butenyl group, a 2-butenyl group, a 3-butenyl group, a 1-pentenyl group, a 2-pentenyl group, a 3-pentenyl group, a 4-pentenyl group, and a 5-hexenyl group; $C_{3-12}$ cycloalkenyl groups, such as a cyclohexenyl group; $C_{4-15}$ crosslinked unsaturated cyclic hydrocarbon groups, such as a bicycloheptenyl group; $C_{2-4}$ alkenyl-substituted aryl groups, such as a styryl group; a cinnamyl group; and the like. Among these, alkenyl groups are preferable, $C_{2-8}$ alkenyl groups are more preferable, and a vinyl group is even more preferable. Furthermore, the component (H) may be a component having only one type of the group containing an aliphatic carbon-carbon unsaturated bond or may be a component having two or more types of the groups containing an aliphatic carbon-carbon unsaturated bond. The group containing an aliphatic carbon-carbon unsaturated bond included in the component (H) is preferably a group bonded to a silicon atom.

Examples of the group bonded to the silicon atom other than the group containing an aliphatic carbon-carbon unsaturated bond included in the component (H) include a hydrogen atom, monovalent hydrocarbon groups (other than alkenyl groups), and monovalent heterocyclic groups.

Examples of the monovalent hydrocarbon group and the monovalent heterocyclic group include groups that are similar to the monovalent hydrocarbon group (other than alkenyl groups) and the monovalent heterocyclic group exemplified above as the organic group bonded to the silicon atom included in the component (B).

Furthermore, the component (H) may contain a hydroxy group and/or an alkoxy group as the group bonded to the silicon atom.

The properties of the component (H) may be a liquid or solid at 25° C., and preferably is a liquid.

As the component (H), a polyorganosiloxysilalkylene represented by the average unit formula below is preferable.

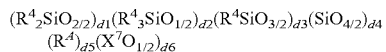
$(R^4{}_2SiO_{2/2})_{d1}(R^4{}_3SiO_{1/2})_{d2}(R^4SiO_{3/2})_{d3}(SiO_{4/2})_{d4}$
$(R^4)_{d5}(X^7O_{1/2})_{d6}$ In the average unit formula, $R^4$ is, the same or different, a hydrogen atom, a monovalent hydrocarbon group, or a monovalent heterocyclic group, and examples thereof include the specific examples of the monovalent hydrocarbon group or the monovalent heterocyclic group described above. However, some of the $R^4$ moieties are groups containing an aliphatic carbon-carbon unsaturated bond (preferably alkenyl groups having from 2 to 8 carbons, and particularly a vinyl group) and the proportion thereof is controlled within the range, in which at least one group containing an aliphatic carbon-carbon unsaturated bond is present in a molecule. For example, the proportion of the group containing the aliphatic carbon-carbon unsaturated bond relative to the total amount (100 mol %) of $R^4$ is preferably from 0.1 to 40 mol %. In a case where the proportion of the group containing an aliphatic carbon-carbon unsaturated bond is within the range described above, curability of the curable resin composition tends to be further enhanced. Furthermore, as the $R^4$ moieties other than the group containing an aliphatic carbon-carbon unsaturated bond, alkyl groups having from 1 to 10 carbons (especially, methyl groups) and aryl groups having from 4 to 14 carbons (especially, phenyl groups) are preferable.

In the average unit formula, $R^A$ is a divalent hydrocarbon group as described above. In particular, an ethylene group is preferable.

In the average unit formula above, $X^7$ is a hydrogen atom or an alkyl group. Examples of the alkyl group include a methyl group, an ethyl group, a propyl group, a butyl group, a pentyl group, and a hexyl group. A methyl group is particularly preferable.

In the average unit formula above, d1 is a positive number, d2 is a positive number, d3 is 0 or a positive number, d4 is 0 or a positive number, d5 is a positive number, and d6 is 0 or a positive number. Among these, d1 is preferably from 1 to 200, d2 is preferably from 1 to 200, d3 is preferably from 1 to 10, d4 is preferably from 0 to 5, and d5 is preferably from 1 to 100. In particular, when (d3+d4) is a positive number, the component (H) contains a branch (branched main chain), and the mechanical strength of the cured product tends to be further enhanced.

Specific examples of the component (H) include polyorganosiloxysilalkylenes having structures represented by Formula (IV-1) below.

[Chem. 7]

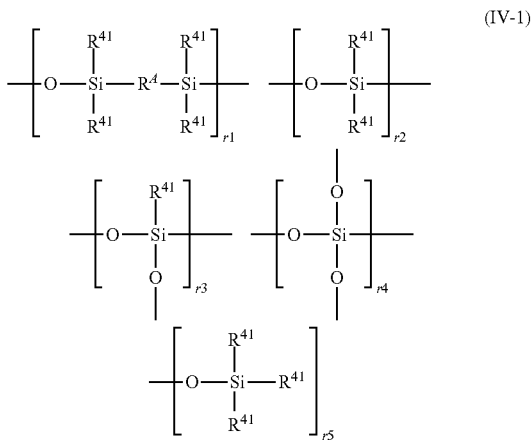

(IV-1)

In Formula (IV-1) above, $R^{41}$ is, the same or different, a hydrogen atom, a monovalent hydrocarbon group, or a monovalent heterocyclic group. Examples of $R^{41}$ include the specific examples of the monovalent hydrocarbon group and the monovalent heterocyclic group described above. However, at least one of the $R^{41}$ moieties is a group containing an aliphatic carbon-carbon unsaturated bond (preferably an alkenyl group having from 2 to 8 carbons, and particularly a vinyl group). Furthermore, as the $R^{41}$ moieties other than the group containing an aliphatic carbon-carbon unsaturated bond, alkyl groups having from 1 to 10 carbons (especially, methyl groups) and aryl groups having from 6 to 14 carbons (especially, phenyl groups) are preferable.

In Formula (IV-1) above, in a manner same as the above description, $R^A$ represents a divalent hydrocarbon group. In particular, $R^A$ is preferably a $C_{2-4}$ alkylene group (especially, ethylene group). Note that, when a plurality of the $R^A$ moieties are present, these may be the same or different.

In Formula (IV-1) above, r1 represents an integer of not less than 1 (e.g., from 1 to 100). Note that, when r1 is an integer of not less than 2, the structures within the parentheses to which r1 is assigned may be the same or different.

In Formula (IV-1) above, r2 represents 0 or an integer of not less than 1 (e.g., from 0 to 400). Note that, when r2 is an integer of not less than 2, the structures within the parentheses to which r2 is assigned may be the same or different.

In Formula (IV-1) above, r3 represents 0 or an integer of not less than 1 (e.g., from 0 to 50). Note that, when r3 is an integer of not less than 2, the structures within the parentheses to which r3 is assigned may be the same or different.

In Formula (IV-1) above, r4 represents 0 or an integer of not less than 1 (e.g., from 0 to 50). Note that, when r4 is an integer of not less than 2, the structures within the parentheses to which r4 is assigned may be the same or different.

In Formula (IV-1) above, r5 represents 0 or an integer of not less than 1 (e.g., from 0 to 50). Note that, when r5 is an integer of not less than 2, the structures within the parentheses to which r5 is assigned may be the same or different.

Furthermore, form of addition of each of the structural units in Formula (IV-1) above may be random type or block type. Furthermore, the order of arrangement of each of the structural units is not particularly limited.

The component (H) is preferably a branched polyorganosiloxysilalkylene in which, in Formula (IV-1) above, r1 represents an integer of not less than 1 (e.g., from 1 to 100), r2 represents an integer of not less than 1 (e.g., from 1 to 400), r3 represents an integer of not less than 1 (e.g., from 1 to 50), r4 represents 0, and r5 represents an integer of not less than 1 (e.g., from 1 to 50).

Furthermore, as another preferable aspect of the component (H), the component (H) is preferably a linear polyorganosiloxysilalkylene in which r1 represents an integer of not less than 1 (e.g., from 1 to 100), r2 represents an integer of not less than 1 (e.g., from 1 to 400), r3 and r4 each represent 0, and r5 represents an integer of not less than 1 (e.g., from 1 to 50).

Examples of the terminal structure of the polyorganosiloxysilalkylene having the structure represented by Formula (IV-1) include a silanol group, alkoxysilyl groups, and trialkylsilyl groups (e.g., the structure within the parenthesis to which r5 is assigned, trimethylsilyl group). Various groups, such as alkenyl groups and hydrosilyl groups, may be introduced to the terminals of the polyorganosiloxysilalkylene.

The weight-average molecular weight (Mw) of the component (H) is not particularly limited but is preferably not less than 500 and not greater than 50000, more preferably not less than 700 and not greater than 20000, and even more preferably not less than 1000 and not greater than 10000. When the weight-average molecular weight is not less than 500, the toughness of the cured product tends to be further enhanced. On the other hand, when the weight-average molecular weight is not greater than 50000, compatibility with another component tends to be enhanced. Note that the weight-average molecular weight is calculated by the molecular weight determined by gel permeation chromatography (GPC), measured based on calibration with polystyrene standard.

The molecular weight distribution (Mw/Mn) of the component (H) is not particularly limited but is preferably not less than 1 and not greater than 4, and more preferably from 1 to 3.5. When the molecular weight distribution is not greater than 4, compatibility of the cured product tends to be further enhanced. Note that the molecular weight distribution can be calculated by the weight-average molecular weight (Mw) and the number-average molecular weight (Mn) calculated by the molecular weight determined by gel permeation chromatography (GPC), measured based on calibration with polystyrene standard.

The viscosity of the component (H) at 25° C. is not particularly limited but is preferably not less than 100 mPa·s, and more preferably not less than 500 mPa·s. When the viscosity is not less than 100 mPa·s, preparation and handling of the curable resin composition tends to be easier. On the other hand, the upper limit of the viscosity is not particularly limited but is preferably 50000 mPa·s, and more preferably 10000 mPa·s. When the viscosity is not greater than 50000 mPa·s, compatibility tends to be enhanced. Note that the viscosity at 25° C. is measured in the same conditions as the viscosity of the component (A) described above.

The component (H) can be produced by a publicly known or common method, and the component (H) can be produced by hydrosilylation reaction of a polyorganosiloxane containing a group having an aliphatic carbon-carbon unsaturated bond and a polyorganosiloxane having an SiH group, according to the method described in JP 2012-140617 A or the like. The polyorganosiloxane containing a group having an aliphatic carbon-carbon unsaturated bond and the polyorganosiloxane having an SiH group as the raw materials can be produced by a publicly known or common method of producing a polysiloxane and the production method is not particularly limited. The polyorganosiloxane containing a group having an aliphatic carbon-carbon unsaturated bond and the polyorganosiloxane having an SiH group can be produced by a method in which, similarly to the method of producing the component (A) described above, at least one type or two or more types of hydrolyzable silane compounds are subjected to hydrolysis and condensation. Furthermore, commercially available products can be also used.

Furthermore, as the products containing the component (H), for example, trade names "ETERLED GS5145", "ETERLED GS5135", and "ETERLED GS5120" (all of these available from Eternal Materials Co., Ltd.) and the like are available.

Note that, in the curable resin composition of an embodiment of the present invention, one type of the component (H) can be used alone, or two or more types of the components (H) can be used in combination.

When two or more types of the components (H) are used in combination, d1 to d6, r1 to r5, and the like described above may be average values corresponding to the blended proportion of each of the components (H).

Note that the component (H) may contain a group having at least one aliphatic carbon-carbon unsaturated bond in a molecule and may further contain a hydrosilyl group.

When the curable resin composition of an embodiment of the present invention contains the component (H), the content (blended amount) thereof is not particularly limited but is preferably from 1 to 50 wt. %, more preferably from 1 to 40 wt. %, and even more preferably from 5 to 30 wt. %, relative to the total amount (100 wt. %) of the curable resin composition. In a case where the content is not less than 1 wt. %, toughness and transparency of the cured product tend to be further enhanced.

The content (blended amount) of the component (H) relative to the component (A) in the curable resin composition of an embodiment of the present invention is not particularly limited but is preferably from 1 to 200 parts by weight, more preferably from 5 to 100 parts by weight, and even more preferably from 10 to 50 parts by weight, per 100 parts by weight of the component (A). In a case where the content is not less than 1 part by weight, toughness and transparency of the cured product tend to be further enhanced.

Furthermore, the curable resin composition of an embodiment of the present invention may contain a component other than the components described above (hereinafter, simply also referred to as "(an)other component"). Examples of such another component include siloxane compounds other than the component (A), the component (B), the component (C), the component (D), the component (F), and the component (H) (e.g., cyclic siloxane compounds other than the component (B), and low molecular weight linear or branched siloxane compounds), hydrosilylation reaction inhibitors, solvents, and various additives. Examples of the additives include inorganic fillers, such as precipitated silica, wet silica, fumed silica, calcined silica, titanium oxide, alumina, glass, quartz, aluminosilicic acid, iron oxide, calcium carbonate, carbon black, silicon carbide, silicon nitride, and boron nitride; inorganic fillers obtained by subjecting these fillers to treatment with an organosilicon compound, such as an organohalosilane, organoalkoxysilane, and organosilazane; fine powders of organic resins, such as silicone resins, epoxy resins, and fluororesins, except those described above; fillers, such as conductive metal fine powders of silver, copper, or the like, solvents, stabilizers (antioxidants, ultraviolet absorbing agents, light-resistant stabilizers, heat stabilizers, and the like), flame retardants (phosphorus-based flame retardants, halogen-based flame retardants, inorganic flame retardants, and the like), flame retardant auxiliaries, reinforcing materials (other fillers and the like), nucleating agents, coupling agents, lubricants, waxes, plasticizers, releasing agents, impact resistance improvers, hue improvers, fluidity improvers, colorants (dyes, pigments, and the like), dispersants, anti-foaming agents, defoaming agents, antibacterial agents, preservatives, viscosity modifiers, thickening agents, and phosphors. One type of these other components can be used alone, or two or more types of these other components can be used in combination. Note that the content (blended amount) of such other component(s) can be selected appropriately in a range that does not impair the effect of the present invention.

The curable resin composition of an embodiment of the present invention has a composition (formulation) in which the amount of hydrosilyl group (SiH group) is preferably from 0.5 mol to 5 mol, more preferably from 0.7 mol to 2 mol, and even more preferably from 0.8 to 1.2 mol, per 1 mol of the alkenyl group (including a group containing an aliphatic carbon-carbon double bond) present in the curable resin composition. In a case where the proportion of the hydrosilyl group and the alkenyl group is controlled to the range described above, even when hardness of the cured product of the curable resin composition of an embodiment of the present invention is increased, relatively high mechanical characteristics, such as tensile elongation and tensile stress, are maintained, and a cured product having a high toughness tends to be formed. Furthermore, heat resistance, transparency, thermal impact resistance, reflow resistance, and gas barrier property of the cured product tend to be further enhanced.

The curable resin composition of an embodiment of the present invention can be prepared by agitating and mixing each of the components described above at room temperature. Note that the curable resin composition of an embodiment of the present invention can be prepared as a one-part composition, wherein each of the components are mixed in advance and used as is. Alternatively, for example, the curable resin composition can be prepared as a composition of a multi-part system (e.g., two-part system), wherein at least two parts that are stored separately are mixed in predetermined proportions prior to use and then used. The curable resin composition may be heated to a degree that does not cause curing (e.g., from 30 to 100° C.) during the preparation as necessary.

The curable resin composition of an embodiment of the present invention may be a liquid at room temperature (approximately 23° C.).

The viscosity of the curable resin composition of an embodiment of the present invention at 23° C. is not particularly limited but is preferably not greater than 20000 mPa·s (e.g., from 300 to 20000 mPa·s), more preferably from 500 to 10000 mPa·s, and even more preferably from 1000 mPa·s to 8000 mPa·s. In a case where the viscosity is not greater than 20000 mPa·s, preparation of the curable resin composition is facilitated, the productivity and handleability thereof are further enhanced, bubbles are less likely to remain in the cured product, and thus the productivity and the quality of the cured product (especially, encapsulant) tend to be further enhanced. On the other hand, the lower limit of the viscosity is not particularly limited; however, for example, in a case where the viscosity is not less than 300 mPa·s, heat resistance of the cured product tends to be further enhanced. Note that the viscosity of the curable resin composition can be measured by the same method as the method for the viscosity of the component (A) described above except for setting the measurement temperature to 23° C.

Cured Product

The curable resin composition of an embodiment of the present invention is cured (especially, by hydrosilylation reaction) to produce a cured product (hereinafter, also simply referred to as "cured product of an embodiment of the present invention"). The condition during the curing (especially, curing by hydrosilylation reaction) can be appropriately selected from known conditions; however, for example, from the perspective of reaction rate, the temperature (curing temperature) is preferably from 25 to 180° C., and more preferably from 60 to 150° C., and the time (curing time) is preferably from 5 to 720 minutes. Note that the curing can be carried out by a single step or multiple steps. The cured product of an embodiment of the present invention has not only high heat resistance and transparency that are typical in polysiloxane-based materials, but also particularly good flexibility and thermal impact resistance. In particular, even in a case where the hardness is increased, the cured product has relatively high mechanical characteristics, such as tensile elongation and tensile stress, and high toughness.

The solid refractive index of the cured product of an embodiment of the present invention measured by light at 589 nm at 25° C. is preferably from 1.46 to 1.54, more preferably from 1.465 to 1.535, and even more preferably from 1.47 to 1.53. When the solid refractive index of the cured product of an embodiment of the present invention is not less than 1.46, tackiness of the cured product tends to be lower. On the other hand, when the solid refractive index is not greater than 1.54, heat resistance and light resistance of the cured product tend to be further enhanced. Note that the solid refractive index can be measured by the Model 2010/M Prism Coupler (available from Metricon Corporation).

When the curable resin composition of an embodiment of the present invention is heated and cured under at least one curing condition selected from 25 to 180° C. and from 5 to 720 minutes, the resultant cured product has the type D hardness, which is measured by using a type D durometer according to JIS K 6253, is not particularly limited but is preferably not less than 40, more preferably not less than 45, and even more preferably not less than 50. For example, when the cured product is used in the application as an encapsulant and/or a lens of a thin and small optical semiconductor device (e.g., a top-view type or side-view type optical semiconductor device that was formed thinner and smaller), the type D hardness of not less than 40 can ensure sufficient strength against external stress and can prevent damages of the device.

The upper limit of the type D hardness is not particularly limited but is preferably not greater than 70, and more preferably not greater than 60. For example, when the cured product is used in the application as an encapsulant of a package (LED package) of a large optical semiconductor device and thermal impact, such as a cooling and heating cycle, is applied thereto, the cured product with the upper limit of the type D hardness of greater than 70 may cause cracking and breakdown of the boding wire, leading to lighting failure. Therefore the upper limit of the type D hardness greater than 70 is not preferable.

Furthermore, when the curable resin composition of an embodiment of the present invention is heated and cured under at least one curing condition selected from 25 to 180° C. and from 5 to 720 minutes, the resultant cured product has the tensile elongation, which is measured according to JIS K 6251, is not particularly limited but is preferably not less than 50%, more preferably not less than 60%, and even more preferably not less than 70%. For example, when the cured product is used in the application as an encapsulant and/or a lens of a thin and small optical semiconductor device (e.g., a top-view type or side-view type optical semiconductor device that was formed thinner and smaller), the tensile elongation of not less than 50% can ensure sufficient flexibility against external stress and can prevent damages of the device.

When the curable resin composition of an embodiment of the present invention is heated and cured under at least one curing condition selected from 25 to 180° C. and from 5 to 720 minutes, the resultant cured product has the type D hardness, which is measured by using a type D durometer according to JIS K 6253, is preferably not less than 40, and the tensile elongation is preferably not less than 50%. In a case where the cured product has both characteristics (toughness) of the type D hardness and the tensile elongation described above, for example, even in the case of application as an encapsulant and/or a lens of a thin and small optical semiconductor device (e.g., a top-view type or side-view type optical semiconductor device that was formed thinner and smaller), the cured product exhibits both sufficient strength and sufficient flexibility against external stress, i.e. exhibiting has good toughness, thereby preventing the damage of the device.

Encapsulating Agent

The curable resin composition of an embodiment of the present invention can be preferably used for a composition for encapsulating a semiconductor element in a semiconductor device (encapsulating agent) (hereinafter, also simply referred to as "encapsulating agent of an embodiment of the present invention"). Specifically, the encapsulating agent of an embodiment of the present invention can be particularly preferably used in the purpose of encapsulating an optical semiconductor element (LED element) in an optical semiconductor device (i.e. as an encapsulating agent for an optical semiconductor). The encapsulant (cured product) obtained by curing the encapsulating agent of an embodiment of the present invention has particularly good gas barrier property, flexibility, and thermal impact resistance and has low tackiness as well as has high heat resistance and transparency that is unique to a polysiloxane-based material. In particular, a material (cured product) having high toughness while retaining relatively high mechanical characteristics, such as tensile elongation and tensile stress, even when the hardness is increased, can be formed and the viscosity is controlled to a lower value. Thus, even in a case where the cured product is used in the application as an encapsulant of a thin and small optical semiconductor device (e.g., a top-view type or side-view type optical semiconductor device that was formed thinner and smaller), the encapsulant advantageously has both sufficient strength and sufficient flexibility against external stress, and can be handled easily. Therefore, the encapsulating agent of an embodiment of the present invention can be particularly preferably used as an encapsulating agent of a thin optical semiconductor device (e.g., a top-view type or side-view type optical semiconductor device that was formed thinner and smaller) on which an optical semiconductor element with high luminance and short wavelength is mounted, or the like.

Lens-Forming Resin Composition

Furthermore, the curable resin composition of an embodiment of the present invention can be preferably used as the composition for forming a lens (hereinafter, also referred to as "lens-forming resin composition of an embodiment of the present invention"). The lens obtained by curing the lens-forming resin composition of an embodiment of the present invention has particularly good gas barrier property, flexibility, and thermal impact resistance and has low tackiness as well as has high heat resistance and transparency that is unique to a polysiloxane-based material. In particular, a material (cured product) having high toughness while retaining relatively high mechanical characteristics, such as tensile elongation and tensile stress, even when the hardness is increased, can be formed and the viscosity is controlled to a lower value. Thus, even in the case where the cured product is used in the application as a lens of an optical semiconductor device, the lens advantageously has both sufficient strength and sufficient flexibility against external stress and can be handled easily. Therefore, a lens obtained by curing the lens-forming resin composition of an embodiment of the present invention can be particularly preferably used as a lens of an optical semiconductor element in which an optical semiconductor element with high luminance and short wavelength is mounted, or the like.

Semiconductor Device

A semiconductor device (hereinafter, also simply referred to as "semiconductor device of an embodiment of the present invention") can be obtained by encapsulating a semiconductor element by using the encapsulating agent of an embodiment of the present invention. That is, the semiconductor device of an embodiment of the present invention is a semiconductor device having at least a semiconductor element and an encapsulant that encapsulates the semiconductor element, and the encapsulant is a cured product of the encapsulating agent of an embodiment of the present invention. Furthermore, a semiconductor device (this may be also referred to as "semiconductor device of an embodiment of the present invention") can be also obtained by using the lens-forming resin composition of an embodiment of the present invention. That is, another embodiment of the semiconductor device of the present invention is a semiconductor device having at least a semiconductor element and a lens, and the lens is a cured product of the lens-forming resin composition of an embodiment of the present invention.

The semiconductor device of an embodiment of the present invention may be a semiconductor device having a semiconductor element, an encapsulant that encapsulates the semiconductor element, and a lens, the encapsulant being a cured product of the curable resin composition of an embodiment of the present invention (encapsulant of an embodiment of the present invention) and the lens being a cured product of the curable resin composition (lens-forming resin composition of an embodiment of the present invention) of an embodiment of the present invention.

The production of the semiconductor device of an embodiment of the present invention can be performed by a publicly known or common method, and for example, the production can be performed by injecting the encapsulating agent and/or lens-forming resin composition of embodiments of the present invention into a predetermined mold and heat-curing in predetermined conditions. The curing temperature and the curing time can be set to similar ranges as those during preparation of the cured product.

When the semiconductor device is an optical semiconductor device, i.e. when the encapsulating agent and/or the lens-forming resin composition of embodiments of the present invention are used as an encapsulating agent (encapsulating agent for an optical semiconductor) and/or a lens-forming resin composition (lens-forming resin composition for an optical semiconductor) of an optical semiconductor element in an optical semiconductor device, the encapsulating agent and/or the lens-forming resin composition can particularly effectively exhibits the advantageous effects described above. An optical semiconductor device (hereinafter, also simply referred to as "optical semiconductor device of an embodiment of the present invention") can be obtained by using the encapsulating agent and/or the lens-forming resin composition of embodiments of the present invention as the encapsulating agent for an optical semiconductor.

An example of a top-view type optical semiconductor device of an embodiment of the present invention is illustrated in FIG. 1. In FIGS. 1A and 1B, 100 represents a reflector (light-reflecting resin composition), 101 represents a metal wiring (electrode), 102 represents an optical semiconductor element, 103 represents a bonding wire, and 104 represents a cured product (encapsulant).

Furthermore, an example of a side-view type optical semiconductor device of an embodiment of the present invention is illustrated in FIGS. 2A to 2C. In FIGS. 2A to 2C, 101a represents an external electrode, 101b represents an internal electrode, 102 represents an optical semiconductor element, 103 represents a bonding wire, 104 represents a cured product (encapsulant), 200 represents a side wall portion, and 201 represents a reflection face.

In particular, known materials in the related art present difficulty when employed in applications such as an encapsulating agent for forming an encapsulant that covers an optical semiconductor element and/or a resin composition for forming a lens used for thinner top-view type and side-view type optical semiconductor devices with high luminance and short wavelength, and an encapsulating agent for forming an encapsulant that covers a semiconductor element in a semiconductor device with high heat resistance and high withstand voltage (power semiconductor and the like). The curable resin composition of an embodiment of the present invention can be preferably used in such applications.

The curable resin composition of an embodiment of the present invention is not limited for use in the encapsulating agents described above (especially, for use in an encapsulating agent of an optical semiconductor element) and for use in lens formation (especially, for use in lens formation in an optical semiconductor device), and the curable resin composition can be preferably used for purposes related to optics and/or semiconductor, such as functional coating agents, transparent apparatuses, adhesives (heat-resistant transparent adhesives and the like), electrical insulation materials (electrical insulation films and the like), laminated sheets, coatings, ink, paints, encapsulating agents, resists, composite materials, transparent base materials, transparent sheets, transparent films, optical elements, optical members, optical shaping, electronic paper, touch panels, substrates for solar cells, optical waveguides, light guiding plates, and holographic memories.

EXAMPLES

Hereinafter, the present invention is described in further detail with reference to examples; however, the examples are by no means intended to limit the scope of the present invention.

$^1$H-NMR analysis of produced materials and products were performed by using the JEOL ECA500 (500 MHz).

Number-average molecular weight and weight-average molecular weight of produced materials and products were measured by using the Alliance HPLC system 2695 (available from Waters) with Refractive Index Detector 2414 (available from Waters), based on calibration with polystyrene standard, under the following conditions.

Column: Tskgel GMH$_{HR}$-M×2 (available from Tosoh Corporation)

Guard column: Tskgel guard column HHRL (available from Tosoh Corporation)

Column oven: COLUMN HEATER U-620 (available from Sugai)

Solvent: THF

Measurement condition: 40° C.

Viscosity of produced materials and products was measured by using a rheometer (product name: "Physica MCR-302", available from Anton Paar) and a parallel plate (cone diameter: 25 mm; taper angle: 0°) in a condition at a temperature of 25° C. and a number of rotation of 20 rpm.

Solid refractive index of produced materials and products was measured by using the Model 2010/M Prism Coupler (available from Metricon Corporation), and the refractive index at 589.0 nm was calculated from the values at 407.3 nm, 632.8 nm, 827.8 nm, and 1310.2 nm in the environment at 25° C.

Production Example 1

In a 500 mL four-neck flask, 7.50 g (36.00 mmol) of tetraethoxysilane, 53.94 g (396.00 mmol) of trimethoxymethylsilane, 22.19 g (111.89 mmol) of trimethoxyphenylsilane, 11.96 g (73.65 mmol) of hexamethyldisiloxane, and 65.27 g of methyl isobutyl ketone were charged. After the mixture was cooled to 15° C., 22.26 g of 5 N hydrochloric acid charged in a dropping funnel was added dropwise. Furthermore, 30.02 g of water was added dropwise. Thereafter, the temperature was raised to 80° C., and the mixture was agitated. 19.77 g (121.77 mmol) of hexamethyldisiloxane and 128.62 g (690.00 mmol) of 1,1,3,3-tetramethyl-1,3-divinyldisiloxane were further added and agitated.

The reaction liquid was transferred to a separatory funnel, and only the bottom layer containing the silicone resin was separated out, transferred again into a separatory funnel, and then water-washed.

After the water washing, the solvent fraction was removed under reduced pressure by using a rotary evaporator to obtain a silicone resin A, and the yield was 50.65 g.

Number-average molecular weight (Mn): 2117; weight-average molecular weight (Mw): 4766; molecular weight distribution (Mw/Mn): 2.26

$^1$H-NMR (JEOL ECA500 (500 MHz, CDCl$_3$)): δ 0.17 (br), 1.24 (br), 3.54-3.84 (br), 5.74-6.14 (br), 7.36-7.72 (br).

Average unit formula: $(SiO_{4/2})_{0.06}(PhSiO_{3/2})_{0.17}(MeSiO_{3/2})_{0.62}(Me_3SiO_{1/2})_{0.03}(ViMe_2SiO_{1/2})_{0.12}$ [Ph: phenyl group; Me: methyl group; Vi: vinyl group; hereinafter the same]

Methyl group content: 77 mol %; phenyl group content: 14 mol %; vinyl group content: 9 mol %

Production Example 2

In a 500 mL four-neck flask, 5.00 g (24.00 mmol) of tetraethoxysilane, 35.96 g (264.00 mmol) of trimethoxymethylsilane, 14.79 g (74.59 mmol) of trimethoxyphenylsilane, and 60.39 g of methyl isobutyl ketone were charged.

After the mixture was cooled to 15° C., 14.84 g of 5 N hydrochloric acid charged in a dropping funnel was added dropwise. Furthermore, 20.01 g of water was added dropwise. Thereafter, the temperature was raised to 80° C., and the mixture was agitated. 20.21 g (124.47 mmol) of hexamethyldisiloxane and 77.67 g (416.71 mmol) of 1,1,3,3-tetramethyl-1,3-divinyldisiloxane were further added and agitated.

The reaction liquid was transferred to a separatory funnel, and only the bottom layer containing the silicone resin was separated out, transferred again into a separatory funnel, and then water-washed.

After the water washing, the solvent fraction was removed under reduced pressure by using a rotary evaporator to obtain a silicone resin B, and the yield was 32.97 g.

Number-average molecular weight (Mn): 2093; weight-average molecular weight (Mw): 4195; molecular weight distribution (Mw/Mn): 2.00

$^1$H-NMR (JEOL ECA500 (500 MHz, CDCl$_3$)): δ 0.18 (br), 1.25 (br), 3.54-3.85 (br), 5.77-6.16 (br), 7.38-7.71 (br).

Average unit formula: $(SiO_{4/2})_{0.06}(PhSiO_{3/2})_{0.17}(MeSiO_{3/2})_{0.61}(Me_3SiO_{1/2})_{0.05}(ViMe_2SiO_{1/2})_{0.11}$ Methyl group content: 78 mol %; phenyl group content: 14 mol %; vinyl group content: 8 mol %

Production Example 3

In a 500 mL four-neck flask, 5.00 g (24.00 mmol) of tetraethoxysilane, 35.96 g (264.00 mmol) of trimethoxymethylsilane, 14.79 g (74.59 mmol) of trimethoxyphenylsilane, and 60.39 g of methyl isobutyl ketone were charged. After the mixture was cooled to 15° C., 14.84 g of 5 N hydrochloric acid charged in a dropping funnel was added dropwise. Furthermore, 20.01 g of water was added dropwise. Thereafter, the temperature was raised to 80° C., and the mixture was agitated. 22.85 g (140.71 mmol) of hexamethyldisiloxane and 74.65 g (400.47 mmol) of 1,1,3,3-tetramethyl-1,3-divinyldisiloxane were further added and agitated.

The reaction liquid was transferred to a separatory funnel, and only the bottom layer containing the silicone resin was separated out, transferred again into a separatory funnel, and then water-washed.

After the water washing, the solvent fraction was removed under reduced pressure by using a rotary evaporator to obtain a silicone resin C, and the yield was 33.86 g.

Number-average molecular weight (Mn): 2171; weight-average molecular weight (Mw): 4645; molecular weight distribution (Mw/Mn): 2.14

$^1$H-NMR (JEOL ECA500 (500 MHz, CDCl$_3$)): δ 0.18 (br), 1.24 (br), 3.54-3.84 (br), 5.74-6.16 (br), 7.38-7.71 (br).

Average unit formula: $(SiO_{4/2})_{0.06}(PhSiO_{3/2})_{0.17}(MeSiO_{3/2})_{0.62}(Me_3SiO_{1/2})_{0.05}(ViMe_2SiO_{1/2})_{0.10}$ Methyl group content: 78 mol %; phenyl group content: 14 mol %; vinyl group content: 8 mol %

Production Example 4

In a 500 mL four-neck flask, 60.02 g (288.10 mmol) of tetraethoxysilane, 14.79 g (74.74 mmol) of trimethoxyphenylsilane, 11.96 g (73.65 mmol) of hexamethyldisiloxane, 2.87 g (15.40 mmol) of 1,1,3,3-tetramethyl-1,3-divinyldisiloxane, and 65.27 g of methyl isobutyl ketone were charged. After the mixture was cooled to 15° C., 18.38 g of 5 N hydrochloric acid charged in a dropping funnel was added dropwise. Furthermore, 24.78 g of water was added dropwise. Thereafter, the temperature was raised to 80° C., and the mixture was agitated. 60.96 g (375.42 mmol) of hexamethyldisiloxane and 14.40 g (77.25 mmol) of 1,1,3,3-tetramethyl-1,3-divinyldisiloxane were further added and agitated.

The reaction liquid was transferred to a separatory funnel, and only the bottom layer containing the silicone resin was separated out, transferred again into a separatory funnel, and then water-washed.

After the water washing, the solvent fraction was removed under reduced pressure by using a rotary evaporator to obtain a silicone resin D, and the yield was 38.95 g.

Number-average molecular weight (Mn): 2038; weight-average molecular weight (Mw): 2427; molecular weight distribution (Mw/Mn): 1.19

$^1$H-NMR (JEOL ECA500 (500 MHz, CDCl$_3$)): δ −0.3-0.3 ppm (br), 3.0-4.0 ppm (br), 5.7-6.2 ppm (br), 7.1-7.9 ppm (br)

Average unit formula: $(SiO_{4/2})_{0.44}(PhSiO_{3/2})_{0.12}(Me_3SiO_{1/2})_{0.37}(ViMe_2SiO_{1/2})_{0.07}$ Methyl group content: 87 mol %; phenyl group content: 8 mol %; vinyl group content: 5 mol %

Production Example 5

In a 500 mL four-neck flask, 5.00 g (24.00 mmol) of tetraethoxysilane, 35.96 g (264.00 mmol) of trimethoxymethylsilane, 14.79 g (74.59 mmol) of trimethoxyphenylsilane, 0.59 g (3.63 mmol) of hexamethyldisiloxane, 0.90 g (4.81 mmol) of 1,1,3,3-tetramethyl-1,3-divinyldisiloxane, and 59.50 g of methyl isobutyl ketone were charged. After the mixture was cooled to 15° C., 14.84 g of 5 N hydrochloric acid charged in a dropping funnel was added dropwise. Furthermore, 20.01 g of water was added dropwise. Thereafter, the temperature was raised to 80° C., and the mixture was agitated. 37.20 g (229.08 mmol) of hexamethyldisiloxane and 56.60 g (303.66 mmol) of 1,1,3,3-tetramethyl-1,3-divinyldisiloxane were further added and agitated.

The reaction liquid was transferred to a separatory funnel, and only the bottom layer containing the silicone resin was separated out, transferred again into a separatory funnel, and then water-washed.

After the water washing, the solvent fraction was removed under reduced pressure by using a rotary evaporator to obtain a silicone resin E, and the yield was 34.25 g.

Number-average molecular weight (Mn): 1842; weight-average molecular weight (Mw): 3013; molecular weight distribution (Mw/Mn): 1.63

$^1$H-NMR (JEOL ECA500 (500 MHz, CDCl$_3$)): δ 0.14 (br), 1.24 (br), 3.55-3.84 (br), 5.74-6.15 (br), 7.37-7.71 (br).

Average unit formula: $(SiO_{4/2})_{0.06}(PhSiO_{3/2})_{0.17}(MeSiO_{3/2})_{0.58}(Me_3SiO_{1/2})_{0.10}(ViMe_2SiO_{1/2})_{0.09}$ Methyl group content: 80 mol %; phenyl group content: 13 mol %; vinyl group content: 7 mol %

Production Example 6

In a 500 mL four-neck flask, 23.00 g (110.40 mmol) of tetraethoxysilane, 24.19 g (117.60 mmol) of trimethoxymethylsilane, 14.79 g (74.59 mmol) of trimethoxyphenylsilane, 6.65 g (35.65 mmol) of 1,1,3,3-tetramethyl-1,3-divinyldisiloxane, and 51.04 g of methyl isobutyl ketone were charged. After the mixture was cooled to 15° C., 15.99 g of 5 N hydrochloric acid charged in a dropping funnel was added dropwise. Furthermore, 21.57 g of water was added dropwise. Thereafter, the temperature was raised to 80° C., and the mixture was agitated. 94.23 g (505.53 mmol) of 1,1,3,3-tetramethyl-1,3-divinyldisiloxane were further added and agitated.

The reaction liquid was transferred to a separatory funnel, and only the bottom layer containing the silicone resin was separated out, transferred again into a separatory funnel, and then water-washed.

After the water washing, the solvent fraction was removed under reduced pressure by using a rotary evaporator to obtain a silicone resin F, and the yield was 38.74 g.

Number-average molecular weight (Mn): 1884; weight-average molecular weight (Mw): 2517; molecular weight distribution (Mw/Mn): 1.34

$^1$H-NMR (JEOL ECA500 (500 MHz, CDCl$_3$)): δ 0.21 (br), 1.25 (br), 3.58-3.86 (br), 5.72-6.18 (br), 7.38-7.68 (br).

Average unit formula: $(SiO_{4/2})_{0.21}(PhSiO_{3/2})_{0.15}(MeSiO_{3/2})_{0.36}(ViMe_2SiO_{1/2})_{0.28}$ Methyl group content: 68 mol %; phenyl group content: 11 mol %; vinyl group content: 21 mol %

Production Example 7

Step 1

Under a nitrogen atmosphere, 8.316 g (25 mmol; hydrosilyl group: 50 mmol) of 3,3-diphenyl-1,1,5,5-tetramethyltrisiloxane, 9.4 g of toluene, and 0.0018 g [1.9×10−4 mmol (in terms of Pt)] of xylene solution of platinum (2%)-divinyltetramethyldisiloxane complex were charged in a 100 mL flask equipped with a reflux tube, and agitated and maintained at 60° C.

Using a dropping funnel, 7.694 g (20 mmol; vinylsilyl group: 40 mmol) of 1,5-divinyl-3,3-diphenyl-1,1,5,5-tetramethyltrisiloxane was added dropwise.

After the completion of dropwise addition, the mixture was maintained at 60° C. to obtain a reaction liquid containing a linear polyorganosiloxysilalkylene having hydrosilyl groups at both terminals. Thereafter, the mixture was cooled to room temperature.

Step 2

Under a nitrogen atmosphere, 2.000 g (4.8 mmol) of tris(vinyldimethylsiloxy)phenylsilane (available from Eternal) and 0.0744 g [8×10$^{-5}$ mmol (in terms of Pt); available from Wako Pure Chemical Industries, Ltd.] of xylene solution of platinum (0.02%)-divinyltetramethyldisiloxane complex were charged in a 100 mL flask equipped with a reflux tube, and maintained at 100° C.

Using a dropping funnel, the entire amount of the reaction liquid obtained in Step 1 was added dropwise. Thereafter, the mixture was cooled to room temperature.

After the cooling, the solvent was removed from the reaction liquid by using an evaporator, and the liquid was concentrated until no toluene was detected by gas chromatography (available from Shimadzu Corporation; trade name: GC-2010) to obtain 14.2 g of a vinylsilyl group-containing polyorganosiloxysilalkylene.

The viscosity [25° C.; at shear rate of 20 (1/s)] was 3450 mPa·s, the number-average molecular weight (Mn) was 3430, the weight-average molecular weight (Mw) was 7880, and the molecular weight distribution (Mw/Mn) was 2.30.

$^1$H-NMR (JEOL ECA500 (500 MHz, CDCl$_3$)): δ−0.3-0.3 ppm (br), 0.4 ppm (br), 3.0-4.0 ppm (br), 5.7-6.2 ppm (br), 7.1-7.9 ppm (br)

Average unit formula: $(PhSiO_{3/2})_{0.04}(Ph_2SiO_{2/2})_{0.43}(Me_2Si—CH_2CH_2-Me_2SiO_{2/2})_{0.49}(ViMe_2SiO_{1/2})_{0.04}$ The following products were used as the component (A).

Silicone resin A: the produced material obtained in Production Example 1

Silicone resin B: the produced material obtained in Production Example 2

Silicone resin C: the produced material obtained in Production Example 3

Silicone resin D: the produced material obtained in Production Example 4

Silicone resin E: the produced material obtained in Production Example 5

Silicone resin F: the produced material obtained in Production Example 6

The following products were used as the component (B).

Si-Vi monomer: tris(vinyldimethylsiloxy)phenylsilane (available from Gelest Inc.)

The following products were used as the component (C).

Vinyl silalkylene silicone: the produced material obtained in Production Example 7

The following products were used as the component (D).

Si—H monomer: 1,1,5,5-tetramethyl-3,3-diphenyltrisiloxane (available from NANJING SiSiB Silicones Co., Ltd.)

Average composition formula: $Ph_{2/3}Me_{4/3}H_{2/3}SiO_{2/3}$

Average unit formula: $(Ph_2SiO_{2/2})_1(HMe_2SiO_{1/2})_2$

Methyl group content: 50 mol %; phenyl group content: 25 mol %; hydrosilyl group content: 25 mol %

The following products were used as the component (E).

Addition reaction catalyst: trade name: Pt-VTS; xylene solution of platinum-divinyltetramethyldisiloxane complex; containing 2.0 wt. % in terms of platinum; available from N.E. Chemcat Corporation The following products were used in place of Components (A) to (E) as the raw materials for Comparative Examples 5 and 6.

Agent A

OE-7660A: trade name: OE-7660A, available from Dow Corning Toray Co., Ltd.; containing a MT resin having an alkenyl group, a linear polyorganosiloxane having an alkenyl group, and a hydrosilylation catalyst Methyl group content: 58 mol %; phenyl group content: 17 mol %; vinyl group content: 25 mol %

OE-6630A: trade name: OE-6630A, available from Dow Corning Toray Co., Ltd.; containing a MDT resin having an alkenyl group, a linear polyorganosiloxane having an alkenyl group, and a hydrosilylation catalyst Methyl group content: 51 mol %; phenyl group content: 42 mol %; vinyl group content: 4 mol %

Agent B

OE-7660B: trade name: OE-7660B, available from Dow Corning Toray Co., Ltd.; containing a MT resin having an alkenyl group and a linear organosiloxane having a hydrosilyl group Methyl group content: 39 mol %; phenyl group content: 42 mol %; vinyl group content: 8 mol %; SiH group content: 10 mol %

OE-6630B: trade name: OE-6630B, available from Dow Corning Toray Co., Ltd.; containing a MT resin having an alkenyl group and a linear polyorganosiloxane having a hydrosilyl group Methyl group content: 40 mol %; phenyl group content: 41 mol %; vinyl group content: 8 mol %; SiH group content: 10 mol %

EXAMPLES AND COMPARATIVE EXAMPLES

Examples 1 to 9 and Comparative Examples 1 to 6 were performed according to the following procedure.

In accordance with Table 1 (Examples 1 to 9 and Comparative Examples 1 to 4), the component (A), the component (B), the component (C), and the component (D) were mixed in predetermined weight proportions and agitated at 70° C. for 2 hours. Thereafter, the mixture was cooled to room temperature. The component (E) was then added at a predetermined weight proportion and agitated for 10 minutes to produce a curable resin composition, which was a homogeneous liquid.

For Comparative Examples 5 and 6, the curable resin compositions were obtained by the same operation as in Examples 1 to 9 and Comparative Examples 1 to 4 except for mixing the agent A and the agent B shown in Table 1 at the weight proportions shown in Table 1 in place of the components (A) to (E).

In Table 1, a1/a2 of the component (A) included in each of the curable resin compositions obtained in the examples and the comparative examples is shown. When two or more types of silicone resins were used as the component (A), the average value of a1/a2 corresponding to the blended proportion of each silicone resin is shown.

Furthermore, the ratio (SiH/SiVi ratio) of the hydrosilyl group (SiH group) included in the component (D) to the vinyl group (SiVi group) included in the components (A) to (C) in the curable resin composition is shown in Table 1.

Furthermore, the content ratio of each of the components described above (component (B)/component (A), component (C)/component (A), component (D)/component (A), Components (B) to (D)/component (A)) is shown in Table 1 (each value shown in terms of percent).

The following evaluation tests were performed for the curable resin compositions.

Note that, in Table 1, the blended amount of each of the components of the curable resin composition is shown in terms of part by weight unless otherwise noted, and the blended amount of the addition reaction catalyst is shown in terms of weight unit (ppm) of platinum.

Evaluation
Viscosity

The viscosity (mPa·s) of the curable resin composition at 23° C. obtained as described above was measured by using a rheometer (product name: "Physica MCR-302", available from Anton Paar) and a parallel plate (cone diameter: 25 mm; taper angle: 0°) in a condition at a temperature of 23° C. and a number of rotation of 20 rpm. The results are shown in Table 1.

Type D Hardness

In a mold formed from PTFE and having the thickness of 3 mm, the curable resin composition obtained as described above was injected and heated at 80° C. for 1 hour and then at 150° C. for 4 hours to produce a cured product of the curable resin composition for Type D hardness measurement.

The type D hardness of the obtained cured product was measured by using a Type D durometer (trade name: GS-702G, available from TECLOCK K.K.) in accordance with JIS K 6253. The results are shown in Table 1.

Solid Refractive Index

In a mold formed from PTFE and having the thickness of 0.5 mm, the curable resin composition obtained as described above was injected and heated at 80° C. for 1 hour and then at 150° C. for 4 hours to produce a cured product of the curable resin composition for solid refractive index measurement.

The refractive index at 589.0 nm of the obtained cured product was calculated from the values at 407.3 nm, 632.8 nm, 827.8 nm, and 1310.2 nm in the environment at 25° C. measured by using the Model 2010/M Prism Coupler (available from Metricon Corporation). The results are shown in Table 1.

Tensile Test

In a mold formed from PTFE and having the thickness of 0.5 mm, the curable resin composition obtained as described above was injected and heated at 80° C. for 1 hour and then at 150° C. for 4 hours to produce a cured product of the curable resin composition for tensile test.

The tensile stress, tensile elongation, and Young's modulus of the obtained cured product were measured in accordance with JIS K 6251. The results are shown in Table 1.

Aging Test
Production of Cured Product

In a rectangular mold having the thickness of 3 mm, the width of 10 mm, and the length of 50 mm, the curable resin composition obtained as described above was injected and heated at 80° C. for 1 hour and then at 150° C. for 4 hours to produce a cured product of the curable resin composition (thickness: 3 mm).

The light transmittance at 450 nm was measured for the cured product produced as described above, by using a spectrophotometer (UV-2450, available from Shimadzu Corporation). Thereafter, the cured product was exposed to an environment at 200° C. for 500 hours, and then the light transmittance was measured in the same manner.

The light transmittance immediately after the curing is listed as "initial transmittance [%]", and the light transmittance after exposure in an environment at 200° C. for 500 hours is listed as "transmittance after heat resistance test at 200° C. (500 hrs) [%]".

The percentage of transmittance retained was calculated from the following equation based on the measurement results.

The percentage of transmittance retained after heat resistance test at 200° C. (500 hrs) [%]=(transmittance after heat resistance test at 200° C. (500 hrs) [%]/initial transmittance [%])×100

The "the percentage of transmittance retained after heat resistance test at 200° C. (500 hrs)" was then evaluated based on the following criteria. The results are shown in Table 1.

Excellent (significantly good): the percentage of transmittance retained was not less than 95%

Good (good): the percentage of transmittance retained was not less than 90% but less than 95%

Poor (poor): the percentage of transmittance retained was less than 90%

Overall Judgment

The overall judgment was made based on the viscosity, the type D hardness, the tensile test results, and the aging test result by the following criteria. The results are shown in Table 1.

The case where all of the following criteria were satisfied was evaluated as "Good", and the case where at least one of the following criteria was not satisfied was evaluated as "Poor".

Hardness: not less than D40
Viscosity: not greater than 10000 mPa·s
Tensile elongation: not less than 50%
Percentage of transmittance retained after heat resistance test at 200° C. (500 hrs): not less than 95%

TABLE 1

| | | | | Examples | | | | | | | | |
|---|---|---|---|---|---|---|---|---|---|---|---|---|
| | | | | 1 | 2 | 3 | 4 | 5 | 6 | 7 | 8 | 9 |
| Curable resin composition | Component (A) | Silicone resin A | part by weight | 64 | 44 | | | | | | | |
| | | Silicone resin B | part by weight | | 22 | 66 | 68 | 66 | 67 | | | |
| | | Silicone resin C | part by weight | | | | | | | 67 | | |
| | | Silicone resin D | part by weight | | | | | | | | 69 | |
| | | Silicone resin E | part by weight | | | | | | | | | 75 |
| | | Silicone resin F | part by weight | | | | | | | | | |
| | Component (B) | Si-Vinyl monomer | part by weight | 10 | 10 | 10 | 5 | 10 | 7 | 10 | 10 | 5 |
| | Component (C) | Vinyl silalkylene silicone | part by weight | | | | 4 | | 2 | | | |
| | Component (D) | Si—H monomer | part by weight | 26 | 25 | 25 | 22 | 25 | 24 | 24 | 22 | 20 |
| | Component (E) | Hydrosilylation catalyst | ppm | 1.0 | 1.0 | 1.0 | 1.0 | 1.0 | 1.0 | 1.0 | 1.0 | 1.0 |
| Curable resin | Agent A | OE-7660A | part by weight | | | | | | | | | |
| | | OE-6630A | part by weight | | | | | | | | | |
| | Agent B | OE-7660B | part by weight | | | | | | | | | |
| | | OE-6630B | part by weight | | | | | | | | | |
| | | SiH/SiVi | | 1.0 | 1.0 | 1.0 | 1.0 | 1.0 | 1.0 | 1.0 | 1.0 | 1.0 |
| | | a1/a2 of component (A) | | 0.08 | 0.08 | 0.08 | 0.08 | 0.08 | 0.08 | 0.08 | 3.67 | 0.08 |
| | | component (B)/component (A) | % | 14 | 14 | 14 | 8 | 14 | 11 | 14 | 13 | 6 |
| | | component (C)/component (A) | % | 0 | 0 | 0 | 5 | 0 | 3 | 0 | 0 | 0 |
| | | component (D)/component (A) | % | 41 | 39 | 37 | 33 | 37 | 35 | 35 | 32 | 26 |
| | | components (B) to (D)/component (A) | % | 57 | 54 | 52 | 46 | 52 | 49 | 50 | 46 | 33 |
| | | Viscosity | mPa·s | 1544 | 1529 | 2030 | 2979 | 1231 | 2079 | 3368 | 2140 | 6891 |
| Cured product | | Type D hardness | — | 54 | 53 | 42 | 51 | 43 | 50 | 46 | 41 | 40 |
| | | Refractive index | — | 1.49 | 1.49 | 1.49 | 1.49 | 1.49 | 1.49 | 1.49 | 1.49 | 1.49 |
| | Tensile test | Tensile stress | MPa | 10 | 9 | 8 | 10 | 7 | 9 | 9 | 6 | 6 |
| | | Tensile elongation | % | 63 | 76 | 92 | 57 | 101 | 83 | 79 | 67 | 155 |
| | | Young's modulus | MPa | 131 | 94 | 51 | 213 | 44 | 92 | 104 | 101 | 46 |
| | Aging test (transmittance: 450 nm) | Percentage of transmittance retained after heat resistance test at 200° C. (500 hrs) | % | Excellent | Excellent | Excellent | Excellent | Excellent | Excellent | Excellent | Excellent | Excellent |
| | | Overall judgment | | Good | Good | Good | Good | Good | Good | Good | Good | Good |

| | | | | Comparative Examples | | | | | |
|---|---|---|---|---|---|---|---|---|---|
| | | | | 1 | 2 | 3 | 4 | 5 | 6 |
| Curable resin composition | Component (A) | Silicone resin A | part by weight | 73 | 74 | | | | |
| | | Silicone resin B | part by weight | | | | | | |
| | | Silicone resin C | part by weight | | | | 54 | | |
| | | Silicone resin D | part by weight | | | | | | |
| | | Silicone resin E | part by weight | | | | | | |
| | | Silicone resin F | part by weight | | | | | 48 | |

TABLE 1-continued

| | | | | | | | | | |
|---|---|---|---|---|---|---|---|---|---|
| | Component (B) | Si-Vinyl monomer | part by weight | 3 | 1 | | | | |
| | Component (C) | Vinyl silalkylene silicone | part by weight | 2 | 4 | 25 | 17 | | |
| | Component (D) | Si—H monomer | part by weight | 23 | 3 | 22 | 36 | | |
| | Component (E) | Hydrosilylation catalyst | ppm | 1.0 | 1.0 | 1.0 | 1.0 | | |
| Curable resin | Agent A | OE-7660A | part by weight | | | | | 5 | |
| | | OE-6630A | part by weight | | | | | | 20 |
| | Agent B | OE-7660B | part by weight | | | | | 100 | |
| | | OE-6630B | part by weight | | | | | | 80 |
| | SiH/SiVi | | | 1.0 | 1.0 | 1.0 | 1.0 | 1.0 | 1.0 |
| | a1/a2 of component (A) | | | 0.08 | 0.08 | 0.08 | 0.41 | | |
| | component (B)/component (A) | | % | 4 | 1 | 0 | 0 | | |
| | component (C)/component (A) | | % | 3 | 5 | 47 | 35 | | |
| | component (D)/component (A) | | % | 30 | 28 | 41 | 75 | | |
| | components (B) to (D)/component (A) | | % | 38 | 11 | 87 | 110 | | |
| | Viscosity | | mPa·s | 23330 | 49700 | 2336 | 300 | 2200 | 2200 |
| Cured product | Type D hardness | | — | 65 | 70 | 30 | 40 | 57 | 27 |
| | Refractive index | | — | 1.49 | 1.49 | 1.49 | 1.49 | 1.55 | 1.55 |
| | Tensile test | Tensile stress | MPa | 16 | 17 | 5 | 4 | 11 | 5 |
| | | Tensile elongation | % | 19 | 20 | 109 | 19 | 75 | 95 |
| | | Young's modulus | MPa | 551 | 577 | 13 | 37 | 173 | 13 |
| | Aging test (transmittance: 450 nm) | Percentage of transmittance retained after heat resistance test at 200° C. (500 hrs) | % | Excellent | Excellent | Excellent | Excellent | Poor | Poor |
| | Overall judgment | | | Poor | Poor | Poor | Poor | Poor | Poor |

Variations of embodiments of the present invention described above are additionally described below.

[1] A curable resin composition containing: a component (A), a component (B), a component (C), a component (D), and a component (E) below;
a content of the component (B) per 100 parts by weight of the component (A) being from 5 to 50 parts by weight;
a content of the component (C) per 100 parts by weight of the component (A) being from 0 to 10 parts by weight;
a content of the component (D) being an amount that makes the amount of an SiH group (hydrosilyl group) present in the component (D) from 0.5 to 5 mol per 1 mol of an alkenyl group present in the component (A), the component (B), and the component (C); and
a total content of the component (B), the component (C), and the component (D) per 100 parts by weight of the component (A) being not greater than 80 parts by weight.

(A): A polyorganosiloxane represented by Average Unit Formula (I) below:

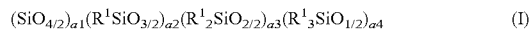

$$(SiO_{4/2})_{a1}(R^1SiO_{3/2})_{a2}(R^1{}_2SiO_{2/2})_{a3}(R^1{}_3SiO_{1/2})_{a4} \quad (I)$$

where, $R^1$ is, the same or different, an alkyl group having from 1 to 10 carbons (preferably a methyl group), an aryl group having from 6 to 14 carbons (preferably a phenyl group), an alkenyl group having from 2 to 8 carbons (preferably a vinyl group), an alkoxy group having from 1 to 10 carbons (preferably a methoxy group or an ethoxy group), or a hydroxy group; in the case where a proportion of the alkyl group is X mol %, a proportion of the aryl group is Y mol %, and a proportion of the alkenyl group is Z mol % relative to a total amount (100 mol %) of $R^1$, X is from 30 to 98 mol %, Y is from 1 to 50 mol %, and Z is from 1 to 20 mol %; and a1, a2, a3, and a4 are each a number satisfying a1>0, a2>0, a3≥0, a4>0, 0.01≤a1/a2≤10, and a1+a2+a3+a4=1.

(B): A polyorganosiloxane having not more than 10 silicon atoms and having a proportion of an alkenyl group (preferably a vinyl group) relative to a total amount (100 mol %) of the organic groups bonded to the silicon atom of 20 to 60 mol %.

(C): An organopolysiloxane represented by Average Unit Formula (X) below:

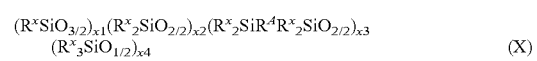

$$(R^xSiO_{3/2})_{x1}(R^x{}_2SiO_{2/2})_{x2}(R^x{}_2SiR^4R^x{}_2SiO_{2/2})_{x3}(R^x{}_3SiO_{1/2})_{x4} \quad (X)$$

where, $R^x$ is, the same or different, an alkyl group having from 1 to 10 carbons (preferably a methyl group), an aryl group having from 6 to 14 carbons (preferably a phenyl group), an alkenyl group having from 2 to 8 carbons (preferably a vinyl group), an alkoxy group having from 1 to 10 carbons (preferably a methoxy group or an ethoxy group), or a hydroxy group; a proportion of the aryl group relative to a total amount (100 mol %) of $R^x$ is from 1 to 50 mol %, and at least two of all the $R^x$ moieties are alkenyl groups. $R^A$ is a divalent hydrocarbon group (preferably an ethylene group). x1, x2, x3, and x4 are each a number satisfying $0.05 > x1 \geq 0$, $x2+x3 > 0$, $x4 > 0$, and $x1+x2+x3+x4=1$.

(D) A polyorganosiloxane represented by Average Composition Formula (II) below:

where, $R^2$ is, the same or different, an alkyl group having from 1 to 10 carbons (preferably a methyl group) or an aryl group having from 6 to 14 carbons (preferably a phenyl group), and at least two hydrogen atoms are bonded to the silicon atom. m and n are each a number satisfying $0.7 \leq m \leq 2.1$, $0.001 \leq n \leq 1$, and $0.8 \leq m+n \leq 3$.

(E): A hydrosilylation catalyst.

[2] The curable resin composition described in [1] above, where X is from 55 to 95 mol % (preferably from 60 to 90 mol %).

[3] The curable resin composition described in [1] or [2] above, where Y is from 3 to 40 mol % (preferably from 5 to 30 mol %).

[4] The curable resin composition described in any one of [1] to [3] above, where Z is from 2 to 15 mol % (preferably from 3 to 10 mol %).

[5] The curable resin composition described in any one of [1] to [4] above, where
the component (A) is a polyorganosiloxane
having a weight-average molecular weight in terms of polystyrene of 500 to 50000,
having a molecular weight distribution of 1 to 4, and
being a solid or liquid having a viscosity at 25° C. of not less than 10 mPa·s.

[6] The curable resin composition described in any one of [1] to [5] above, where, in the component (A), a ratio of X to Y (X/Y) is from 0.5 to 25 (preferably from 1 to 20, and more preferably from 2 to 15).

[7] The curable resin composition described in any one of [1] to [6] above, where a1 is from 0.01 to 0.8 (preferably from 0.02 to 0.7, and more preferably from 0.03 to 0.6).

[8] The curable resin composition described in any one of [1] to [7] above, where a2 is from 0.01 to 0.90 (preferably from 0.03 to 0.85, and more preferably from 0.05 to 0.8).

[9] The curable resin composition described in any one of [1] to [8] above, where a3 is from 0 to 0.9 (preferably from 0 to 0.6, and more preferably from 0 to 0.3).

[10] The curable resin composition described in any one of [1] to [9] above, where a4 is from 0.01 to 0.9 (preferably from 0.03 to 0.8, and more preferably from 0.05 to 0.7).

[11] The curable resin composition described in any one of [1] to [10] above, where a1/a2 is from 0.02 to 8 (preferably from 0.03 to 6).

[12] The curable resin composition described in any one of [1] to [11] above, where a weight-average molecular weight (Mw) of the component (A) is not less than 500 and not greater than 50000 (preferably not less than 600 and not greater than 40000, more preferably not less than 700 and not greater than 20000, and particularly preferably not less than 1000 and not greater than 10000).

[13] The curable resin composition described in any one of [1] to [12] above, where a molecular weight distribution (Mw/Mn) of the component (A) is not less than 1 and not greater than 4 (preferably from 1 to 3.5, more preferably from 1 to 3, and particularly preferably from 1 to 2.5).

[14] The curable resin composition described in any one of [1] to [13] above, where the viscosity at 25° C. of the component (A) is not less than 10 mPa·s (preferably not less than 100 mPa·s, and more preferably not less than 500 mPa·s).

[15] The curable resin composition described in any one of [1] to [14] above, where the viscosity at 25° C. of the component (A) is not greater than 1000000 mPa·s (preferably not greater than 100000 mPa·s).

[16] The curable resin composition described in any one of [1] to [15] above, where a content (blended amount) of the component (A) is from 20 to 99 wt. % (more preferably from 40 to 97 wt. %, and even more preferably from 50 to 95 wt. %) relative to the total amount (100 wt. %) of the curable resin composition.

[17] The curable resin composition described in any one of [1] to [16] above, where, in the component (B), a proportion of the alkenyl group relative to the total amount (100 mol %) of the organic groups bonded to the silicon atom is from 20 to 55 mol % (preferably from 25 to 50 mol %).

[18] The curable resin composition described in any one of [1] to [17] above, where the number of the silicon atom constituting the component (B) is not greater than 8 (preferably not greater than 6).

[19] The curable resin composition described in any one of [1] to [18] above, where the number of the silicon atom constituting the component (B) is not less than 2 (preferably not less than 3).

[20] The curable resin composition described in any one of [1] to [19] above, where the organic group bonded to the silicon atom other than the alkenyl group included in the component (B) is an alkyl group (preferably a methyl group) or an aryl group (preferably a phenyl group).

[21] The curable resin composition described in any one of [1] to [20] above, where the component (B) is a polyorganosiloxane represented by unit formula below.

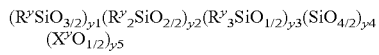

where, $R^y$ is, the same or different, a monovalent organic group, and some of the $R^y$ moieties are alkenyl groups (preferably vinyl groups), and the proportion thereof is from 20 to 60 mol % (preferably from 20 to 55 mol %, and more preferably from 25 to 50 mol %) relative to the total amount (100 mol %) of the organic groups bonded to the silicon atom in the component (B). $X^y$ is a hydrogen atom or an alkyl group (preferably a methyl group). y1 is 0 or a positive integer, y2 is 0 or a positive integer, y3 is 0 or a positive integer, y4 is 0 or a positive integer, and y5 is 0 or a positive integer. (y1+y2+y3) is a positive number, and y1, y2, y3, and y4 are positive numbers that satisfy $2 \leq y1+y2+y3+y4 \leq 10$ (preferably $2 \leq y1+y2+y3+y4 \leq 8$, and more preferably $2 \leq y1+y2+y3+y4 \leq 6$).

[22] The curable resin composition described in [21] above, where $R^y$ other than the alkenyl group is an alkyl group (preferably a methyl group) or an aryl group (preferably a phenyl group).

[23] The curable resin composition described in any one of [1] to [22] above, where the component (B) is a linear polyorganosiloxane having the proportion of the alkenyl group (preferably a vinyl group) relative to the total amount (100 mol %) of the organic groups bonded to the silicon atom of 20 to 60 mol % (preferably 20 to 55 mol %, and more preferably 25 to 50 mol %) and the number of the silicon atom of not more than 10 (preferably not more than 8, and more preferably not more than 6).

[24] The curable resin composition described in [23] above, where the group bonded to the silicon atom other than the alkenyl group in the linear polyorganosiloxane is an alkyl group (preferably a methyl group) or an aryl group (preferably a phenyl group).

[25] The curable resin composition described in [24] above, where a proportion of the alkyl group (preferably a methyl group) relative to the total amount (100 mol %) of the organic groups bonded to the silicon atom is from 0 to 80 mol % (preferably not less than 40 mol %, and more preferably from 50 to 80 mol %).

[26] The curable resin composition described in [24] or [25] above, where a proportion of the aryl group (preferably a phenyl group) relative to the total amount (100 mol %) of the organic groups bonded to the silicon atom is from 0 to 80 mol % (preferably not less than 5 mol %, and more preferably from 7 to 60 mol %).

[27] The curable resin composition described in any one of [1] to [26] above, where the linear component (B) is represented by Formula (Y-1) below.

[Chem. 8]

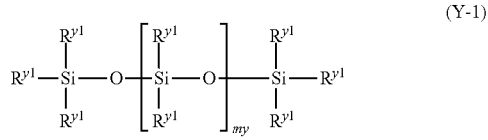

(Y-1)

where, $R^{y1}$ is, the same or different, a substituted or unsubstituted monovalent hydrocarbon group. However, from 20 to 60 mol % (preferably from 20 to 55 mol %, and more preferably from 25 to 50 mol %) of all the $R^{y1}$ moieties is alkenyl groups (preferably vinyl groups). my is an integer of 0 to 8 (preferably an integer of 0 to 6, and more preferably an integer of 0 to 4).

[28] The curable resin composition described in [27] above, where $R^{y1}$ other than the alkenyl group is an alkyl group (preferably a methyl group) or an aryl group (preferably a phenyl group).

[29] The curable resin composition described in any one of [1] to [22] above, where the component (B) is a branched polyorganosiloxane having the proportion of the alkenyl group (preferably a vinyl group) relative to the total amount (100 mol %) of the organic groups bonded to the silicon atom of 20 to 60 mol % (preferably 20 to 55 mol %, and more preferably 25 to 50 mol %), the number of the silicon atom of not more than 10 (preferably not more than 8, and more preferably not more than 6), and a siloxane unit represented by $RSiO_{3/2}$ (R represents a substituted or unsubstituted monovalent hydrocarbon group) (T unit).

[30] The curable resin composition described in [29] above, where the group bonded to the silicon atom other than the alkenyl group in the branched polyorganosiloxane is an alkyl group (preferably a methyl group) or an aryl group (preferably a phenyl group).

[31] The curable resin composition described in [29] or [30] above, where R is an alkyl group (preferably a methyl group) or an aryl group (preferably a phenyl group).

[32] The curable resin composition described in [31] above, where a proportion of the alkyl group (preferably a methyl group) relative to the total amount (100 mol %) of the organic groups bonded to the silicon atom is from 0 to 80 mol % (preferably not less than 40 mol %, and more preferably from 50 to 80 mol %).

[33] The curable resin composition described in [31] or [32] above, where a proportion of the aryl group (preferably a phenyl group) relative to the total amount (100 mol %) of the organic groups bonded to the silicon atom is from 0 to 80 mol % (preferably not less than 5 mol %, and more preferably from 7 to 60 mol %).

[34] The curable resin composition described in any one of [29] to [33] above, where the branched polyorganosiloxane can be represented by the unit formula of [21] above in which y1 and/or y4 is positive integer(s).

[35] The curable resin composition described in [34] above, where y3/y1 is a number of 0 to 3.

[36] The curable resin composition described in [34] or [35] above, where y4/(y1+y2+y3+y4) is a number of 0 to 0.3.

[37] The curable resin composition described in any one of [34] to [36] above, where y5/(y1+y2+y3+y4) is a number of 0 to 0.4.

[38] The curable resin composition described in any one of [1] to [22] above, where the component (B) is a cyclic polyorganosiloxane having the proportion of the alkenyl group (preferably a vinyl group) relative to the total amount (100 mol %) of the organic groups bonded to the silicon atom of 20 to 60 mol % (preferably 20 to 55 mol %, and more preferably 25 to 50 mol %) and the number of the silicon atom of not more than 10 (preferably not more than 8, and more preferably not more than 6).

[39] The curable resin composition described in [38] above, where the group bonded to the silicon atom other than the alkenyl group in the cyclic polyorganosiloxane is an alkyl group (preferably a methyl group) or an aryl group (preferably a phenyl group).

[40] The curable resin composition described in [39] above, where a proportion of the alkyl group (preferably a methyl group) relative to the total amount (100 mol %) of the organic groups bonded to the silicon atom is from 0 to 80 mol % (preferably not less than 40 mol %, and more preferably from 50 to 80 mol %).

[41] The curable resin composition described in [39] or [40] above, where a proportion of the aryl group (preferably a phenyl group) relative to the total amount (100 mol %) of the organic groups bonded to the silicon atom is from 0 to 80 mol % (preferably not less than 5 mol %, and more preferably from 7 to 60 mol %).

[42] The curable resin composition described in any one of [1] to [41] above, where a molecular weight of the component (B) is not less than 200 and not greater than 2000 (preferably not less than 250 and not greater than 1500, and more preferably not less than 300 and not greater than 1000).

[43] The curable resin composition described in any one of [1] to [42] above, where a viscosity at 25° C. of the component (B) is not greater than 1000 mPa·s (preferably not greater than 500 mPa·s).

[44] The curable resin composition described in any one of [1] to [43] above, where the viscosity at 25° C. of the component (B) is not less than 0.1 mPa·s (preferably not less than 1 mPa·s).

[45] The curable resin composition described in any one of [1] to [44] above, where a content (blended amount) of the component (B) is from 3 to 30 wt. % (preferably from 3 to 25 wt. %, and more preferably from 3 to 20 wt. %) relative to the total amount (100 wt. %) of the curable resin composition.

[46] The curable resin composition described in any one of [1] to [45] above, where the content (blended amount) of the component (B) is from 5 to 40 parts by weight (preferably from 5 to 30 parts by weight) per 100 parts by weight of the component (A).

[47] The curable resin composition described in any one of [1] to [46] above, where, in the component (C), when the proportion of the alkyl group relative to the total amount (100 mol %) of $R^x$ is X" mol %, X" is from 30 to 98 mol % (preferably from 55 to 95 mol %, and more preferably from 60 to 90 mol %).

[48] The curable resin composition described in any one of [1] to [47] above, where, in the component (C), when the proportion of the aryl group relative to the total amount (100 mol %) of $R^x$ is Y" mol %, Y" is from 3 to 40 mol % (preferably from 5 to 30 mol %).

[49] The curable resin composition described in any one of [1] to [48] above, where, in the component (C), when the proportion of the alkenyl group relative to the total amount (100 mol %) of $R^x$ is Z" mol %, Z" is from 1 to 20 mol % (preferably from 2 to 15 mol %, and more preferably from 3 to 10 mol %).

[50] The curable resin composition described in any one of [1] to [49] above, where, in the component (C), a ratio (X"/Y") of the proportion of the alkyl group (X") to the proportion of the aryl group (Y") is from 0.5 to 25 (preferably from 1 to 20, and more preferably from 2 to 15).

[51] The curable resin composition described in any one of [1] to [50] above, where x1 is not less than 0.01 and not greater than 0.04 (preferably not less than 0.02 and not greater than 0.03).

[52] The curable resin composition described in any one of [1] to [51] above, where x2 is from 0.30 to 0.99 (preferably from 0.40 to 0.98, and more preferably from 0.50 to 0.97).

[53] The curable resin composition described in any one of [1] to [52] above, where x3 is from 0.20 to 0.90 (preferably from 0.30 to 0.80, and more preferably from 0.40 to 0.70).

[54] The curable resin composition described in any one of [1] to [53] above, where x2+x3 is from 0.30 to 0.99 (preferably from 0.40 to 0.98, and more preferably from 0.50 to 0.97).

[55] The curable resin composition described in any one of [1] to [54] above, where x4 is from 0.01 to 0.50 (preferably from 0.02 to 0.40, and more preferably from 0.03 to 0.35).

[56] The curable resin composition described in any one of [1] to [55] above, where the component (C) is a polyorganosiloxysilalkylene that satisfies the following: in Average Unit Formula (X) above, x1, x2, x3, and x4 are each a number satisfying 0.05>x1>0, x2+x3>0, x3>0, x4>0, and x1+x2+x3+x4=1.

[57] The curable resin composition described in any one of [1] to [56] above, where a weight-average molecular weight (Mw) of the component (C) is not less than 500 and not greater than 50000 (preferably not less than 600 and not greater than 40000, more preferably not less than 700 and not greater than 20000, and particularly preferably not less than 1000 and not greater than 10000).

[58] The curable resin composition described in any one of [1] to [57] above, where a molecular weight distribution (Mw/Mn) of the component (C) is not less than 1 and not greater than 4 (preferably from 1 to 3.5, more preferably from 1 to 3, and particularly preferably from 1 to 2.5).

[59] The curable resin composition described in any one of [1] to [58] above, where the viscosity of the component (C) at 25° C. is not less than 10 mPa·s (preferably not less than 100 mPa·s, and more preferably not less than 500 mPa·s).

[60] The curable resin composition described in any one of [1] to [59] above, where the viscosity of the component (C) at 25° C. is not greater than 1000000 mPa·s (preferably not greater than 100000 mPa·s).

[61] The curable resin composition described in any one of [1] to [60] above, where a content (blended amount) of the component (C) is from 0 to 20 wt. % (preferably from 0 to 15 wt. %, and more preferably from 1 to 10 wt. %) relative to the total amount (100 wt. %) of the curable resin composition.

[62] The curable resin composition described in any one of [1] to [61] above, where the content (blended amount) of the component (C) is from 0 to 8 parts by weight (preferably from 1 to 6 parts by weight) per 100 parts by weight of the component (A).

[63] The curable resin composition described in any one of [1] to [62] above, where, in the component (D), when the proportion of the alkyl group relative to the total amount (100 mol %) of $R^2$ is X' mol %, X' is from 20 to 95 mol % (more preferably from 30 to 93 mol %, and more preferably from 40 to 90 mol %).

[64] The curable resin composition described in any one of [1] to [63] above, where, in the component (D), when the proportion of the aryl group relative to the total amount (100 mol %) of $R^2$ is Y' mol %, Y' is from 1 to 80 mol % (preferably from 3 to 60 mol %, and more preferably from 5 to 40 mol %).

[65] The curable resin composition described in any one of [1] to [64] above, where, in the component (D), when the proportion of the SiH group (hydrosilyl group) relative to the total amount (100 mol %) of $R^2$ is Z' mol %, Z' is from 2 to 70 mol % (preferably from 5 to 60 mol %, and more preferably from 10 to 55 mol %).

[66] The curable resin composition described in any one of [1] to [65] above, where, in the component (D), a ratio (X'/Y') of the content of the alkyl group (X') to the content of the aryl group (Y') is from 1/100 to 100/1 (preferably from 10/100 to 100/10, and more preferably from 20/100 to 100/20).

[67] The curable resin composition described in any one of [1] to [66] above, where m is from 0.8 to 2.1 (preferably from 1 to 2).

[68] The curable resin composition described in any one of [1] to [67] above, where n is from 0.01 to 1 (preferably from 0.2 to 1).

[69] The curable resin composition described in any one of [1] to [68] above, where m+n is from 1 to 2.9 (preferably from 1.5 to 2.8).

[70] The curable resin composition described in any one of [1] to [69] above, where the component (D) contains, in a molecule, at least two (preferably from 2 to 4, and more preferably 2) structural units (M units) represented by $R^{2'}_2HSiO_{1/2}$ where $R^{2'}$ is, the same or different, an alkyl group having from 1 to 10 carbons (preferably a methyl group) or an aryl group having from 6 to 14 carbons (preferably a phenyl group).

[71] The curable resin composition described in any one of [1] to [70] above, where the properties of the component (D) is a liquid with a viscosity at 25° C. from 0.1 to 100000 mPa·s.

[72] The curable resin composition described in any one of [1] to [71] above, where the component (D) is represented by average unit formula below and contains a polyorganosiloxane having at least two structural units (M units) represented by $R^{2a}_2HSiO_{1/2}$.

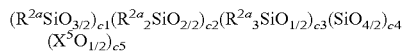

where, the $R^{2a}$ moieties are, the same or different, a hydrogen atom, an alkyl group having from 1 to 10 carbons (preferably a methyl group), or an aryl group having from 6 to 14 carbons (preferably a phenyl group). $X^5$ is a hydrogen atom or an alkyl group (preferably a methyl group). c1 is 0 or a positive number, c2 is 0 or a positive number, c3 is 0 or a positive number, c4 is 0 or a positive number, c5 is 0 or a positive number, and (c1+c2+c3) is a positive number.

[73] The curable resin composition described in [72] above, where the proportion of the hydrogen atom relative to the total amount (100 mol %) of $R^{2a}$ is from 2 to 70 mol %.

[74] The curable resin composition described in any one of [1] to [73] above, where the component (D) is a linear polyorganosiloxane having not less than two hydrosilyl groups at both terminals of the molecule.

[75] The curable resin composition described in [74] above, where the proportion of the hydrogen atom (hydrogen atom bonded to the silicon atom) relative to the total amount (100 mol %) of the groups bonded to the silicon atom is from 2 to 70 mol %.

[76] The curable resin composition described in [74] or [75] above, where a proportion of the alkyl group (preferably a methyl group) relative to the total amount (100 mol %) of the groups bonded to the silicon atom is from 20 to 95 mol % (preferably from 40 to 95 mol %).

[77] The curable resin composition described in any one of [74] to [76] above, where a proportion of the aryl group (preferably a phenyl group) relative to the total amount (100 mol %) of the groups bonded to the silicon atom is from 1 to 80 mol %.

[78] The curable resin composition described in any one of [74] to [77] above, where the component (D) contains a linear polyorganosiloxane represented by Formula (II-1) below (hereinafter, also referred to as component (D1)).

[Chem. 9]

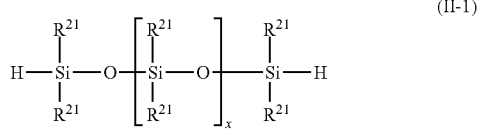

where, $R^{21}$ is, the same or different, an alkyl group having from 1 to 10 carbons (preferably a methyl group), or an aryl group having from 6 to 14 carbons (preferably a phenyl group), and x represents an integer from 0 to 1000 (preferably an integer of 1 to 100).

[79] The curable resin composition described in [78] above, where the component (D) contains the component (D1) at not less than 1 wt. % and not greater than 99 wt. % (preferably at not less than 10 wt. % and not greater than 50 wt. %).

[80] The curable resin composition described in [78] or [79] above, where the component (D1) is a liquid at 25° C.

[81] The curable resin composition described in any one of [78] to [80] above, where the viscosity of the component (D1) at 25° C. is not greater than 10000 mPa·s (preferably not greater than 5000 mPa·s).

[82] The curable resin composition described in any one of [78] to [81] above, where the viscosity of the component (D1) at 25° C. is not less than 1 mPa·s (preferably not less than 5 mPa·s).

[83] The curable resin composition described in any one of [1] to [82] above, where the component (D) contains a branched polyorganosiloxane having at least two M units represented by $R_2HSiO_{1/2}$ and having a siloxane unit (T unit) represented by $RSiO_{3/2}$ in a molecule, where R is an alkyl group having from 1 to 10 carbons (preferably a methyl group) or an aryl group having from 6 to 14 carbons (preferably a phenyl group).

[84] The curable resin composition described in [83] above, where the proportion of the alkyl group (preferably a methyl group) relative to the total amount (100 mol %) of the groups bonded to the silicon atom is from 20 to 95 mol % (preferably from 50 to 90 mol %).

[85] The curable resin composition described in [83] or [84] above, where a proportion of the aryl group (particularly a phenyl group) relative to the total amount (100 mol %) of the groups bonded to the silicon atom is from 1 to 80 mol %.

[86] The curable resin composition described in any one of [83] to [85] above, where the branched polyorganosiloxane is represented by the average unit formula of [72] above in which c1 is a positive number.

[87] The curable resin composition described in [86] above, where c2/c1 is a number of 0 to 10.

[88] The curable resin composition described in [86] or [87] above, where c3/c1 is a number of 0 to 0.5.

[89] The curable resin composition described in any one of [86] to [88] above, where c4/(c1+c2+c3+c4) is a number of 0 to 0.3.

[90] The curable resin composition described in any one of [86] to [89] above, where c5/(c1+c2+c3+c4) is a number of 0 to 0.4.

[91] The curable resin composition described in any one of [83] to [90] above, where a weight-average molecular weight, measured by GPC based on calibration with polystyrene standard, of the branched polyorganosiloxane is from 100 to 50000 (preferably from 150 to 40000).

[92] The curable resin composition described in any one of [1] to [91] above, where a weight-average molecular weight (Mw) of the component (D) is not less than 100 and not greater than 50000 (preferably not less than 150 and not greater than 40000, more preferably not less than 175 and not greater than 20000, and particularly preferably not less than 200 and not greater than 10000).

[93] The curable resin composition described in any one of [1] to [92] above, where a molecular weight distribution (Mw/Mn) of the component (D) is not less than 1 and not greater than 4 (preferably from 1 to 3.5, more preferably from 1 to 3, and particularly preferably from 1 to 2.5).

[94] The curable resin composition described in any one of [1] to [93] above, where the viscosity of the component (D) at 25° C. is not less than 1 mPa·s (preferably not less than 5 mPa·s).

[95] The curable resin composition described in any one of [1] to [94] above, where the viscosity at 25° C. of the component (D) is not greater than 10000 mPa·s (preferably not greater than 5000 mPa·s).

[96] The curable resin composition described in any one of [1] to [95] above, where the component (D) is at least one type selected from the group consisting of 1,1,5,5-tetramethyl-3,3-diphenyltrisiloxane, 3-phenyl-1,1,3,5,5-pentamethyltrisiloxane, 1,1,3,3,5,5-hexamethyltrisiloxane, 1,1,3,3,5,5,7,7-octamethyltetrasiloxane, and 1,1,3,3,5,5,7,7,9,9-decamethylpentasiloxane.

[97] The curable resin composition described in any one of [1] to [96] above, where the component (D) contains one type of polyorganosiloxane represented by Average Composition Formula (II) or at least two different types of polyorganosiloxanes represented by Average Composition Formula (II).

[98] The curable resin composition described in any one of [1] to [97] above, where the component (D) contains at least one type of polyorganosiloxane represented by Average Composition Formula (II), in which at least one $R^2$ is an aryl group having from 6 to 14 carbons (preferably a phenyl group).

[99] The curable resin composition described in any one of [1] to [98] above, where the content (blended amount) of the component (D) is an amount that makes the amount of the SiH group (hydrosilyl group) present in the component (D) to be from 0.7 to 2 mol (preferably from 0.8 to 1.2 mol) per 1 mol of the alkenyl group present in the component (A), the component (B), and the component (C).

[100] The curable resin composition described in any one of [1] to [99] above, where the content (blended amount) of the component (D) is from 5 to 50 wt. % (preferably from 7 to 30 wt. %, and more preferably from 10 to 25 wt. %) relative to the total amount (100 wt. %) of the curable resin composition.

[101] The curable resin composition described in any one of [1] to [100] above, where the content (blended amount) of the component (D) is from 1 to 200 parts by weight (preferably from 5 to 100 parts by weight, and more preferably from 10 to 50 parts by weight) per 100 parts by weight of the component (A).

[102] The curable resin composition described in any one of [1] to [101] above, where the content (blended amount) of the component (D) is from 1 to 200 parts by weight (preferably from 5 to 100 parts by weight, and more preferably from 10 to 50 parts by weight) per 100 parts by weight total of the component (A), the component (B), and the component (C).

[103] The curable resin composition described in any one of [1] to [102] above, where a total content of the component (B), the component (C), and the component (D) per 100 parts by weight of the component (A) is from 10 to 75 parts by weight (preferably from 20 to 70 parts by weight).

[104] The curable resin composition described in any one of [1] to [103] above, where the component (E) is at least one type selected from the group consisting of platinum-based catalysts (preferably, platinum fine powder, platinum black, platinum-carrying silica fine powder, platinum-carrying activated carbon, chloroplatinic acid, and complexes of chloroplatinic acid with an alcohol, an aldehyde, or a ketone, platinum-olefin complexes, platinum-carbonyl complexes (preferably a platinum-carbonylvinylmethyl complex), platinum-vinylmethylsiloxane complexes (preferably, a platinum-divinyltetramethyldisiloxane complex and platinum-cyclovinylmethylsiloxane complex), platinum-phosphine complexes, and platinum-phosphite complexes), palladium-based catalysts (preferably a catalyst which contains a palladium atom in place of the platinum atom in the platinum-based catalysts described above), and rhodium-based catalysts (preferably a catalyst which contains a rhodium atom in place of the platinum atom in the platinum-based catalysts described above).

[105] The curable resin composition described in any one of [1] to [104] above, where a content (blended amount) of the component (E) is from $1 \times 10^8$ to $1 \times 10^{-2}$ mol (preferably from $1 \times 10^{-6}$ to $1 \times 10^{-3}$ mol) per 1 mol total of the aliphatic carbon-carbon double bonds (especially, alkenyl group) included in the curable resin composition.

[106] The curable resin composition described in [104] or [105] above, where the content (blended amount) of the component (E) is an amount that makes the amount, in terms of weight unit, of platinum, palladium, or rhodium in the hydrosilylation catalyst to be in a range of 0.01 to 1000 ppm (preferably in a range of 0.1 to 500 ppm).

[107] The curable resin composition described in any one of [1] to [106] above, further containing a component (F) below:

(F): a silsesquioxane having not less than one alkenyl group (preferably a vinyl group) and not less than one aryl group (preferably a phenyl group) in a molecule.

[108] The curable resin composition described in [107] above, where the group bonded to the silicon atom other than the alkenyl group and the aryl group included in a molecule of the component (F) is an alkyl group (preferably a methyl group).

[109] The curable resin composition described in [107] or [108] above, where a proportion of the alkenyl group relative to the total amount (100 wt. %) of the component (F) is from 1.0 to 20.0 wt. % (preferably from 1.5 to 15.0 wt. %).

[110] The curable resin composition described in any one of [107] to [109] above, where a proportion of the aryl group relative to the total amount (100 wt. %) of the component (F) is from 1.0 to 50.0 wt. % (preferably from 5.0 to 25.0 wt. %).

[111] The curable resin composition described in any one of [107] to [110] above, where a proportion of the alkyl group relative to the total amount (100 wt. %) of the component (F) is from 10.0 to 50.0 wt. % (preferably from 20.0 to 40.0 wt. %).

[112] The curable resin composition described in any one of [107] to [111] above, where the weight-average molecular weight (Mw) of the component (F) is from 100 to 800000 (preferably from 200 to 100000, more preferably from 300 to 10000, particularly preferably from 500 to 8000, and most preferably from 1700 to 7000).

[113] The curable resin composition described in any one of [107] to [112] above, where the number-average molecular weight (Mn) of the component (F) is from 80 to 800000 (preferably from 150 to 100000, more preferably from 250 to 10000, particularly preferably from 400 to 8000, and most preferably from 1500 to 7000).

[114] The curable resin composition described in any one of [107] to [113] above, where a molecular weight distribution (Mw/Mn) of the component (F) is from 1.00 to 1.40 (preferably not greater than 1.35 (e.g., from 1.05 to 1.35), and more preferably not greater than 1.30 (e.g., from 1.10 to 1.30)).

[115] The curable resin composition described in any one of [107] to [114] above, where the viscosity of the component (F) at 23° C. is from 100 to 100000 mPa·s (preferably from 500 to 10000 mPa·s, and more preferably from 1000 to 8000 mPa·s).

[116] The curable resin composition described in any one of [107] to [115] above, where the content (blended amount) of the component (F) is from 0.05 to 50 parts by weight (preferably from 0.1 to 45 parts by weight, and more preferably from 0.2 to 40 parts by weight) per 100 parts by weight total of the component (A) to the component (D).

[117] The curable resin composition described in any one of [107] to [116] above, where a content (blended amount) of the component (F) is from 0.01 to 20 wt. % (preferably from 0.05 to 15 wt. %, and more preferably from 0.1 to 10 wt. %) relative to the amount (100 wt. %) of the curable resin composition.

[118] The curable resin composition described in any one of [1] to [117] above, further containing a silane coupling agent (G) (preferably a silane coupling agent containing an epoxy group, and particularly preferably 3-glycidoxypropyltrimethoxysilane).

[119] The curable resin composition described in [118] above, where a content (blended amount) of the silane coupling agent (G) is from 0.01 to 15 wt. % (preferably from 0.1 to 10 wt. %, and more preferably from 0.5 to 5 wt. %) relative to the amount (100 wt. %) of the curable resin composition.

[120] The curable resin composition described in any one of [1] to [119] above, further containing a component (H) below:
(H): a polyorganosiloxysilalkylene having a group containing not less than one aliphatic carbon-carbon unsaturated bond (preferably a vinyl group) in a molecule.

[121] The curable resin composition described in [120] above, where the component (H) is a polyorganosiloxane having a group containing not less than one aliphatic carbon-carbon unsaturated bond in a molecule, and contains a bond represented by —Si—$R^4$—Si— ($R^4$ represents a divalent hydrocarbon group; hereinafter, referred to as "silalkylene bond") in addition to the siloxane bond (—Si—O—Si—) as the main chain.

[122] The curable resin composition described in [121] above, where the divalent hydrocarbon group ($R^4$) is a linear or branched alkylene group (preferably an ethylene group).

[123] The curable resin composition described in any one of [120] to [122] above, where the group bonded to the silicon atom other than the group containing an aliphatic carbon-carbon unsaturated bond included in the component (H) is an alkyl group (preferably a methyl group) or an aryl group (preferably a phenyl group).

[124] The curable resin composition described in any one of [120] to [123] above, where the component (H) contains a polyorganosiloxysilalkylene represented by average unit formula below.

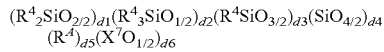

where, $R^4$ is, the same or different, a hydrogen atom, a monovalent hydrocarbon group, or a monovalent heterocyclic group (preferably an alkyl group having from 1 to 10 carbons (particularly a methyl group), an aryl group having from 4 to 14 carbons (particularly a phenyl group), and an alkenyl group having from 2 to 8 carbons (particularly a vinyl group)). However, some of the $R^4$ moieties are groups containing an aliphatic carbon-carbon unsaturated bond (preferably alkenyl groups having from 2 to 8 carbons, and particularly a vinyl group) and the proportion thereof is controlled to the range by which at least one group containing an aliphatic carbon-carbon unsaturated bond is present in a molecule. $R^4$ is a divalent hydrocarbon group (preferably an ethylene group). $X^7$ is a hydrogen atom or an alkyl group (preferably a methyl group). d1 is a positive number (preferably from 1 to 200), d2 is a positive number (preferably from 1 to 200), d3 is 0 or a positive number (preferably from 1 to 10), d4 is 0 or a positive number (preferably from 0 to 5), d5 is a positive number (preferably from 1 to 100), and d6 is 0 or a positive number.

[125] The curable resin composition described in [124] above, where the proportion of the group containing an aliphatic carbon-carbon unsaturated bond relative to the total amount (100 mol %) of $R^4$ is from 0.1 to 40 mol %.

[126] The curable resin composition described in [124] or [125] above, where (d3+d4) is a positive number.

[127] The curable resin composition described in any one of [120] to [126] above, where the component (H) contains a polyorganosiloxysilalkylene having structures represented by Formula (IV-1) below.

[Chem. 10]

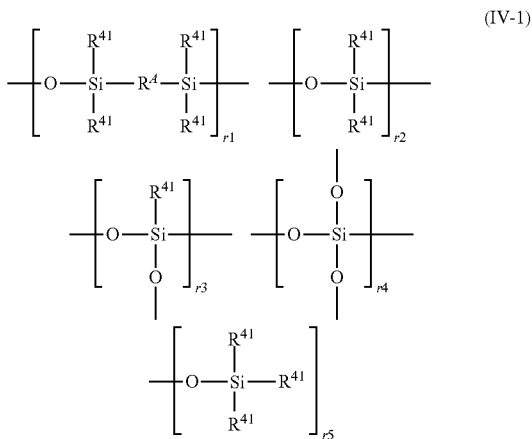

In Formula (IV-1) above, $R^{41}$ is, the same or different, a hydrogen atom, a monovalent hydrocarbon group, or a monovalent heterocyclic group (preferably an alkyl group having from 1 to 10 carbons (particularly a methyl group), an aryl group having from 4 to 14 carbons (particularly a phenyl group), and an alkenyl group having from 2 to 8 carbons (particularly a vinyl group)). However, at least one of the $R^{41}$ moieties is a group containing an aliphatic carbon-carbon unsaturated bond (preferably an alkenyl group having from 2 to 8 carbons, and particularly a vinyl group). $R^4$ is a divalent hydrocarbon group (among these, a $C_{2-4}$ alkylene group, and particularly an ethylene group). r1 represents an integer of not less than 1 (preferably 1 to 100). r2 represents 0 or an integer of not less than 1 (preferably 0 to 400). r3 represents 0 or an integer of not less than 1 (preferably 0 to 50). r4 represents 0 or an integer of not less than 1 (preferably 0 to 50). r5 represents 0 or an integer of not less than 1 (preferably 0 to 50).

[128] The curable resin composition described in [127] above, where the component (H) contains a branched polyorganosiloxysilalkylene in which, in Formula (IV-1) above, r1 represents an integer of not less than 1 (preferably 1 to 100), r2 represents an integer of not less than 1 (preferably 1 to 400), r3 represents an integer of not less than 1 (preferably 1 to 50), r4 is 0, and r5 represents an integer of not less than 1 (preferably 1 to 50).

[129] The curable resin composition described in [127] or [128] above, where the component (H) contains a linear polyorganosiloxysilalkylene in which, in Formula (IV-1) above, r1 represents an integer of not less than 1 (preferably 1 to 100), r2 represents an integer of not less than 1 (preferably 1 to 400), r3 and r4 are 0, and r5 represents an integer of not less than 1 (preferably 1 to 50).

[130] The curable resin composition described in any one of [120] to [129] above, where a weight-average molecular weight (Mw) of the component (H) is not less than 500 and not greater than 50000 (preferably not less than 700 and not greater than 20000, and particularly preferably not less than 1000 and not greater than 10000).

[131] The curable resin composition described in any one of [120] to [130] above, where a molecular weight distribution (Mw/Mn) of the component (H) is not less than 1 and not greater than 4 (preferably from 1 to 3.5).

[132] The curable resin composition described in any one of [120] to [131] above, where the viscosity at 25° C. of the component (H) is not less than 100 mPa·s (preferably not less than 500 mPa·s).

[133] The curable resin composition described in any one of [120] to [132] above, where the viscosity of the component (H) at 25° C. is not greater than 50000 mPa·s (preferably not greater than 10000 mPa·s).

[134] The curable resin composition described in any one of [120] to [133] above, where the content (blended amount) of the component (H) is from 1 to 50 wt. % (preferably from 1 to 40 wt. %, and more preferably from 5 to 30 wt. %) relative to the total amount (100 wt. %) of the curable resin composition.

[135] The curable resin composition described in any one of [120] to [134] above, where the content (blended amount) of the component (H) is from 1 to 200 parts by weight (preferably from 5 to 100 parts by weight, and more preferably from 10 to 50 parts by weight) per 100 parts by weight of the component (A).

[136] The curable resin composition described in any one of [1] to [135] above, having a composition (formulation) in which the amount of hydrosilyl group (SiH group) included in the component (B) is not less than 0.5 mol and not greater than 5 mol (preferably from 0.7 mol to 2 mol, and more preferably from 0.8 to 1.2 mol) per 1 mol of the alkenyl group (including a group containing an aliphatic carbon-carbon double bond present in the curable resin composition.

[137] The curable resin composition described in any one of [1] to [136] above, where the viscosity at 23° C. of the curable resin composition is not greater than 20000 mPa·s (preferably from 300 to 20000 mPa·s, more preferably from 500 to 10000 mPa·s, and even more preferably from 1000 to 8000 mPa·s).

[138] The curable resin composition described in any one of [1] to [137] above, where, when a cured product is obtained by curing the curable resin composition by heating in at least one curing condition selected from 25 to 180° C. and from 5 to 720 minutes, a type D hardness of the cured product measured by using a type D durometer according to JIS K 6253 is not less than 40 (preferably not less than 45, and more preferably not less than 50).

[139] The curable resin composition described in any one of [1] to [138] above, where, when a cured product is obtained by curing the curable resin composition by heating in at least one curing condition selected from 25 to 180° C. and from 5 to 720 minutes, a type D hardness of the cured product measured by using a type D durometer according to JIS K 6253 is not greater than 70 (preferably not greater than 60).

[140] The curable resin composition described in any one of [1] to [139] above, where, when a cured product is obtained by curing the curable resin composition by heating in at least one curing condition selected from 25 to 180° C. and from 5 to 720 minutes, a tensile elongation according to JIS K 6251 of the cured product is not less than 50% (preferably not less than 60%, and more preferably not less than 70%).

[141] A cured product of the curable resin composition described in any one of [1] to [140] above.

[142] The cured product described in [141] above, where a refractive index at 589 nm is not less than 1.46 and not greater than 1.54 (preferably from 1.465 to 1.535, and more preferably from 1.47 to 1.53).

[143] The curable resin composition described in any one of [1] to [140] above, where the curable resin composition is an encapsulating agent.

[144] The curable resin composition described in any one of [1] to [140] above, where the curable resin composition is a lens-forming resin composition.

[145] A semiconductor device including a semiconductor element and an encapsulant that encapsulates the semiconductor element, the encapsulant being a cured product of the curable resin composition described in [143] above.

[146] A semiconductor device including a semiconductor element and a lens, the lens being a cured product of the curable resin composition described in [144] above.

[147] A semiconductor device including a semiconductor element, an encapsulant that encapsulates the semiconductor element, and a lens; the encapsulant being a cured product of the curable resin composition described in [143] above, and the lens being a cured product of the curable resin composition described in [144] above.

[148] The semiconductor device described in any one of [145] to [147] above, where a refractive index at 589 nm of the cured product is not less than 1.46 and not greater than 1.54 (preferably from 1.465 to 1.535, and more preferably from 1.47 to 1.53).

[149] The semiconductor device described in any one of [145] to [148] above, where the semiconductor device is an optical semiconductor device.

INDUSTRIAL APPLICABILITY

The curable resin composition of an embodiment of the present invention can be suitably used as a raw material for forming an encapsulant and/or an optical lens (encapsulating agent and lens-forming resin composition) of an optical semiconductor element (LED element) in an optical semiconductor device (e.g., a top-view type or side-view type optical semiconductor device that was formed thinner and smaller).

REFERENCE SIGNS LIST

100: Reflector (light-reflecting resin composition)
101: Metal wiring (electrode)
101a: External metal wiring (external electrode)
101b: Internal metal wiring (external electrode)
102: Optical semiconductor element
103: Bonding wire
104: Cured product (encapsulant)
200: Side wall portion
201: Reflection face

The invention claimed is:

1. A curable resin composition comprising: a component (A), a component (B), a component (C), a component (D), and a component (E) below;
   a content of the component (B) per 100 parts by weight of the component (A) being from 5 to 50 parts by weight;
   a content of the component (C) per 100 parts by weight of the component (A) being from 0 to 10 parts by weight;
   a content of the component (D) being an amount that makes the amount of an SiH group (hydrosilyl group) present in the component (D) from 0.5 to 5 mol per 1 mol of an alkenyl group present in the component (A), the component (B), and the component (C); and a total content of the component (B), the component (C), and the component (D) per 100 parts by weight of the component (A) being not greater than 80 parts by weight;

(A): a polyorganosiloxane represented by Average Unit Formula (I) below:

$$(SiO_{4/2})_{a1}(R^1SiO_{3/2})_{a2}(R^1{}_2SiO_{2/2})_{a3}(R^1{}_3SiO_{1/2})_{a4} \quad (I)$$

wherein $R^1$ is, the same or different, an alkyl group having from 1 to 10 carbons, an aryl group having from 6 to 14 carbons, an alkenyl group having from 2 to 8 carbons, an alkoxy group having from 1 to 10 carbons, or a hydroxy group; in the case where a proportion of the alkyl group is X mol %, a proportion of the aryl group is Y mol %, and a proportion of the alkenyl group is Z mol % relative to a total amount (100 mol %) of $R^1$, X is from 30 to 98 mol %, Y is from 1 to 50 mol %, and Z is from 1 to 20 mol %; a ratio of X to Y (X/Y) is from 5.5 to 25, and a1, a2, a3, and a4 are each a number satisfying a1>0, a2>0, a3≥0, a4>0, 0.01≤a1/a2≤10, and a1+a2+a3+a4=1;

(B): a polyorganosiloxane having not more than 10 silicon atoms and having a proportion of an alkenyl group relative to a total amount (100 mol %) of the organic groups bonded to the silicon atom from 20 to 60 mol %;

(C): an organopolysiloxane represented by Average Unit Formula (X) below:

$$(R^xSiO_{3/2})_{x1}(R^x{}_2SiO_{2/2})_{x2}(R^x{}_2SiR^4R^x{}_2SiO_{2/2})_{x3}(R^x{}_3SiO_{1/2})_{x4} \quad (X)$$

wherein $R^x$ is, the same or different, an alkyl group having from 1 to 10 carbons, an aryl group having from 6 to 14 carbons, an alkenyl group having from 2 to 8 carbons, an alkoxy group having from 1 to 10 carbons, or a hydroxy group; a proportion of the aryl group relative to a total amount (100 mol %) of $R^x$ is from 1 to 50 mol %, and at least two of all the $R^x$ moieties are alkenyl groups; $R^4$ is a divalent hydrocarbon group; and x1, x2, x3, and x4 are each a number satisfying 0.05>x1≥0, x2+x3>0, x4>0, and x1+x2+x3+x4=1;

(D) a polyorganosiloxane represented by Average Composition Formula (II) below:

$$R^2{}_mH_nSiO_{[(4-m-n)/2]} \quad (II)$$

wherein $R^2$ is, the same or different, an alkyl group having from 1 to 10 carbons or an aryl group having from 6 to 14 carbons, and at least two hydrogen atoms are bonded to the silicon atom; and m and n are each a number satisfying 0.7≤m≤2.1, 0.001≤n≤1, and 0.8≤m+n≤3; and (E): a hydrosilylation catalyst.

2. The curable resin composition according to claim 1, wherein a viscosity at 23° C. is not greater than 20000 mPa·s.

3. The curable resin composition according to claim 1, wherein, a cured product prepared by heating and curing the curable resin composition in at least one curing condition selected from 25 to 180° C. and from 5 to 720 minutes has a type D hardness of not less than 40, the type D hardness being measured by using a type D durometer according to JIS K 6253, and a tensile elongation of not less than 50%, the tensile elongation being measured according to JIS K 6251.

4. The curable resin composition according to claim 1, wherein
the component (A) is a polyorganosiloxane
that has a weight-average molecular weight of 500 to 50000 based on calibration with polystyrene, has a molecular weight distribution of 1 to 4, and
is a solid or liquid having a viscosity at 25° C. of not less than 10 mPas.

5. The curable resin composition according to claim 1, further comprising a component (F) below:
(F): a silsesquioxane having at least one alkenyl group and at least one aryl group in a molecule.

6. The curable resin composition according to claim 1, wherein the component (D) contains at least two structural units represented by $R^{2'}{}_2HSiO_{1/2}$ where wherein $R^{2'}$ is, the same or different, an alkyl group having from 1 to 10 carbons or an aryl group having from 6 to 14 carbons.

7. The curable resin composition according to claim 1, wherein the component (D) contains not less than 1 wt. % and not greater than 99 wt. % of a component (B1), the component (B1) being represented by Formula (II-1) below:

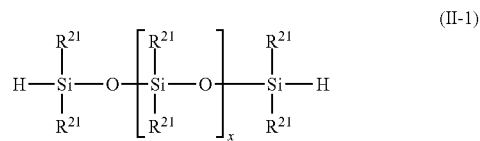

wherein $R^{21}$ is, the same or different, an alkyl group having from 1 to 10 carbons or an aryl group having from 6 to 14 carbons, and x represents an integer from 0 to 1000; and
the component (B1) being a liquid having a viscosity at 25° C. of not greater than 10000 mPa·s.

8. The curable resin composition according to claim 1, wherein the component (D) contains one type of polyorganosiloxane represented by Average Composition Formula (II) or at least two different types of polyorganosiloxanes represented by Average Composition Formula (II).

9. The curable resin composition according to claim 1, wherein the component (D) contains at least one type of polyorganosiloxane represented by Average Formula (II), wherein at least one of the $R^2$ moieties is an aryl group having from 6 to 14 carbons.

10. The curable resin composition according to claim 1, further comprising a silane coupling agent (G).

11. A cured product of the curable resin composition described in claim 1.

12. The cured product according to claim 11, wherein a refractive index at 589 nm is from 1.46 to 1.54.

13. The curable resin composition according to claim 1, wherein the curable resin composition is an encapsulating agent.

14. The curable resin composition according to claim 1, wherein the curable resin composition is a lens-forming resin composition.

15. A semiconductor device comprising: a semiconductor element and an encapsulant that encapsulates the semiconductor element,
the encapsulant being a cured product of the curable resin composition described in claim 13.

16. A semiconductor device comprising: a semiconductor element and a lens,
the lens being a cured product of the curable resin composition described in claim 14.

17. A semiconductor device comprising: a semiconductor element, an encapsulant that encapsulates the semiconductor element, and a lens,
the encapsulant being a cured product of the curable resin composition described in claim 1, and the lens being a cured product of the curable resin composition described in claim 1.

18. The semiconductor device according to claim 15, wherein a refractive index of the cured product at 589 nm is from 1.46 to 1.54.

19. The semiconductor device according to claim 15, wherein the semiconductor device is an optical semiconductor device.

20. A curable resin composition comprising: a component (A), a component (B), a component (C), a component (D), and a component (E) below;
a content of the component (B) per 100 parts by weight of the component (A) being from 5 to 50 parts by weight;
a content of the component (C) per 100 parts by weight of the component (A) being from 0 to 10 parts by weight;
a content of the component (D) being an amount that makes the amount of an SiH group (hydrosilyl group) present in the component (D) from 0.5 to 5 mol per 1 mol of an alkenyl group present in the component (A), the component (B), and the component (C); and
a total content of the component (B), the component (C), and the component (D) per 100 parts by weight of the component (A) being not greater than 80 parts by weight;
(A): a polyorganosiloxane represented by Average Unit Formula (I) below:

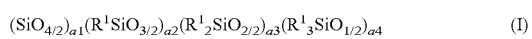

$(SiO_{4/2})_{a1}(R^1SiO_{3/2})_{a2}(R^1{}_2SiO_{2/2})_{a3}(R^1{}_3SiO_{1/2})_{a4}$ (I)

wherein $R^1$ is, the same or different, an alkyl group having from 1 to 10 carbons, an aryl group having from 6 to 14 carbons, an alkenyl group having from 2 to 8 carbons, an alkoxy group having from 1 to 10 carbons, or a hydroxy group; in the case where a proportion of the alkyl group is X mol %, a proportion of the aryl group is Y mol %, and a proportion of the alkenyl group is Z mol % relative to a total amount (100 mol %) of $R^1$, X is from 30 to 98 mol %, Y is from 1 to 14 mol %, and Z is from 1 to 20 mol %; and a1, a2, a3, and a4 are each a number satisfying a1>0, a2>0, a3≥0, a4>0, 0.01≤a1/a2≤10, and a1+a2+a3+a4=1;
(B): a polyorganosiloxane having not more than 10 silicon atoms and having a proportion of an alkenyl group relative to a total amount (100 mol %) of the organic groups bonded to the silicon atom from 20 to 60 mol %;
(C): an organopolysiloxane represented by Average Unit Formula (X) below:

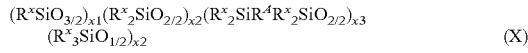

$(R^xSiO_{3/2})_{x1}(R^x{}_2SiO_{2/2})_{x2}(R^x{}_2SiR^4R^x{}_2SiO_{2/2})_{x3}$
$(R^x{}_3SiO_{1/2})_{x2}$ (X)

wherein $R^x$ is, the same or different, an alkyl group having from 1 to 10 carbons, an aryl group having from 6 to 14 carbons, an alkenyl group having from 2 to 8 carbons, an alkoxy group having from 1 to 10 carbons, or a hydroxy group; a proportion of the aryl group relative to a total amount (100 mol %) of $R^x$ is from 1 to 50 mol %, and at least two of all the $R^x$ moieties are alkenyl groups; $R^4$ is a divalent hydrocarbon group; and x1, x2, x3, and x4 are each a number satisfying 0.05>x1≥0, x2+x3>0, x4>0, and x1+x2+x3+x4=1;
(D) a polyorganosiloxane represented by Average Composition Formula (II) below:

$R^2{}_mH_nSiO_{[(4-m-n)/2]}$ (II)

wherein $R^2$ is, the same or different, an alkyl group having from 1 to 10 carbons or an aryl group having from 6 to 14 carbons, and at least two hydrogen atoms are bonded to the silicon atom; and m and n are each a number satisfying 0.7≤m≤2.1, 0.001≤n≤1, and 0.8≤m+n≤3; and
(E): a hydrosilylation catalyst.

21. A curable resin composition comprising: a component (A), a component (B), a component (C), a component (D), and a component (E) below;
a content of the component (B) per 100 parts by weight of the component (A) being from 5 to 50 parts by weight;
a content of the component (C) per 100 parts by weight of the component (A) being from 1 to 10 parts by weight;
a content of the component (D) being an amount that makes the amount of an SiH group (hydrosilyl group) present in the component (D) from 0.5 to 5 mol per 1 mol of an alkenyl group present in the component (A), the component (B), and the component (C); and
a total content of the component (B), the component (C), and the component (D) per 100 parts by weight of the component (A) being not greater than 80 parts by weight;
(A): a polyorganosiloxane represented by Average Unit Formula (I) below:

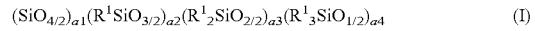

$(SiO_{4/2})_{a1}(R^1SiO_{3/2})_{a2}(R^1{}_2SiO_{2/2})_{a3}(R^1{}_3SiO_{1/2})_{a4}$ (I)

wherein $R^1$ is, the same or different, an alkyl group having from 1 to 10 carbons, an aryl group having from 6 to 14 carbons, an alkenyl group having from 2 to 8 carbons, an alkoxy group having from 1 to 10 carbons, or a hydroxy group; in the case where a proportion of the alkyl group is X mol %, a proportion of the aryl group is Y mol %, and a proportion of the alkenyl group is Z mol % relative to a total amount (100 mol %) of $R^1$, X is from 30 to 98 mol %, Y is from 1 to 50 mol %, and Z is from 1 to 20 mol %; and a1, a2, a3, and a4 are each a number satisfying a1>0, a2>0, a3≥0, a4>0, 0.01≤a1/a2≤10, and a1+a2+a3+a4=1;
(B): a polyorganosiloxane having not more than 10 silicon atoms and having a proportion of an alkenyl group relative to a total amount (100 mol %) of the organic groups bonded to the silicon atom from 20 to 60 mol %;
(C): an organopolysiloxane represented by Average Unit Formula (X) below:

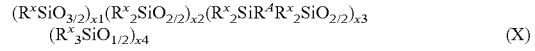

$(R^xSiO_{3/2})_{x1}(R^x{}_2SiO_{2/2})_{x2}(R^x{}_2SiR^4R^x{}_2SiO_{2/2})_{x3}$
$(R^x{}_3SiO_{1/2})_{x4}$ (X)

wherein $R^x$ is, the same or different, an alkyl group having from 1 to 10 carbons, an aryl group having from 6 to 14 carbons, an alkenyl group having from 2 to 8 carbons, an alkoxy group having from 1 to 10 carbons, or a hydroxy group; a proportion of the aryl group relative to a total amount (100 mol %) of $R^x$ is from 1 to 50 mol %, and at least two of all the $R^x$ moieties are alkenyl groups; $R^4$ is a divalent hydrocarbon group; and x1, x2, x3, and x4 are each a number satisfying 0.05>x1≥0, x2+x3>0, x4>0, and x1+x2+x3+x4=1;
(D) a polyorganosiloxane represented by Average Composition Formula (II) below:

$R^2{}_mH_nSiO_{[(4-m-n)/2]}$ (II)

wherein $R^2$ is, the same or different, an alkyl group having from 1 to 10 carbons or an aryl group having from 6 to 14 carbons, and at least two hydrogen atoms are bonded to the silicon atom; and m and n are each a number satisfying 0.7≤m≤2.1, 0.001≤n≤1, and 0.8≤m+n≤3; and
(E): a hydrosilylation catalyst.

22. A curable resin composition comprising: a component (A), a component (B), a component (C), a component (D), a component (E), and a component (F) below;

a content of the component (B) per 100 parts by weight of the component (A) being from 5 to 50 parts by weight;

a content of the component (C) per 100 parts by weight of the component (A) being from 0 to 10 parts by weight;

a content of the component (D) being an amount that makes the amount of an SiH group (hydrosilyl group) present in the component (D) from 0.5 to 5 mol per 1 mol of an alkenyl group present in the component (A), the component (B), and the component (C); and a total content of the component (B), the component (C), and the component (D) per 100 parts by weight of the component (A) being not greater than 80 parts by weight;

(A): a polyorganosiloxane represented by Average Unit Formula (I) below:

$$(SiO_{4/2})_{a1}(R^1SiO_{3/2})_{a2}(R^1{}_2SiO_{2/2})_{a3}(R^1{}_3SiO_{1/2})_{a4} \quad (I)$$

wherein $R^1$ is, the same or different, an alkyl group having from 1 to 10 carbons, an aryl group having from 6 to 14 carbons, an alkenyl group having from 2 to 8 carbons, an alkoxy group having from 1 to 10 carbons, or a hydroxy group; in the case where a proportion of the alkyl group is X mol %, a proportion of the aryl group is Y mol %, and a proportion of the alkenyl group is Z mol % relative to a total amount (100 mol %) of $R^1$ X is from 30 to 98 mol %, Y is from 1 to 50 mol %, and Z is from 1 to 20 mol %; and a1, a2, a3, and a4 are each a number satisfying a1>0, a2>0, a3>0, a4>0, 0.01≤a1/a2≤10, and a1+a2+a3+a4=1;

(B): a polyorganosiloxane having not more than 10 silicon atoms and having a proportion of an alkenyl group relative to a total amount (100 mol %) of the organic groups bonded to the silicon atom from 20 to 60 mol %;

(C): an organopolysiloxane represented by Average Unit Formula (X) below:

$$(R^xSiO_{3/2})_{x1}(R^x{}_2SiO_{2/2})_{x2}(R^x{}_2SiR^4R^x{}_2SiO_{2/2})_{x3}(R^x{}_3SiO_{1/2})_{x4} \quad (X)$$

wherein $R^x$ is, the same or different, an alkyl group having from 1 to 10 carbons, an aryl group having from 6 to 14 carbons, an alkenyl group having from 2 to 8 carbons, an alkoxy group having from 1 to 10 carbons, or a hydroxy group; a proportion of the aryl group relative to a total amount (100 mol %) of $R^x$ is from 1 to 50 mol %, and at least two of all the $R^x$ moieties are alkenyl groups; $R^A$ is a divalent hydrocarbon group; and x1, x2, x3, and x4 are each a number satisfying 0.05>x1≥0, x2+x3>0, x4>0, and x1+x2+x3+x4=1;

(D) a polyorganosiloxane represented by Average Composition Formula (II) below:

$$R^2{}_mH_nSiO_{[(4-m-n)/2]} \quad (II)$$

wherein $R^2$ is, the same or different, an alkyl group having from 1 to 10 carbons or an aryl group having from 6 to 14 carbons, and at least two hydrogen atoms are bonded to the silicon atom; and m and n are each a number satisfying 0.7≤m≤2.1, 0.001≤n≤1, and 0.8≤m+n≤3; and (E): a hydrosilylation catalyst; and (F): a silsesquioxane having at least one alkenyl group and at least one aryl group in a molecule.

* * * * *